(12) United States Patent
Price

(10) Patent No.: US 10,333,544 B1
(45) Date of Patent: Jun. 25, 2019

(54) DIGITAL-TO-ANALOG CONVERTER (DAC) CIRCUITS EMPLOYING RESISTOR ROTATOR CIRCUITS CONFIGURED TO BE INCLUDED IN ANALOG-TO-DIGITAL CONVERTER (ADC) CIRCUITS

(71) Applicant: QUALCOMM Incorporated, San Diego, CA (US)

(72) Inventor: Burt Lee Price, Apex, NC (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/135,985

(22) Filed: Sep. 19, 2018

(51) Int. Cl.
*H03M 1/12* (2006.01)
*H03M 1/46* (2006.01)
*H03M 1/78* (2006.01)

(52) U.S. Cl.
CPC ........... *H03M 1/462* (2013.01); *H03M 1/785* (2013.01)

(58) Field of Classification Search
CPC ............................... H03M 1/14; H03M 1/365
USPC ................... 341/144, 155, 156, 120
See application file for complete search history.

(56) References Cited

U.S. PATENT DOCUMENTS

| | | | |
|---|---|---|---|
| 4,965,579 A | 10/1990 | Liu et al. | |
| 4,994,806 A | 2/1991 | Yun-Tae | |
| 5,068,662 A | 11/1991 | Guddanti et al. | |
| 5,387,914 A * | 2/1995 | Mangelsdorf | H03M 1/069 341/118 |
| 5,420,587 A * | 5/1995 | Michel | H03M 1/204 341/156 |
| 5,455,583 A | 10/1995 | Stryjewski | |
| 5,691,722 A | 11/1997 | Wang | |
| 6,927,712 B2 | 8/2005 | Wei | |
| 7,265,704 B1 | 9/2007 | Shakya | |
| 7,573,922 B2 | 8/2009 | Kamatani et al. | |
| 8,884,799 B2 | 11/2014 | Price et al. | |
| 8,902,093 B1 | 12/2014 | Leuciuc et al. | |
| 8,907,832 B2 | 12/2014 | Price et al. | |
| 9,124,296 B2 | 9/2015 | Dempsey | |

(Continued)

OTHER PUBLICATIONS

Chande, Vinay et al., "On Neural Networks for Analog to Digital Conversion," IEEE Transactions on Neural Networks, vol. 6, No. 5, Sep. 1995, pp. 1269-1274.

(Continued)

*Primary Examiner* — Peguy Jean Pierre
(74) *Attorney, Agent, or Firm* — W&T/Qualcomm

(57) ABSTRACT

Digital-to-analog converter (DAC) circuits employing resistor rotator circuits configured to be included in analog-to-digital converter (ADC) circuits are disclosed. In one aspect, a DAC circuit includes multiple DAC stages, each of which may be configured to generate one or more DAC analog signals corresponding to selected resistances within the DAC stage. Each DAC stage is configured to receive a corresponding top and bottom voltage. Each DAC stage is configured to generate a number of DAC analog signals based on the corresponding top voltage and the corresponding bottom voltage, as well as on the selected resistance of the DAC stage. Each DAC stage includes an adjusting circuit comprising a resistance configured to adjust a resistance of the corresponding DAC stage such that a parallel combination of the resistance of the adjusting circuit and a resistance of a next DAC stage is maintained at an ideal resistance level.

22 Claims, 38 Drawing Sheets

(56) References Cited

U.S. PATENT DOCUMENTS

| | | |
|---|---|---|
| 9,178,524 B1 | 11/2015 | Lee et al. |
| 9,236,878 B2 | 1/2016 | Bogner et al. |
| 9,425,814 B1 | 8/2016 | Verma |
| 9,432,035 B2 | 8/2016 | Vyas et al. |
| 9,536,497 B2 | 1/2017 | Zhang et al. |
| 9,660,660 B1 | 5/2017 | Beukema et al. |
| 2004/0113826 A1* | 6/2004 | Whittaker ........... H03M 1/1047 341/156 |
| 2013/0169454 A1* | 7/2013 | Debnath ............... H03M 1/145 341/110 |

OTHER PUBLICATIONS

Kolluri, Matt, "A Multi-Step Parallel 10b 1.5μs ADC," 1984 IEEE International Solid-State Circuits Conference (ISSCC 84), Digest of Technical Papers, vol. 27, Feb. 22, 1984, pp. 60-61 and 316-317.
Lin, Chi-Sheng et al., "A New Successive Approximation Architecture for Low-Power Low-Cost CMOS A/D Converter," IEEE Journal of Solid-State Circuits, vol. 38, No. 1, Jan. 2003, pp. 54-62.
Pelgrom, Marcel J. M., "8.10.3 Time-related Conversion," Analog-to-digital Conversion, Dordrecht, New York, Springer, 2010, pp. 316.

* cited by examiner

DIGITAL-TO-ANALOG CONVERTER (DAC) CIRCUITS EMPLOYING RESISTOR ROTATOR CIRCUITS CONFIGURED TO BE INCLUDED IN ANALOG-TO-DIGITAL CONVERTER (ADC) CIRCUITS

BACKGROUND

I. Field of the Disclosure

The technology of the disclosure relates generally to digital-to-analog converter (DAC) circuits, and particularly to DAC circuits employing resistor circuits configured to be included in analog-to-digital converter (ADC) circuits.

II. Background

A digital-to-analog converter (DAC) circuit is a device that converts digital codes to representative analog signals. For example, the converted analog signals may be recreations of native analog signals previously converted into digital codes by an analog-to-digital converter (ADC) circuit. A common use of DAC circuits is converting audio and video signals used in media devices (e.g., televisions, cell phones, MP3 players, etc.) from analog signal representations to digital signal representations, or vice versa.

In addition to converting digital signals generated by ADC circuits back into native analog signals, DAC circuits are also employed within ADC circuits to aid in analog-to-digital conversion. For example, one type of ADC circuit is a Successive Approximation (SA) Flash ADC circuit, which involves cascading multiple comparators to perform comparisons of an input voltage signal to a series of analog signals generated during a conversion process. Each analog signal used in such comparisons is generated by a DAC circuit employed by the SA Flash ADC circuit. The result of each comparison of the input voltage signal to the analog signals is used to generate a final value of a digital output signal by the SA Flash ADC circuit. Another type of ADC circuit is a successive approximation register (SAR) ADC circuit, which involves performing successive comparisons of an analog input signal to a series of generated analog signals during a conversion process. Similar to the SA Flash ADC circuit, the series of analog signals used in the comparisons are generated by a DAC circuit. The result of each comparison of the analog input signal to the series of generated analog signals is used to generate a final value of a digital signal by the SAR ADC circuit.

As the functional complexity of devices that employ ADC circuits continues to increase, so too does the length (i.e., number of bits) of the digital signals generated by such ADC circuits. Such an increase in a length of a digital signal conventionally results in the ADC circuits, as well as the DAC circuits employed by the ADC circuits, employing more circuitry, resulting in greater area consumption. However, an increase in area consumption reduces the space available to other circuitry within a device.

SUMMARY OF THE DISCLOSURE

Aspects disclosed in the detailed description include digital-to-analog converter (DAC) circuits employing resistor rotator circuits configured to be included in analog-to-digital converter (ADC) circuits. In one aspect, a DAC circuit includes multiple DAC stages, each of which may be configured to generate one or more DAC analog signals corresponding to a selected resistance of the DAC stage. In particular, each DAC stage is configured to receive a corresponding top voltage and a corresponding bottom voltage. Each DAC stage is configured to generate a number of DAC analog signals based on the corresponding top voltage and the corresponding bottom voltage. Additionally, one or more DAC stages include an adjusting circuit comprising a resistance configured to adjust a resistance of the corresponding DAC stage such that a parallel combination of the resistance of the adjusting circuit and a resistance of a next DAC stage is maintained at an ideal resistance level. Employing multiple DAC stages and the adjusting circuits in this manner results in the DAC circuit employing less circuitry, and thus, consuming less area, than conventional DAC circuits.

In this regard in one aspect, a multiple-bit parallel SAR ADC circuit is provided, and comprises a plurality of SAR controller circuits. Each SAR controller circuit of the plurality of SAR controller circuits comprises a number of SAR register circuits. Each SAR register circuit is configured to receive a clock signal, and, in response to a corresponding cycle of the clock signal, provide a digital signal for a digital bit of the digital output signal. Each SAR register circuit is further configured to, in response to a corresponding next cycle of the clock signal, receive a corresponding digital bit, store the digital bit, and provide the digital signal correlating to the digital bit. The digital bit is based on a comparison of an analog input signal and a corresponding DAC analog signal. The multiple-bit parallel SAR ADC circuit further comprises a multiple-output DAC circuit comprising a plurality of DAC stages. Each DAC stage of the plurality of DAC stages is configured to receive a corresponding top voltage and a corresponding bottom voltage, wherein a voltage range of the corresponding top voltage and the corresponding bottom voltage is based on a reference voltage, and generate a number of DAC analog signals based on the corresponding top voltage, the corresponding bottom voltage, and a resistance of the DAC stage. Each DAC stage of the plurality of DAC stages comprises an adjusting circuit comprising a resistance configured to adjust the resistance of the corresponding DAC stage such that a parallel combination of the resistance of the adjusting circuit and a resistance of a next DAC stage is maintained at an ideal resistance level. The multiple-bit parallel SAR ADC circuit further comprises a compare circuit. The compare circuit is configured to receive the number of DAC analog signals, receive the analog input signal, and generate the digital bit corresponding to each SAR controller circuit of the plurality of SAR controller circuits based on a comparison of each DAC analog signal to the analog input signal. Each digital bit generated collectively forms a digital output signal that is a digital representation of the analog input signal.

In another aspect, a method for converting an analog input signal into a digital output signal is provided, wherein multiple digital bits of the digital output signal are generated in parallel. The method comprises receiving a reference voltage, receiving a clock signal, and, in response to a corresponding cycle of the clock signal, providing a digital signal. The method also comprises, in response to a corresponding next cycle of the clock signal, receiving a corresponding digital bit, wherein the digital bit is based on a comparison of the analog input signal and a corresponding DAC analog signal. The method further comprises, in response to the corresponding next cycle of the clock signal, storing the digital bit, and, in response to the corresponding next cycle of the clock signal, providing the digital signal correlating to the digital bit. The method also comprises receiving a corresponding top voltage and a corresponding bottom voltage, wherein a voltage range of the corresponding top voltage and the corresponding bottom voltage is based on the reference voltage. The method further comprises generating a number of DAC analog signals based on the corresponding top voltage, the corresponding bottom voltage, and a resistance of a DAC stage, wherein the number of DAC analog signals is equal to a number of digital signals, adjusting the resistance of the corresponding DAC stage such that a parallel combination of the resistance of the adjusting circuit and a resistance of a next DAC stage is maintained at an ideal resistance level, and generating the corresponding digital bit based on a comparison of each corresponding DAC analog signal to the analog input signal, wherein each digital bit generated collectively forms the digital output signal that is a digital representation of the analog input signal.

In another aspect, a multiple-bit parallel SA Flash ADC circuit is provided, and comprises a multiple-output DAC circuit comprising a plurality of DAC stages. Each DAC stage of the plurality of DAC stages corresponds to a parallel comparator stage of a plurality of parallel comparator stages. Each DAC stage of the plurality of DAC stages is configured to receive a corresponding top voltage and a corresponding bottom voltage, wherein a voltage range of the corresponding top voltage and the corresponding bottom voltage is based on a reference voltage, and generate a number of DAC analog signals based on the corresponding top voltage, the corresponding bottom voltage, and a resistance of the DAC stage, wherein the number of DAC analog signals is equal to a number of comparator circuits in each corresponding parallel comparator stage. Each DAC stage of the plurality of DAC stages comprises an adjusting circuit comprising a resistance configured to adjust the resistance of the corresponding DAC stage such that a parallel combination of the resistance of the adjusting circuit and a resistance of a next DAC stage is maintained at an ideal resistance level. The multiple-bit parallel SA Flash ADC circuit further comprises a system compare circuit comprising the plurality of parallel comparator stages. Each parallel comparator stage of the plurality of parallel comparator stages comprises a number of comparator circuits, wherein the number of comparator circuits of each parallel comparator stage is equal to two (2) raised to a number of digital bits of the corresponding parallel comparator stage, quantity minus one (1). Each comparator circuit is configured to receive an analog input signal, receive a corresponding DAC analog signal, and generate a digital signal. The digital signal has a logic high value if the analog input signal has a greater voltage than the corresponding DAC analog signal, and the digital signal has a logic low value if the analog input signal has a smaller voltage than the corresponding DAC analog signal. The system compare circuit is configured to generate one or more digital bits corresponding to each parallel comparator stage based on each corresponding digital signal, wherein the one or more digital bits collectively form a digital output signal that is a digital representation of the analog input signal.

In another aspect, a method for converting an analog input signal into a digital output signal is provided, wherein multiple digital bits of the digital output signal are determined in parallel. The method comprises receiving a reference voltage, receiving a corresponding top voltage and a corresponding bottom voltage, wherein a voltage range of the corresponding top voltage and the corresponding bottom voltage is based on the reference voltage, and generating a number of DAC analog signals based on the corresponding top voltage, the corresponding bottom voltage, and a resistance of a DAC stage, wherein the number of DAC analog signals is equal to a number of digital signals. The method further comprises adjusting the resistance of the corresponding DAC stage such that a parallel combination of a resistance of an adjusting circuit and a resistance of a next DAC stage is maintained at an ideal resistance level, receiving the analog input signal, and generating one or more digital signals in a plurality of parallel comparator stage. Each digital signal is generated by comparing the analog input signal to a corresponding DAC analog signal. Each digital signal has a logic high value if the analog input signal has a greater voltage than the corresponding DAC analog signal, and each digital signal has a logic low value if the analog input signal has a smaller voltage than the corresponding DAC analog signal. The method also comprises generating one or more digital bits corresponding to each parallel comparator stage based on the one or more digital signals of a corresponding parallel comparator stage among the plurality of parallel comparator stages, wherein the one or more digital bits collectively form the digital output signal that is a digital representation of the analog input signal.

DETAILED DESCRIPTION

Figure 1:
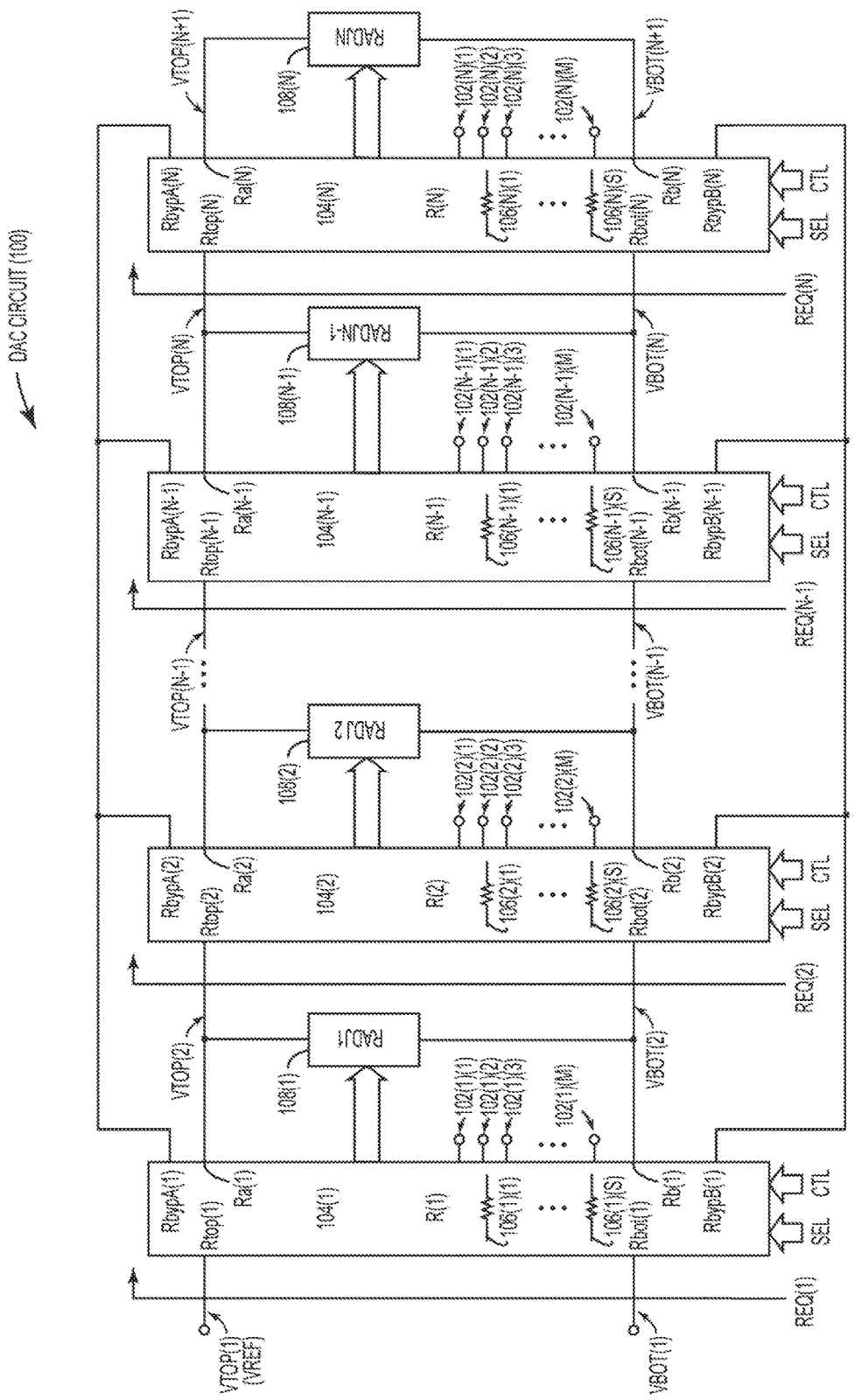
FIG. 1 is a block diagram of an exemplary digital-to-analog converter (DAC) circuit configured to generate one or more DAC analog signals.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include digital-to-analog converter (DAC) circuits employing resistor rotator circuits configured to be included in analog-to-digital converter (ADC) circuits. In one aspect, a DAC circuit includes multiple DAC stages, each of which may be configured to generate one or more DAC analog signals corresponding to a selected resistance of the DAC stage. In particular, each DAC stage is configured to receive a corresponding top voltage and a corresponding bottom voltage. Each DAC stage is configured to generate a number of DAC analog signals based on the corresponding top voltage and the corresponding bottom voltage. Additionally, one or more DAC stages include an adjusting circuit comprising a resistance configured to adjust a resistance of the corresponding DAC stage such that a parallel combination of the resistance of the adjusting circuit and a resistance of a next DAC stage is maintained at an ideal resistance level. Employing multiple DAC stages and the adjusting circuits in this manner results in the DAC circuit employing less circuitry, and thus, consuming less area, than conventional DAC circuits.

In this regard, FIG. 1 illustrates an exemplary DAC circuit 100 configured to generate multiple DAC analog signals 102(1)(1)-102(N)(M). In particular, the DAC circuit 100 includes DAC stages 104(1)-104(N), wherein each DAC stage 104(1)-104(N) may be configured to generate one or more DAC analog signals 102(1)(1)-102(N)(M). Each DAC stage 104(1)-104(N) is configured to receive a corresponding top voltage VTOP(1)-VTOP(N) and a corresponding bottom voltage VBOT(1)-VBOT(N) on input ports Rtop(1)-Rtop(N), Rbot(1)-Rbot(N), respectively. A voltage range of the corresponding top and bottom voltages VTOP(1)-VTOP(N), VBOT(1)-VBOT(N) is based on a reference voltage VREF. Each DAC stage 104(1)-104(N) has a resistance R(1)-R(N) that controls the respective top voltage VTOP(1)-VTOP(N) and a corresponding bottom voltage VBOT(1)-VBOT(N) delivered to a next DAC stage 104(1)-104(N). In this regard, each DAC stage 104(1)-104(N) divides its received voltage between the respective received top voltage VTOP(1)-VTOP(N) and a corresponding bottom voltage VBOT(1)-VBOT(N) into subranges of voltages divided across a respective plurality of resistances 106(1)(1)-106(N)(S) in each DAC stage 104(1)-104(N). Each DAC stage 104(1)-104(N−1) is then configured to select a particular resistance 106(1)(1)-106(N)(S) to provide a selected voltage subrange to provide a top voltage VTOP(2)-VTOP(N) and a corresponding bottom voltage VBOT(2)-VBOT(N) to a next DAC stage 104(2)-104(N). The DAC stages 104(1)-104(N−1) are configured to select a voltage subrange between the respective received top voltage VTOP(1)-VTOP(N) and the corresponding bottom voltage VBOT(1)-VBOT(N) based on received control signal CTL and select signal SEL. The control signal CTL determines in which state of operation the DAC stage 104(1)-104(N) operates. The select signal SEL determines which corresponding resistances 106(1)(1)-106(N)(S) in the DAC stage 104(1)-104(N) are selected to control its resistance R(1)-R(N) between the respective top voltage VTOP(1)-VTOP(N−1) and a corresponding bottom voltage VBOT(1)-VBOT(N−1) delivered to a next DAC stage 104(2)-104(N). For example, as described in more detail below, each DAC stage 104(1)-104(N) may include a resistor rotator circuit, wherein the select signal SEL activates/deactivates some combination of switches such that the corresponding DAC stage 104(1)-104(N) selects corresponding resistances 106(I)(1)-106(N)(S) in the DAC stages 104(1)-104(N).

With continuing reference to FIG. 1, based on the corresponding top voltage VTOP(1)-VTOP(N), the corresponding bottom voltage VBOT(1)-VBOT(N), as well as on the selected resistance 106(1)(1)-106(N)(S), each DAC stage 104(1)-104(N) is configured to generate a number M of the DAC analog signals 102(1)(1)-102(N)(M). Additionally, each DAC stage 104(1)-104(N) is configured to generate the top and bottom voltages VTOP(2)-VTOP(N), VBOT(2)-VBOT(N) for each subsequent DAC stage 104(2)-104(N) based on the control signal CTL and the select signal SEL. For example, the DAC stage 104(1) is configured to generate the DAC analog signals 102(1)(1)-102(1)(M), the top voltage VTOP(2) on an output node Ra(1), and the bottom voltage VBOT(2) on an output node Rb(1). The DAC stage 104(2) is configured to generate the DAC analog signal 102(2)(1)-102(2)(M), the top voltage VTOP(3) on an output node Ra(2), and the bottom voltage VBOT(3) on an output node Rb(2). The DAC stage 104(N−1) is configured to generate the DAC analog signals 102(N−1)(1)-102(N−1)(M), the top voltage VTOP(N) on an output node Ra(N−1), and the bottom voltage VBOT(N) on an output node Rb(N−1). Further, the DAC stage 104(N) is configured to generate the DAC analog signals 102(N)(1)-102(N)(M), the top voltage VTOP(N+1) on an output node Ra(N), and the bottom voltage VBOT(N+1) on an output node Rb(N). The control signal CTL may be configured to cause a corresponding top bypass node RbypA(1)-RbypA(N) to be electrically coupled to the corresponding output node Ra(1)-Ra(N), and a corresponding bottom bypass node RbypB(1)-RbypB(N) to be electrically coupled to the corresponding output node Rb(1)-Rb(N).

With continuing reference to FIG. 1, in this aspect, because each DAC stage 104(1)-104(N) is configured to generate the M number of the DAC analog signals 102(1)(1)-102(N)(M), the DAC circuit 100 is referred to as a multiple-output DAC circuit 100. However, other aspects may be configured to generate a single DAC analog signal 102, wherein such aspects are referred to as a single-output DAC circuit 100. Additionally, while each DAC stage 104(1)-104(N) is configured to generate the M number of the DAC analog signals 102(1)(1)-102(N)(M), other aspects may include DAC stages 104(1)-104(N) that generate varying numbers of the DAC analog signals 102. The number M of DAC analog signals 102(1)(1)-102(N)(M) generated by a corresponding DAC stage 104(1)-104(N) is equal to two (2) raised to a number i of bits of the corresponding select signal SEL, quantity minus one (1) (i.e., M=(2^i)−1). Additionally, in this example, an S number of resistances 106(1)-106(N)(S) (e.g., resistors 106(1)(1)-106(N)(S)) employed in each DAC stage 104(1)-104(N) is equal to the M number of DAC analog signals 102(1)(1)-102(N)(M) of the corresponding DAC stage 104(1)-104(N) plus one (1) (e.g., S=M+1).

With continuing reference to FIG. 1, each resistance 106(1)(1)-106(N)(S) within each corresponding DAC stage 104(1)-104(N) has an equal value. Additionally, each DAC stage 104(1)-104(N) includes an adjusting circuit 108(1)-108(N) that includes a corresponding resistance RADJ(1)-RADJ(N) configured to adjust a resistance of the corresponding DAC stage 104(1)-104(N). Each corresponding resistance RADJ(1)-RADJ(N) is adjusted such that a parallel combination of the resistance RADJ(1)-RADJ(N) of the adjusting circuit 108(1)-108(N) and an input impedance REQ(2)-REQ(N) (each of which may or may not be equal) of a next DAC stage 104(2)-104(N) is maintained at an ideal resistance. In this aspect, the ideal resistance is equal to the value of each resistance 106(1)(1)-106(N)(S) within each corresponding DAC stage 104(1)-104(N) in which each corresponding adjusting circuit 108(1)-108(N) is coupled. Employing multiple DAC stages 104(1)-104(N) and adjusting circuits 108(1)-108(N) in this manner results in the DAC circuit 100 employing less circuitry, and thus, consuming less area, than conventional DAC circuits.

Figure 2:
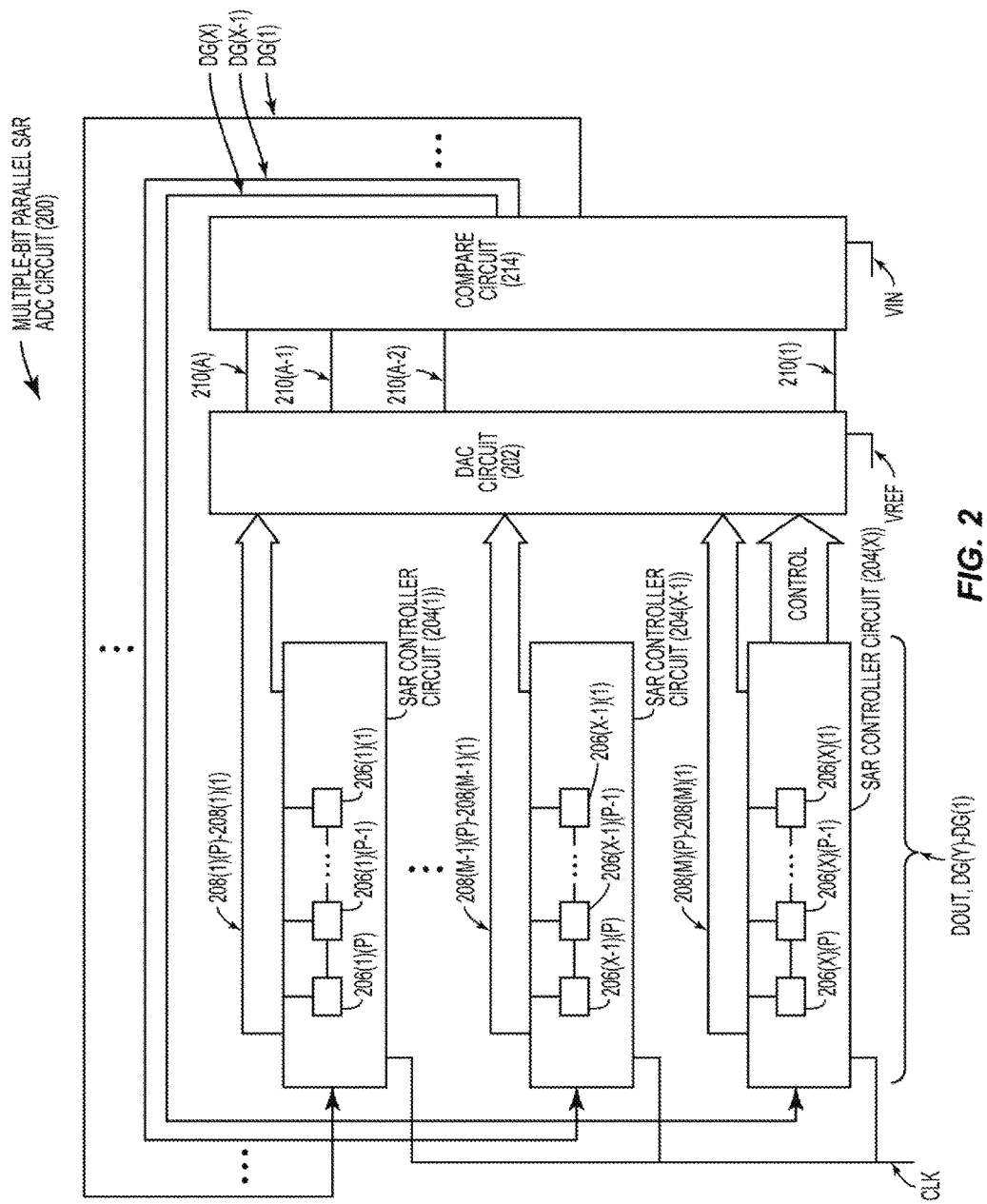
FIG. 2 is a diagram of an exemplary multiple-bit parallel successive approximation register (SAR) analog-to-digital converter (ADC) circuit.

FIG. 2 is a diagram of an exemplary multiple-bit parallel successive approximation register (SAR) analog-to-digital converter (ADC) circuit 200 that can employ a DAC circuit 202 that is one aspect of the DAC circuit 100 of FIG. 1. Although individual elements of the DAC circuit 202 are not shown or labeled in FIG. 2, it is assumed that the DAC circuit 202 includes elements similar to those described in FIG. 1, such as DAC stages 104(1)-104(N), resistances 106(1)(1)-106(N)(S), and the adjusting circuits 108(1)-108(N). In particular, the multiple-bit parallel SAR ADC circuit 200 is configured to convert an analog input signal VIN into a digital output signal DOUT, wherein a X number of digital bits DG(X)-DG(1) of the digital output signal DOUT are generated in parallel. In aspects described herein, the digital bit DG(Y) (e.g., the highest numbered digital bit DG) is a most significant bit (MSB) of the digital output signal DOUT, and the digital bit DG(1) (e.g., the lowest numbered digital bit DG) is a least significant bit (LSB) of the digital output signal DOUT. To perform such a conversion, the multiple-bit parallel SAR ADC circuit 200 includes an X number of SAR controller circuits 204(1)-204(X). In this example, each of the SAR controller circuits 204(1)-204(X) includes a P number of SAR register circuits 206(1)(1)-206(X)(P) where X*P=Y. A SAR register circuit can be any type of circuit that can generate a digital signal corresponding to a received digital bit. The SAR register circuits 206(1)(P)-206(1)(1) are in the SAR controller circuit 204(1). The SAR register circuits 206(X−1)(P)-206(X−1)(1) are in the SAR controller circuit 204(X−1). The SAR register circuits 206(X)(P)-206(X)(1) are in the SAR controller circuit 204(X).

Further, each of the SAR register circuits 206(1)(1)-206(X)(P) is configured to receive a clock signal CLK. In response to a corresponding cycle of the clock signal CLK, each SAR register circuit 206(1)(1)-206(X)(P) provides a digital signal 208(1)(1)-208(X)(P). In response to a corresponding next cycle of the clock signal CLK, one SAR register circuit 206(1)-206(X)( ) in each corresponding SAR controller circuit 204(1)-204(X) receives and stores a digital bit DG(1)-DG(X) corresponding to the SAR controller circuit 204(1)-204(X) based on a comparison of the analog input signal VIN and a corresponding DAC analog signal 210(1)-210(A). Each SAR register circuit 206(1)(1)-206(X)(P) also provides the digital signal 208(1)(1)-208(X)(P) correlating to the digital bit DG(1)-DG(Y) in the next cycle referenced above.

With continuing reference to FIG. 2, the multiple-bit parallel SAR ADC circuit 200 includes the DAC circuit 202 that receives a reference voltage VREF, as well as the digital signals 208(1)(1)-208(X)(P). As will be discussed by example in more detail below, the DAC circuit 202 generates multiple DAC analog signals 210(1)-210(A) based on the reference voltage VREF and the digital signals 208(1)(1)-208(X)(P) and the control signals CONTROL. The SAR register circuits 206(1)(1)-206(X)(P) of the SAR controller circuits 204(1)-204(X) generate the control signals CONTROL that communicate timing information to the DAC circuit 202 for passing the designated respective digital signals 208(1)(1)-208(X)(P) from the SAR controller circuits 204(1)-204(3) to the compare circuit 214. The control signals CONTROL may be generated by another controller that controls timing. Additionally, a compare circuit 214 receives the DAC analog signals 210(1)-210(A) and the analog input signal VIN. Using the DAC analog signals 210(1)-210(A) and the analog input signal VIN, the compare circuit 214 generates a digital bit DG(1)-DG(X) corresponding to each SAR controller circuit 204(1)-204(X), such that the compare circuit 214 generates the X number of the Y number of digital bits DG(1)-DG(Y) in each cycle of the clock signal CLK (i.e., in parallel), which are stored in the corresponding SAR register circuits 206(1)(1)-206(X)(P) during the conversion process. Each digital bit DG(1)-DG(Y) generated collectively forms the digital output signal DOUT that is a digital representation of the analog input signal VIN. In this manner, the digital output signal DOUT includes the Y number of digital bits DG(1)-DG(X) equal to the X number of SAR controller circuits 204(1)-204(X) multiplied by the P number of bits stored in the SAR register circuits 206(1)(1)-206(X)(P) in each SAR controller circuit 204(1)-204(X) (i.e., Y=X*P). As used herein, the numbers X, Y, and P are positive integer numbers. Generating the digital output signal DOUT by generating the X number of the digital bits DG(1)-DG(Y) in parallel as described above provides a faster conversion time than conventional SAR ADC circuits even as the number of digital bits DG(1)-DG(Y) in the digital output signal DOUT increases.

Figure 3:
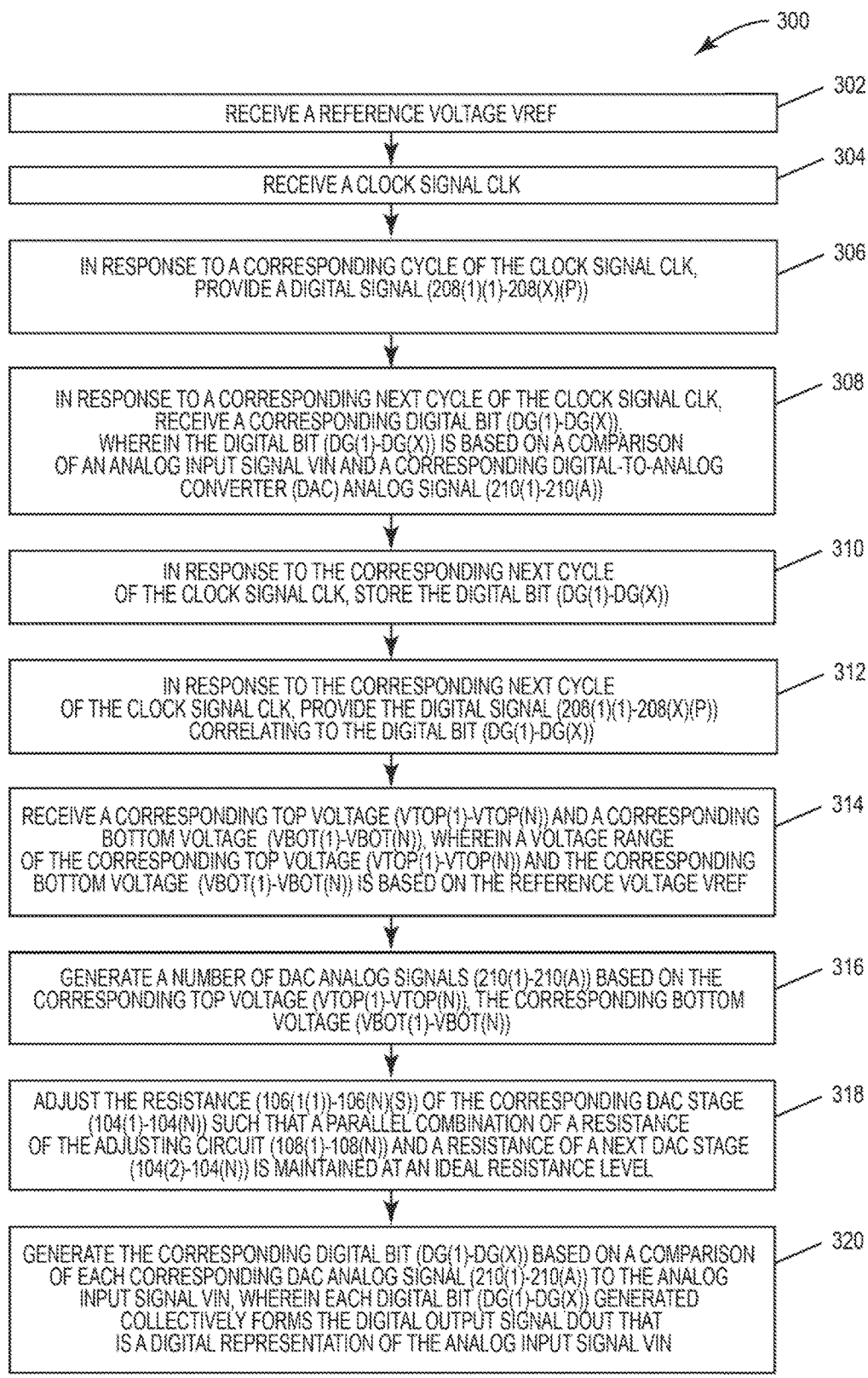
FIG. 3 is a flowchart illustrating an exemplary process that can be performed by the multiple-bit parallel SAR ADC circuit of FIG. 2 to convert an analog input signal into a digital output signal, wherein multiple digital bits of the digital output signal are generated in parallel.

FIG. 3 illustrates an exemplary process 300 that can be performed by the multiple-bit parallel SAR ADC circuit 200 of FIG. 2 to convert the analog input signal VIN into the digital output signal DOUT, wherein X multiple digital bits DG(1)-DG(X) of the X-bit width digital output signal DOUT (i.e., DG(1)-DG(X)) are generated in parallel. The process 300 includes the multiple-bit parallel SAR ADC circuit 200 receiving a reference voltage VREF (block 302). The process 300 includes each SAR register circuit 206(1)(1)-206(X)(P) receiving the clock signal CLK (block 304). Additionally, the process 300 includes each corresponding SAR register circuit 206(1)(1)-206(X)(P), in response to a corresponding cycle of the clock signal CLK, providing the digital signal 208(1)(1)-208(X)(P) (block 306). For example, in each clock cycle i, where i increments between 1 to P for each clock cycle, one SAR register circuit 206(1)(*i*)-206(X)(i) in each corresponding SAR controller circuit 204(1)-204(X) provides a corresponding digital signal 208(1)(*i*)-208(X)(i). The process 300 also includes each SAR register circuit 206(1)(1)-206(X)(P), in response to a corresponding next cycle of the clock signal CLK, receiving the corresponding digital bit DG(1)-DG(X), wherein the digital bit DG(1)-DG(X) is based on a comparison of the analog input signal VIN and the corresponding DAC analog signal 210(1)-210(A) (where A=$2^X$−1) (block 308). The process 300 also includes each SAR register circuit 206(1)(1)-206(X)(P), in response to the corresponding next cycle of the clock signal CLK, storing the digital bit DG(1)-DG(X) (block 310). The process 300 also includes each SAR register circuit 206(1)(1)-206(X)(P), in response to the corresponding next cycle of the clock signal CLK, providing the digital signal 208(1)(1)-208(X)(P) correlating to the digital bit DG(1)-DG(X) (block 312). Further, the process 300 includes the DAC circuit 202 receiving a corresponding top voltage VTOP(1)-VTOP(N) and a corresponding bottom voltage VBOT(1)-VBOT(N) (block 314). A voltage range of the corresponding top voltage VTOP(1)-VTOP(N) and the corresponding bottom voltage VBOT(1)-VBOT(N) is based on the reference voltage VREF. The process 300 also includes the DAC circuit 202 generating a number of DAC analog signals 210(1)-210(A) based on the received corresponding top voltage VTOP(1)-VTOP(N), the corresponding bottom voltage VBOT(1)-VBOT(N) (block 316). The process 300 also includes adjusting the resistance 106(1)(1)-106(N)(S) of the corresponding DAC stage 104(1)-104(N) using an adjusting circuit 108(1)-108(N) such that a parallel combination of a resistance of the adjusting circuit 108(1)-108(N) and a resistance of a next DAC stage 104(2)-104(N) is maintained at an ideal resistance level (block 318). The process 300 also includes the compare circuit 214 generating the digital bit DG(1)-DG(X) corresponding to each SAR controller circuit 204(1)-204(X) based on a comparison of each DAC analog signal 210(1)-210(A) to the analog input signal VIN (block 320). In this manner, each digital bit DG(1)-DG(X) generated collectively forms the digital output signal DOUT that is a digital representation of the analog input signal VIN.

Figure 4A:
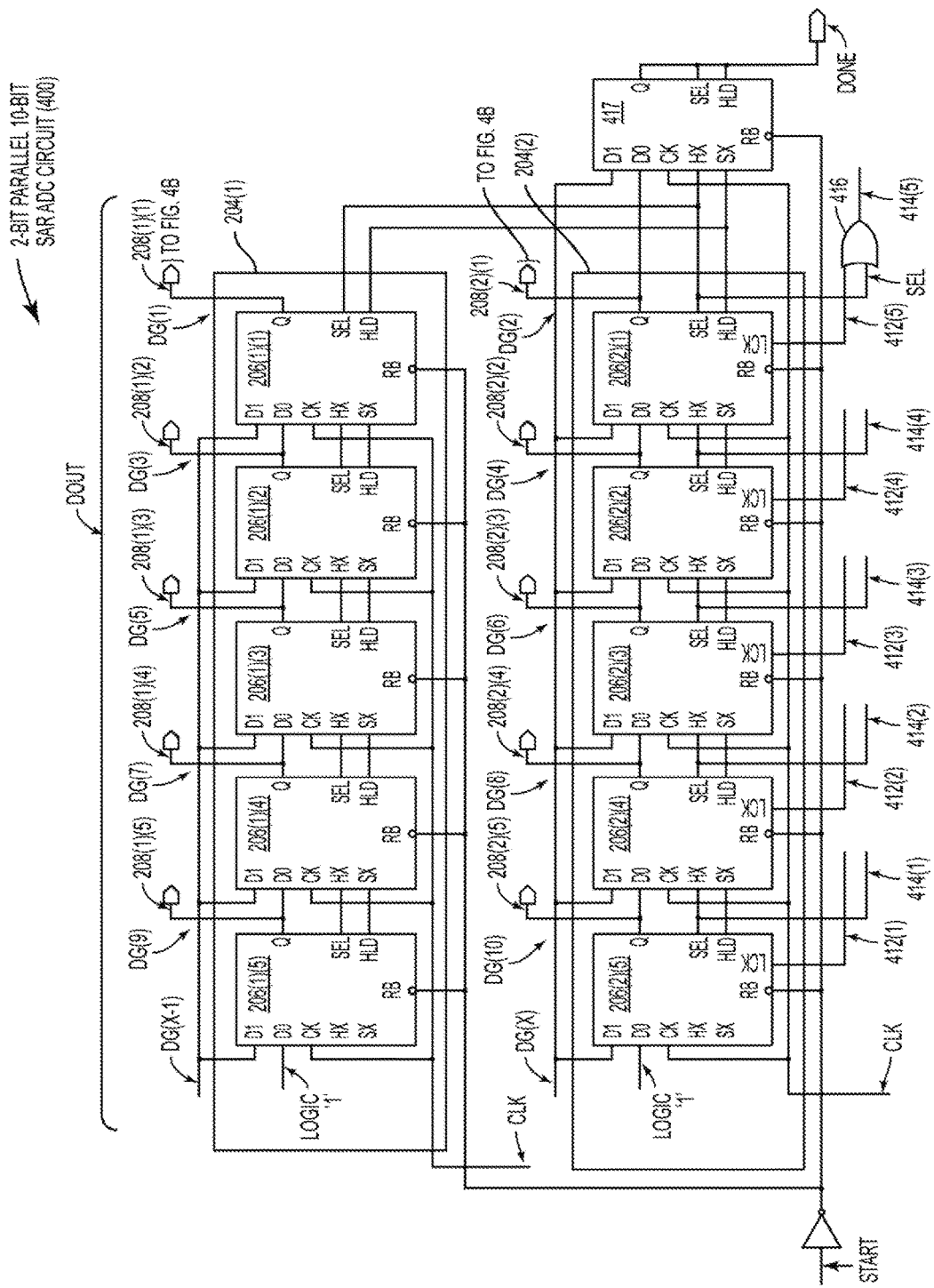
FIGS. 4A and 4B illustrate a circuit diagram of an exemplary two (2)-bit parallel ten (10)-bit SAR ADC circuit that employs an exemplary multiple-output DAC circuit.
Figure 4B:
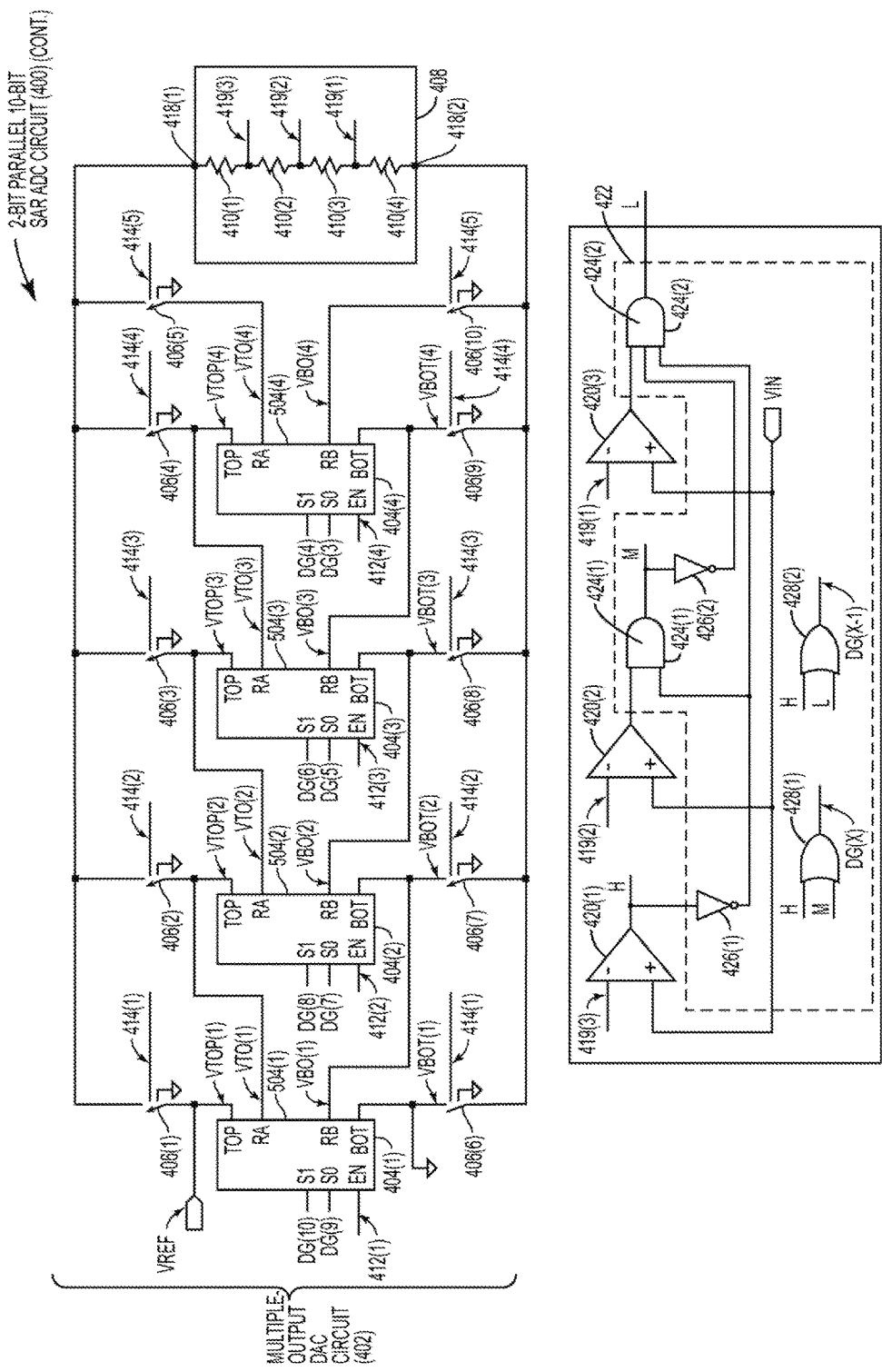

FIGS. 4A and 4B illustrate an exemplary two (2)-bit parallel ten (10)-bit SAR ADC circuit 400 (also referred to as the "multiple-bit parallel SAR ADC circuit 400") that employs an exemplary multiple-output DAC circuit 402. The multiple-bit parallel SAR ADC circuit 400 may also be referred to as a two (2)-bit parallel ten (10)-bit SAR ADC circuit 400. The multiple-bit parallel SAR ADC circuit 400 includes common elements with the multiple-bit parallel SAR ADC circuit 200 of FIG. 2, which are referred to with common element numbers in FIGS. 2 and 4A and 4B, and thus will not re-described herein.

With continuing reference to FIGS. 4A and 4B, the multiple-output DAC circuit 402 includes DAC stages 404(1)-404(4), switches 406(1)-406(10), and a divider circuit 408 that employs resistors 410(1)-410(4). Additionally, in this aspect, the SAR controller circuit 204(2) is configured to provide enable signals 412(1)-412(5) and DAC select signals 414(1)-414(5) corresponding to each SAR register circuit 206(2)(1)-206(2)(5). In particular, the enable signals 412(1)-412(5) are generated by the SAR register circuits 206(2)(1)-206(2)(5). The DAC select signals 414(1)-414(4) correspond to values provided to each select input node SEL of each corresponding SAR register circuit 206(2)(1)-206(2)(4), while the DAC select signal 414(5) is provided as an output of an OR gate 416 that receives the enable signal 412(5) and a select signal SEL provided to the SAR register circuit 206(2)(5). The OR gate 416 combines the enable signal 412(5) with select signal SEL so that at the end of a conversion process, the divider 408 remains connected through switches 406(5) and 406(10) to DAC stage 404(4). The multiple-bit parallel SAR ADC circuit 400 also includes a SAR register circuit 417 configured to generate a trial signal TRIAL and a done signal DONE.

With continuing reference to FIGS. 4A and 4B, each DAC stage 404(1)-404(4) is configured to receive a corresponding top voltage VTOP(1)-VTOP(4), a corresponding bottom voltage VBOT(1)-VBOT(4), and corresponding digital bits DG(1)-DG(10). Each DAC stage 404(1)-404(4) is further configured to generate corresponding top output voltages VTO(1)-VTO(4) and bottom output voltages VBO(1)-VBO(4) by dividing a voltage range of each corresponding top voltage VTOP(1)-VTOP(4) and each bottom voltage VBOT(1)-VBOT(4) based on the values of the digital bits DG(1)-DG(10). For example, the DAC stage 404(1) is configured to receive the reference voltage VREF as the top voltage VTOP(1), a ground signal as the bottom voltage VBOT(1), and the digital bits DG(10), DG(9). The top output voltage VTO(1) and the bottom output voltage VBO(1) of the DAC stage 404(1) are generated by dividing the voltage range between the reference voltage VREF and the ground signal based on the value of the digital bits DG(10), DG(9).

With continuing reference to FIGS. 4A and 4B, the top and bottom output voltages VTO(1), VBO(1) are provided to the DAC stage 404(2) as the top and bottom voltages VTOP(2), VBOT(2), respectively. The DAC stage 404(2) is also configured to receive the digital bits DG(8), DG(7).

Thus, the top output voltage VTO(2) and the bottom output voltage VBO(2) of the DAC stage 404(2) are generated by dividing the voltage range between the top and bottom output voltages VTO(1), VBO(1) based on the value of the digital bits DG(8), DG(7). Additionally, the top and bottom output voltages VTO(2), VBO(2) are provided to the DAC stage 404(3) as the top and bottom voltages VTOP(3), VBOT(3), respectively. The DAC stage 404(3) is also configured to receive the digital bits DG(6), DG(5). Thus, the top output voltage VTO(3) and the bottom output voltage VBO(3) of the DAC stage 404(3) are generated by dividing the voltage range between the top and bottom output voltages VTO(2), VBO(2) based on the value of the digital bits DG(6), DG(5). Further, the top and bottom output voltages VTO(3), VBO(3) are provided to the DAC stage 404(4) as the top and bottom voltages VTOP(4), VBOT(4), respectively. The DAC stage 404(4) is also configured to receive the digital bits DG(4), DG(3). Thus, the top output voltage VTO(4) and the bottom output voltage VBO(4) of the DAC stage 404(4) are generated by dividing the voltage range between the top and bottom output voltages VTO(3), VBO(3) based on the value of the digital bits DG(4), DG(3).

With continuing reference to FIGS. 4A and 4B, the DAC select signals 414(1)-414(5) are provided to the switches 406(1)-406(10), respectively. Based on the values of the DAC select signals 414(1)-414(5), some combination of the reference voltage VREF and the top output voltage VTO(1)-VTO(4) are provided to an input node 418(1) of the divider circuit 408. Note that alternatively, the DAC stages 404(1)-404(4) could include (or represent) stages designed liked the divider circuit 408 in FIG. 4B. Additionally, based on the values of the DAC select signals 414(1)-414(5) activating some combination of the switches 406(6)-406(10), some combination of the ground signal and the bottom output voltage VBO(1)-VBO(4) are provided to an input node 418(2) of the divider circuit 408. In this aspect, the resistors 410(1)-410(4) each have an equal resistance (e.g., two (2) kilo-Ohms (kΩ)) such that the divider circuit 408 generates DAC analog signals 419(1)-419(3) as equal divisions of the voltages provided to the divider circuit 408 (e.g., divisions of the corresponding voltage range). The DAC analog signals 419(1)-419(3) are used by the compare circuit 214 to generate the digital output signal DOUT having the digital bits DG(1)-DG(10) in five (5) cycles of the clock signal CLK. In this aspect, the compare circuit 214 includes comparator circuits 420(1)-420(3) and a thermometer-to-binary (TTB) circuit 422. In particular, the TTB circuit 422 includes AND gates 424(1), 424(2), inverters 426(1), 426(2), and OR gates 428(1), 428(2). Signals H, M, and L generated by the OR gates 428(1), 428(2) to generate the digital bits DG(X), DG(X-1) of the corresponding cycle. Employing the multiple-output DAC circuit 402 replaces three individual DACs to consume less chip area.

Figure 5:
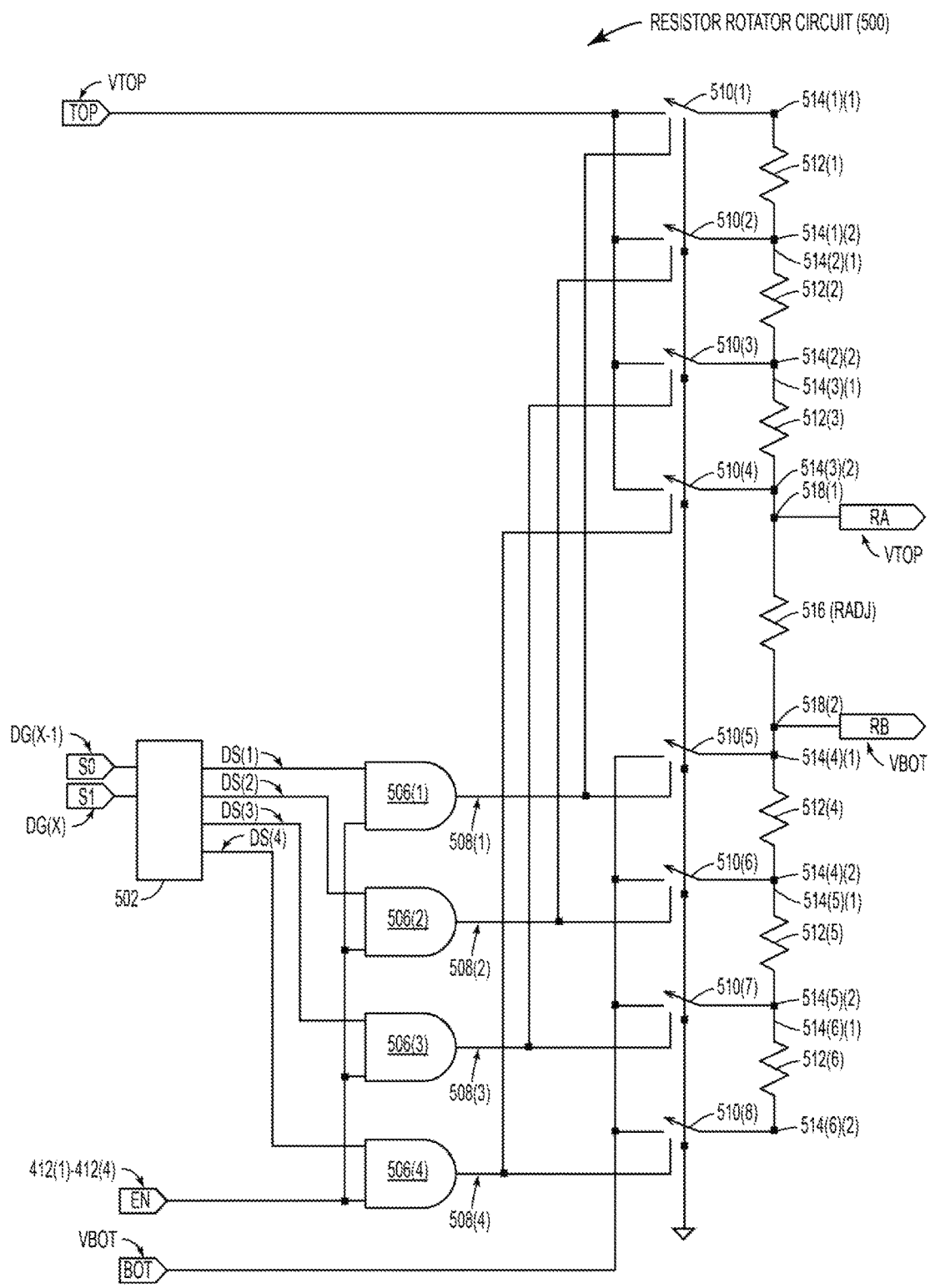
FIG. 5 is a circuit diagram of an exemplary resistor rotator circuit that may be employed in each DAC stage of the multiple-output DAC circuit of FIG. 4B.

FIG. 5 illustrates an exemplary resistor rotator circuit 500 that can be employed in each DAC stage 404(1)-404(4) of FIGS. 4A and 4B. The resistor rotator circuit 500 is configured to receive a top voltage VTOP on a top voltage input node TOP, and a bottom voltage VBOT on a bottom voltage input node BOT. The resistor rotator circuit 500 also includes a decoder circuit 502 configured to receive the digital bits DG(X), DG(X-1) on input nodes S1, S0 corresponding to the DAC stages 404(1)-404(4) described in FIGS. 4A and 4B, and generate decode signals DS(1)-DS(4) based on the digital bits DG(X), DG(X-1). In this aspect, the decoder circuit 502 is a one-hot decoder, wherein only one of the decode signals DS(1)-DS(4) has a logic high "1" value. For example, the decode signals DS(1)-DS(4) are generated according to the following logic functions: DS(1)=(inverse DG(X) AND inverse DG(X-1)); DS(2)=(inverse DG(X) AND DG(X-1)); DS(3)=(DG(X) AND inverse DG(X-1)); and DS(4)=DG(X) AND DG(X-1)). Each decode signal DS(1)-DS(4) is provided to a corresponding AND gate 506(1)-506(4). Each AND gate 506(1)-506(4) also receives one of the enable signals 412(1)-412(4) corresponding to the DAC stage 404(1)-404(4) described in FIGS. 4A and 4B via an enable input node EN, and generates a corresponding resistor select signal 508(1)-508(4).

With continuing reference to FIG. 5, the resistor rotator circuit 500 also includes switches 510(1)-510(8), wherein a logic high "1" value closes a switch 510(1)-510(8), and a logic low "0" value opens a switch 510(1)-510(8). The switches 510(1)-510(8) are used in conjunction with resistors 512(1)-512(6) to generate the top and bottom output voltages VTO(1)-VTO(4), VBO(1)-VBO(4) on respective voltage output nodes RA, RB for the corresponding DAC stage 404(1)-404(4). In particular, the resistor 512(1) includes a first node 514(1)(1) electrically coupled to the switch 510(1), and a second node 514(1)(2) electrically coupled to the switch 510(2). The resistor 512(2) includes a first node 514(2)(1) electrically coupled to the switch 510(2), and a second node 514(2)(2) electrically coupled to the switch 510(3). The resistor 512(3) includes a first node 514(3)(1) electrically coupled to the switch 510(3), and a second node 514(3)(2) electrically coupled to the switch 510(4). Further, the resistor 512(4) includes a first node 514(4)(1) electrically coupled to the switch 510(5), and a second node 514(4)(2) electrically coupled to the switch 510(6). The resistor 512(5) includes a first node 514(5)(1) electrically coupled to the switch 510(6), and a second node 514(5)(2) electrically coupled to the switch 510(7). The resistor 512(6) includes a first node 514(6)(1) electrically coupled to the switch 510(7), and a second node 514(6)(2) electrically coupled to the switch 510(8).

With continuing reference to FIG. 5, the switches 510(1), 510(5) are configured to receive the resistor select signal 508(1), and the switches 510(2), 510(6) are configured to receive the resistor select signal 508(2). Further, the switches 510(3), 510(7) are configured to receive the resistor select signal 508(3), and the switches 510(4), 510(8) are configured to receive the resistor select signal 508(4). A resistor 516 is also included, wherein a first node 518(1) is electrically coupled to the top voltage output node RA, and a second node 518(2) is electrically coupled to the bottom voltage output node RB. A resistance RADJ of the resistor 516 may be adjusted such that the parallel combination of the resistor 516 and a desired resistance R_NEXT of a next DAC stage 404 is maintained at a desired constant value so that the resistor rotator circuit 500 generates the desired output. In this manner, the configuration above results in the resistor rotator circuit 500 generating the corresponding top and bottom output voltages VTO(1)-VTO(4), VBO(1)-VBO(4) according to which of the switches 510(1)-510(8) are open or closed based on the digital bits DG(X), DG(X-1).

Figure 6A:
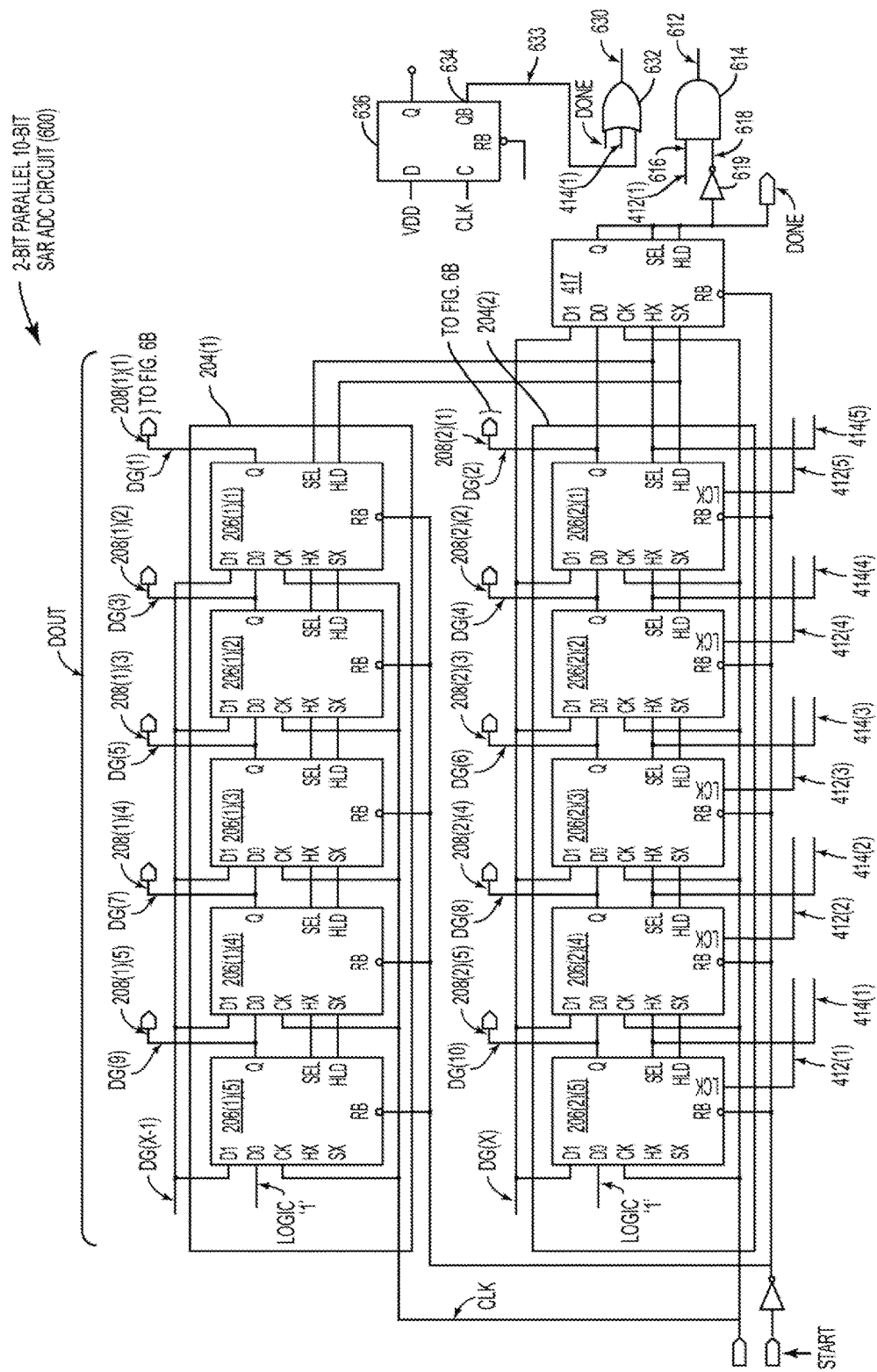
FIGS. 6A-6C illustrate a circuit diagram of another exemplary two (2)-bit parallel ten (10)-bit SAR ADC circuit that employs an exemplary multiple-output DAC circuit.
Figure 6B:
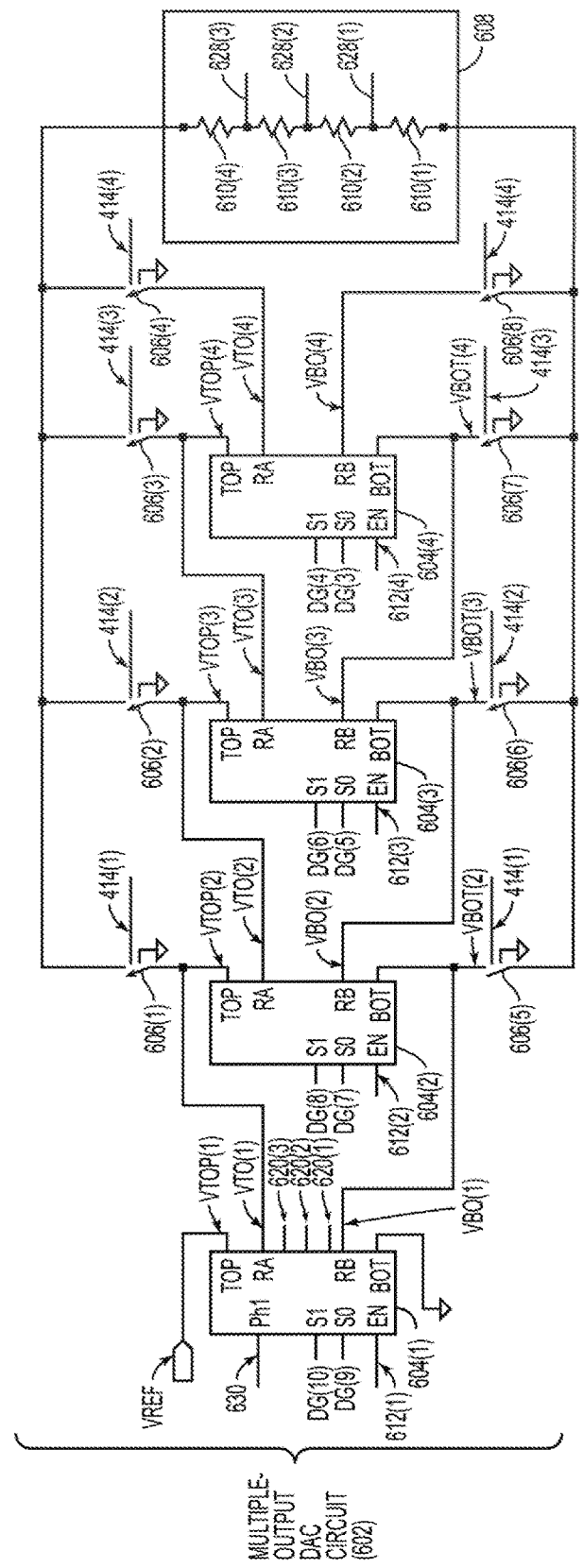
Figure 6C:
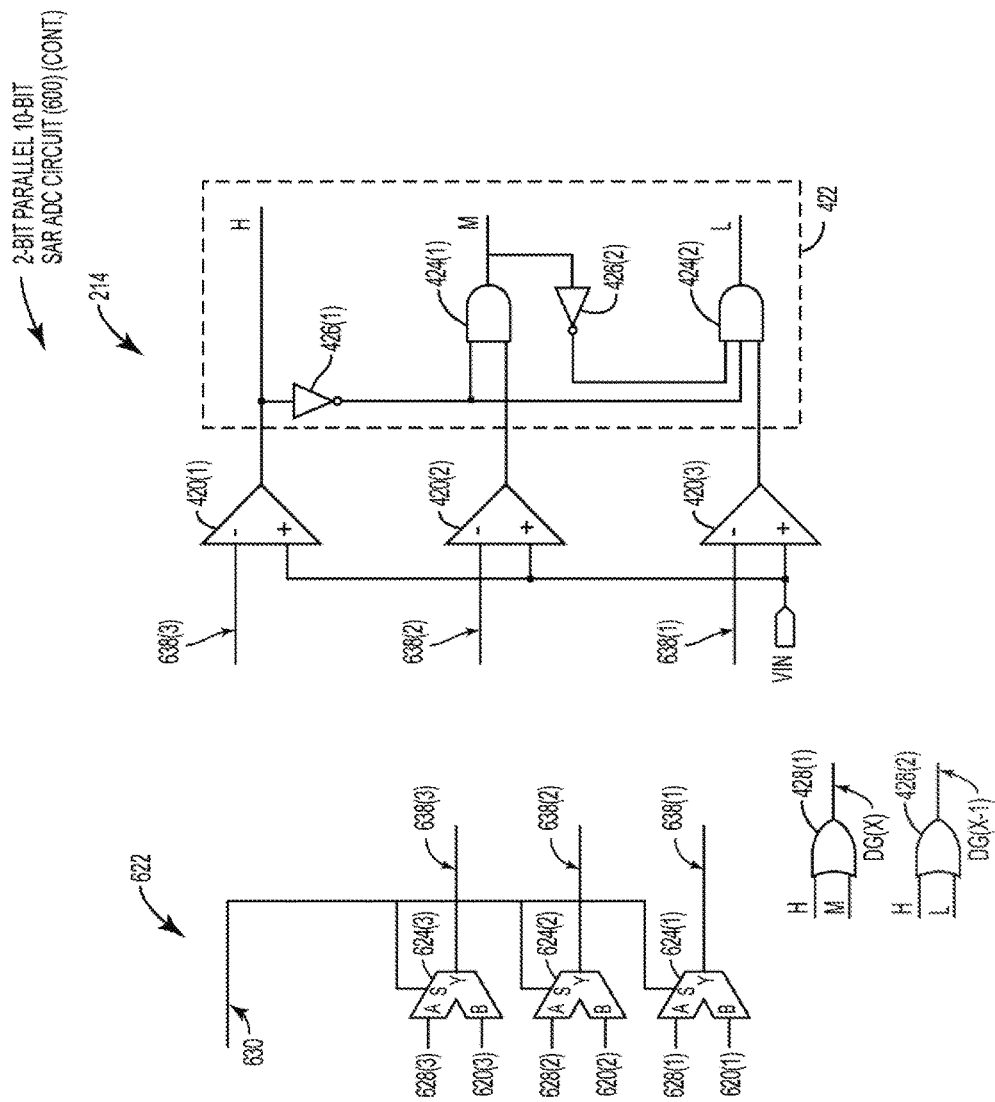

FIGS. 6A-6C illustrate a circuit diagram of another exemplary two (2)-bit parallel ten (10)-bit SAR ADC circuit 600 that employs a multiple-output DAC circuit 602. The two (2)-bit parallel ten (10)-bit SAR ADC circuit 600 may also be referred to as a multiple-bit parallel SAR ADC circuit 600. The multiple-bit parallel SAR ADC circuit 600 includes common elements with the multiple-bit parallel SAR ADC circuit 400 of FIGS. 4A and 4B, which are referred to with common element numbers in FIGS. 4A and 4B and 6A-6C, and thus will not re-described herein.

Figure 7:
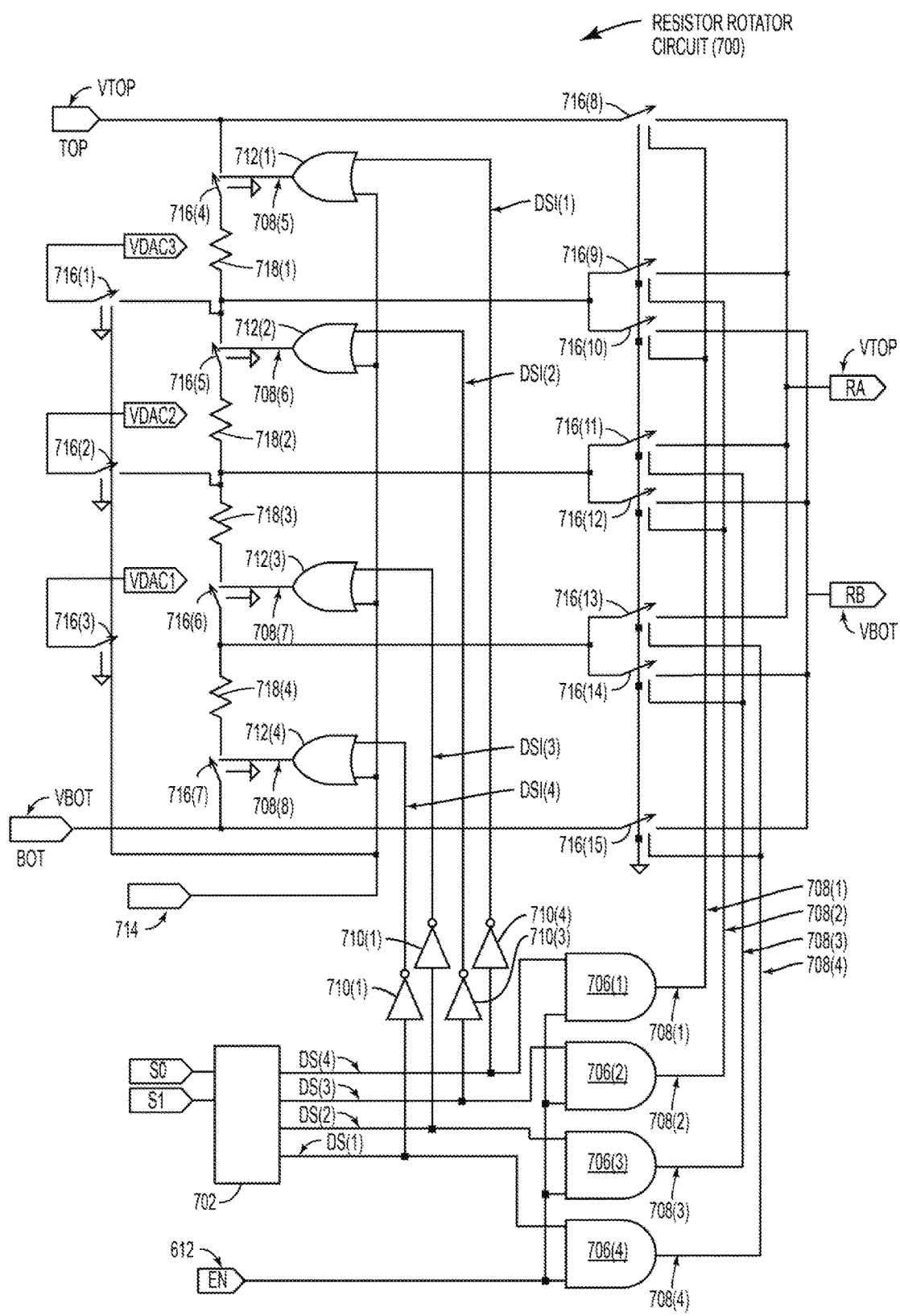
FIG. 7 is a circuit diagram of an exemplary resistor rotator circuit that may be employed in each DAC stage of the multiple-output DAC circuit of FIG. 6B.

With continuing reference to FIGS. 6A-6C, the multiple-output DAC circuit 602 is functionally equivalent to the multiple-output DAC circuit 402 in FIG. 4B. In this manner, the multiple-output DAC circuit 602 includes DAC stages 604(1)-604(4), switches 606(1)-606(8), and a divider circuit 608 that employs resistors 610(1)-610(4). Each DAC stage 604(1)-604(4) is configured to receive respective enable signals 612(1)-612(4) generated by an AND gate 614 that receives an enable signal 616 from the SAR register circuit 417 and an inverted done signal 618 from an inverter 619. Additionally, the DAC stage 604(1) is configured to generate stage signals 620(1)-620(3). Further, as discussed in more detail below, the DAC stage 604(1) of the multiple-output DAC circuit 602 in FIG. 6B employs a resistor rotator circuit 700 in FIG. 7 in this example. The other DAC stage 604(2)-604(4) of the multiple-output DAC circuit 602 employs the resistor rotator circuit 500 in FIG. 5 in this example. The two (2)-bit parallel ten (10)-bit SAR ADC circuit 600 also includes a selection circuit 622 employing multiplexer circuits 624(1)-624(3) which are analog multiplexers. Each multiplexer circuit 624(1)-624(3) is configured to receive the corresponding stage signal 620(1)-620(3), as well as a corresponding DAC analog signal 628(1)-628(3). Additionally, each multiplexer circuit 624(1)-624(3) is configured to receive a DAC select signal 630 that selects between the input values of the respective multiplexer circuit 624(1)-624(3). In particular, the DAC select signal 630 is the output of an OR gate 632 that receives a signal 633 from a complement output node 634 of a D flip-flop circuit 636, and a done signal DONE of the multiple-bit parallel SAR ADC circuit 600 as inputs. The multiplexer circuits 624(1)-624(3) provide a corresponding selected DAC analog signal 638(1)-638(3) to the compare circuit 214, wherein the output of the compare circuit 214 is provided to the TTB circuit 422 that is configured to generate the digital bits DG(X), DG(X−1) in a corresponding cycle until the digital bits DG(1)-DG(10) are all calculated. The difference between the SAR ADC circuit 600 of FIGS. 6A-6C and FIGS. 4A and 4B is that SAR ADC circuit 600 in FIGS. 6A-6C allows for a different reference voltage load resistance than what the basic resistor rotator would allow for. The SAR ADC circuit 600 in FIG. 6A, including the flip-flop 636 and gates 619, 614, 632, provides a uniform (constant) resistance to the VREF driver circuit regardless of the state of the SAR ADC circuit 600. FIG. 7 illustrates an exemplary resistor rotator circuit 700 that may be employed in the DAC stage 604(1) of the multiple-output DAC circuit 602 of FIG. 6B. The resistor rotator circuit 700 is configured to receive a top voltage VTOP on a top voltage input node TOP, and a bottom voltage VBOT on a bottom voltage input node BOT. The resistor rotator circuit 700 also includes a decoder circuit 702 configured to receive digital bits DG(10) and DG(9) in FIG. 6B corresponding to the DAC stage 604(1) described in FIGS. 6A and 6B, and generate decode signals DS(1)-DS(4) based on the digital bits DG(X), DG(X−1). In this aspect, the decoder circuit 702 is a one-hot decoder, wherein only one of the decode signals DS(1)-DS(4) has a logic high "1" value. For example, the decode signals DS(1)-DS(4) are generated according to the following logic functions: DS(1)=(inverse DG(X) AND inverse DG(X−1)); DS(2)=(inverse DG(X) AND DG(X−1)); DS(3)=(DG(X) AND inverse DG(X−1)); and DS(4)=DG(X) AND DG(X−1)). Each decode signal DS(1)-DS(4) is provided to a corresponding AND gate 706(1)-706(4). Each AND gate 706(1)-706(4) also receives one of the enable signal 612 corresponding to the DAC stage 604(1)-604(4) described in FIGS. 6A and 6B via an enable input node EN, and generates a corresponding resistor select signal 708(1)-708(4).

With continuing reference to FIG. 7, the resistor rotator circuit 700 also includes inverters 710(1)-710(4) configured to receive the corresponding decode signal DS(1)-DS(4), and generate corresponding inverted decode signals DSI(1)-DSI(4). OR gates 712(1)-712(4) are configured to receive a phase signal 714 and corresponding inverted decode signal DSI(1)-DSI(4), and generate resistor select signals 708(5)-708(8). The resistor rotator circuit 700 also includes switches 716(1)-716(15), wherein a logic high "1" value closes a switch 716(1)-716(15), and a logic low "0" value opens a switch 716(1)-716(15). The switches 716(1)-716(15) are used in conjunction with resistors 718(1)-718(4) to generate the top and bottom output voltages VTOP, VBOT on respective voltage output nodes RA, RB for the DAC stage 604(1). The other DAC stages 604(2)-604(4) can employ the resistor rotator circuit 500 in FIG. 5. When the phase signal 714 is logic high, DAC voltages VDAC(1)-VDAC(3) are used by the multi-output DAC 602 and pass through multiplexer circuits 624(1)-624(3) to the comparator circuits 420(1)-420(3).

Figure 8A:
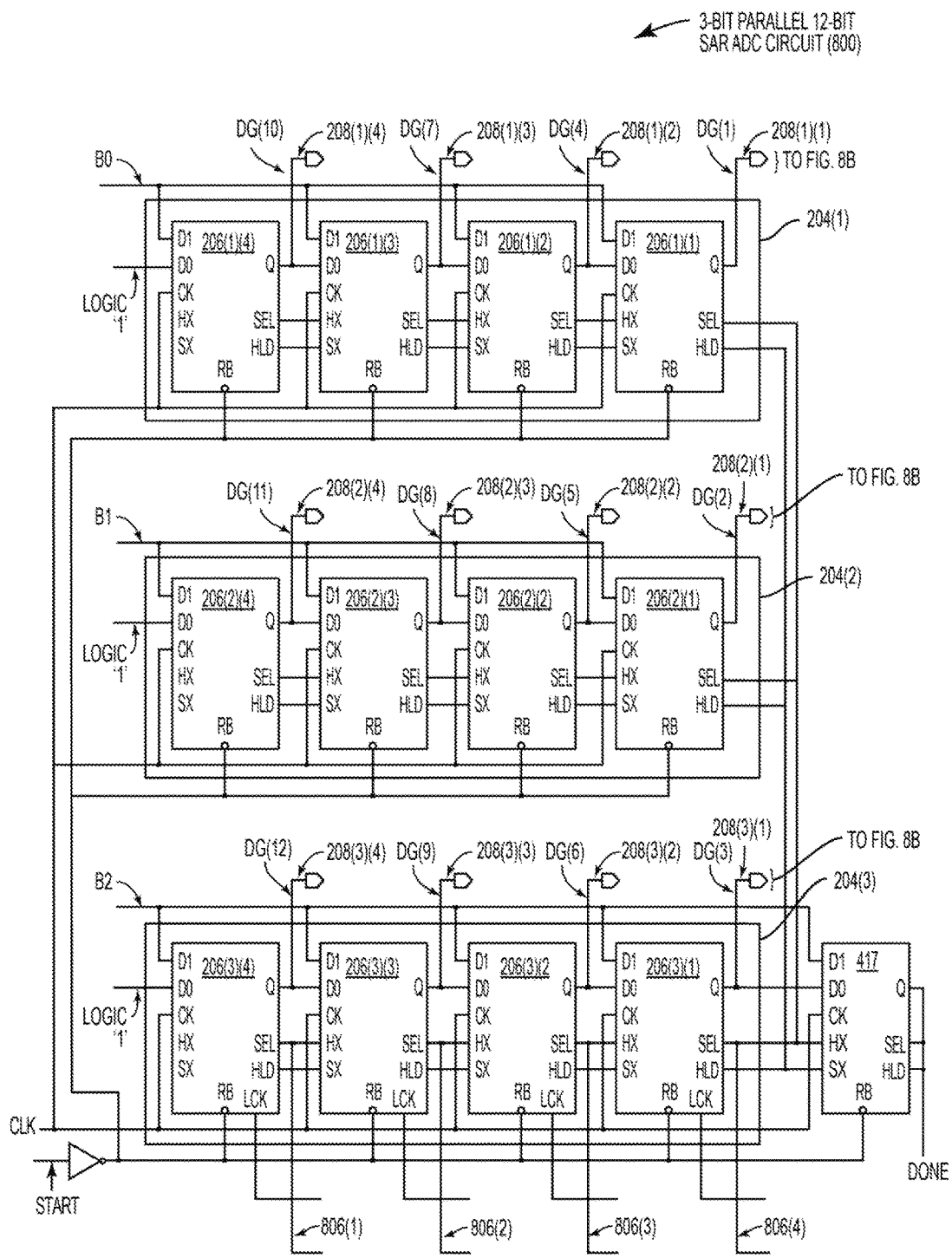
FIGS. 8A-8C illustrate a circuit diagram of an exemplary three (3)-bit parallel twelve (12)-bit SAR ADC circuit that employs an exemplary multiple-output DAC circuit.
Figure 8B:
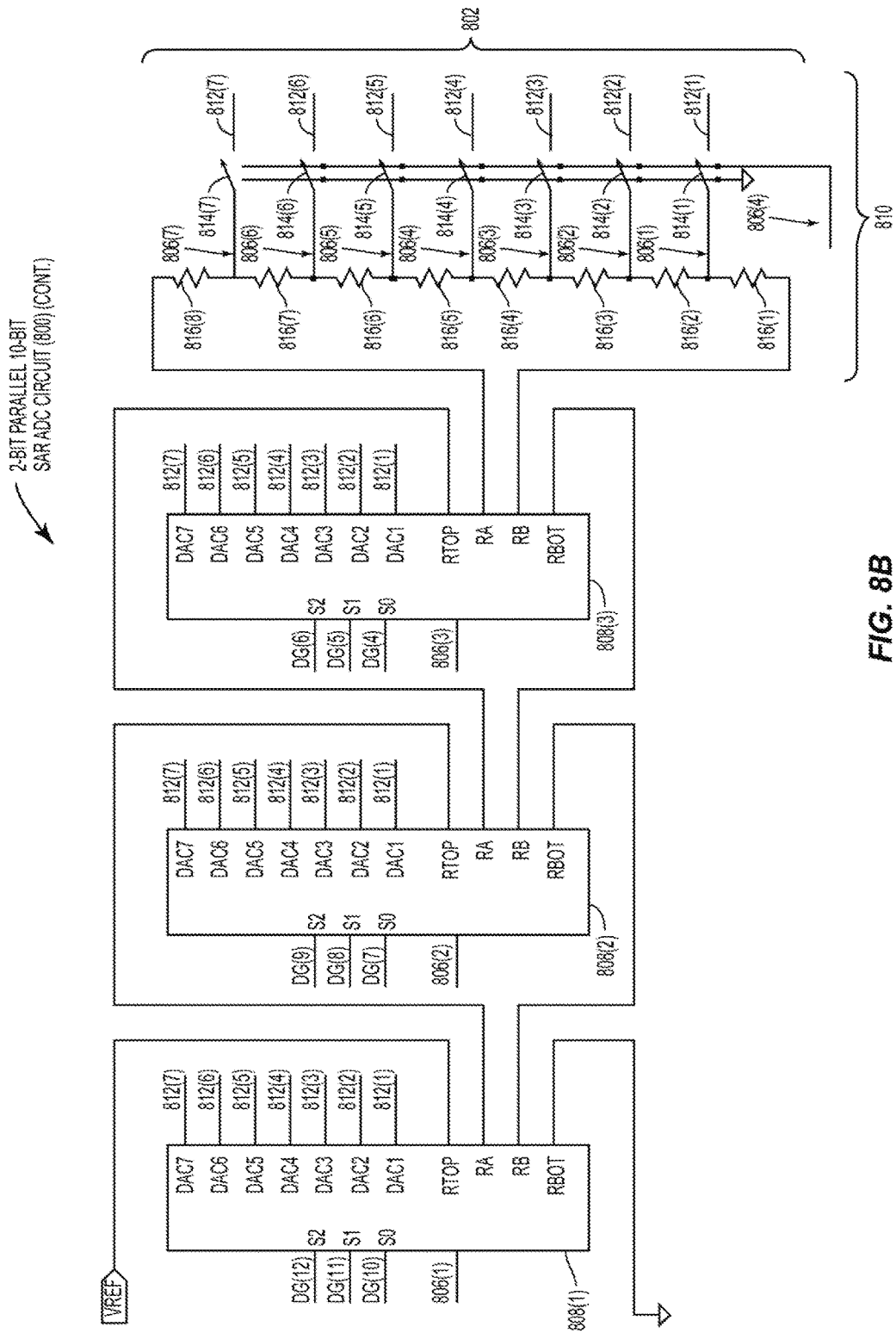
Figure 8C:
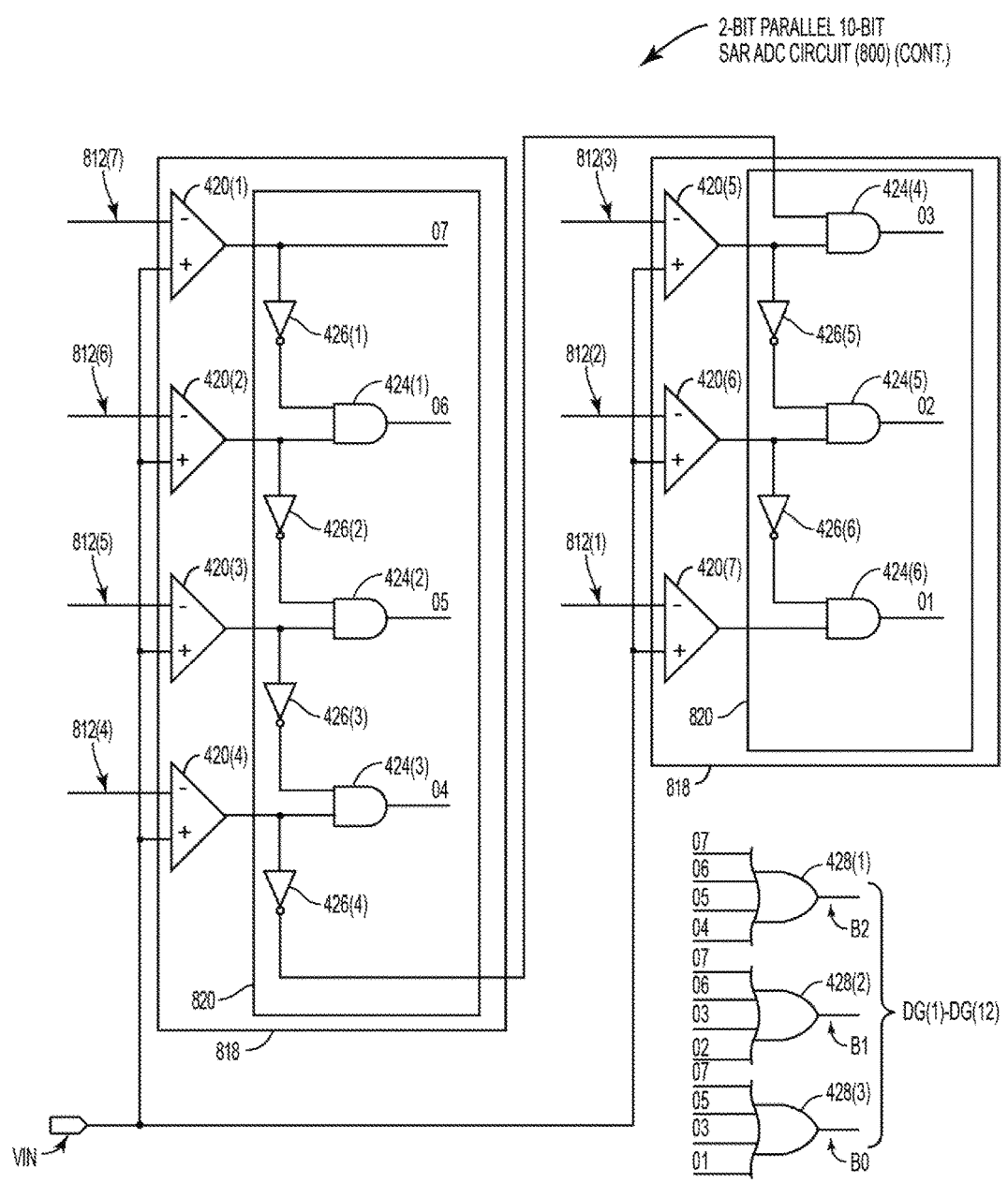

FIGS. 8A-8C illustrate an exemplary three (3)-bit parallel twelve (12)-bit SAR ADC circuit 800 (also referred to as the "multiple-bit parallel SAR ADC circuit 800") that employs an exemplary multiple-output DAC circuit 802. The three (3)-bit parallel twelve (12)-bit SAR ADC circuit 800 includes common elements with the multiple-bit parallel SAR ADC circuits 400 and 600 of FIGS. 4A and 4B and 6A-6C, respectively, which are referred to with common element numbers in FIGS. 4A and 4B, 6A-6C, and 8A-8C, and thus will not re-described herein.

With continuing reference to FIGS. 8A-8C, the three (3)-bit parallel twelve (12)-bit SAR ADC circuit 800 includes SAR controller circuits 204(1)-204(3), each of which includes four (4) SAR register circuits 206(1)(1)-206(3)(4). In this manner, the SAR register circuits 206(1)(1)-206(1)(4) correspond to digital bits DG(1), DG(4), DG(7), and DG(10), the SAR register circuits 206(2)(1)-206(2)(4) correspond to digital bits DG(2), DG(5), DG(8), and DG(11), and the SAR register circuits 206(3)(1)-206(3)(4) correspond to digital bits DG(3), DG(6), DG(9), and DG(12). Additionally, DAC select signals 806(1)-806(4) correspond to values provided to each select input node SEL of each corresponding SAR register circuit 206(3)(1)-206(3)(4).

With continuing reference to FIGS. 8A-8C, the multiple-output DAC circuit 802 includes DAC stages 808(1)-808(3) and a divider circuit 810. As discussed in more detail beginning in FIG. 9, the DAC stages 808(1)-808(3) are configured to internally multiplex DAC analog signals 812(1)-812(7). Additionally, the divider circuit 810 includes switches 814(1)-814(7) that multiplex the DAC analog signals 812(1)-812(7) using resistors 816(1)-816(8). A compare circuit 818 similar to the compare circuit 214 (except that compare circuit 214 employs three (3) comparator circuits instead of the seven (7) comparator circuits in compare circuit 818) receives the DAC analog signals 812(1)-812(7) and the analog input signal VIN. The compare circuit 818 employs a TTB circuit 820 similar to the TTB circuit 422, wherein the TTB circuit 820 generates signals O7-O1 that are used by OR gates 428(1)-428(3) to generate the digital bits DG(1)-DG(12). In particular, the digital bits DG(1), DG(5), and DG(9) are generated in a cycle of the clock signal CLK, while the digital bits DG(2), DG(6), and DG(10) are generated in another cycle of the clock signal CLK. Further, the digital bits DG(3), DG(7), and DG(11) are generated in a cycle of the clock signal CLK, and the digital bits DG(4), DG(8), and DG(12) are generated in another cycle of the clock signal CLK.

Figure 9:
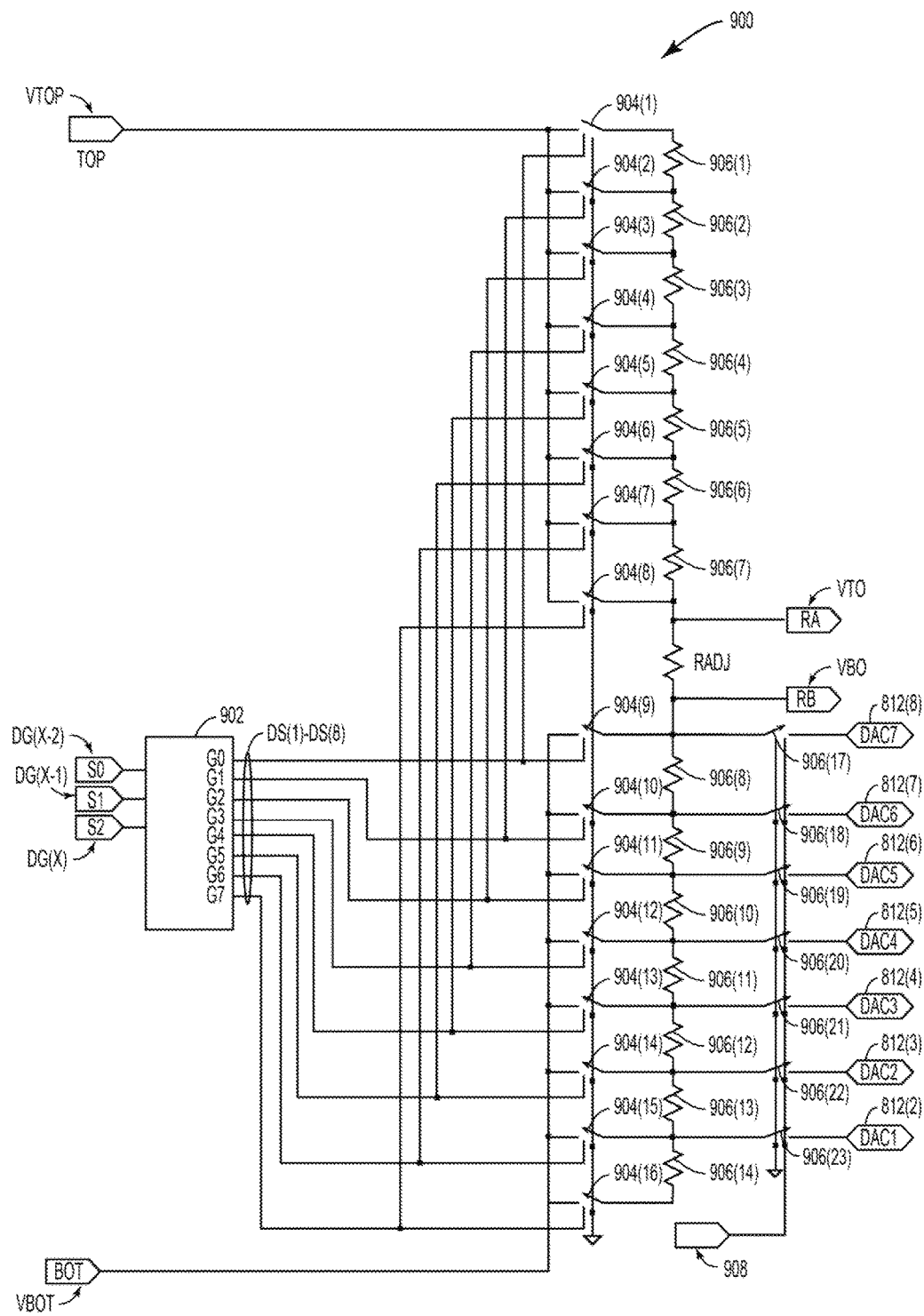
FIG. 9 is a circuit diagram of an exemplary resistor rotator circuit that may be employed in each DAC stage of the multiple-output DAC circuit of FIG. 8B.

FIG. 9 illustrates an exemplary resistor rotator circuit 900 that may be employed in each DAC stage 808(1)-808(3) of the multiple-output DAC circuit 802 of FIG. 8B. The resistor rotator circuit 900 is configured to receive a top voltage VTOP on a top voltage input node TOP, and a bottom voltage VBOT on a bottom voltage input node BOT. The resistor rotator circuit 900 also includes a decoder circuit 902 configured to receive digital bits DG(X)-DG(X−2) on input nodes S2, S1, and S0, and generate decode signals DS(1)-DS(8) based on the digital bits DG(X)-DG(X−2). The resistor rotator circuit 900 also includes switches 904(1)-904(16). The decode signals DS(1)-DS(8) are provided to the corresponding switches 904(1)-904(8) and 904(9)-904(16), respectively. The resistor rotator circuit 900 is configured to provide top and bottom output voltages VTO, VBO on respective voltage output nodes RA, RB. Additionally, switches 904(17)-904(23) are configured to receive a phase signal 908 such that the DAC analog signals 812(1)-812(7) are provided.

Figure 10A:
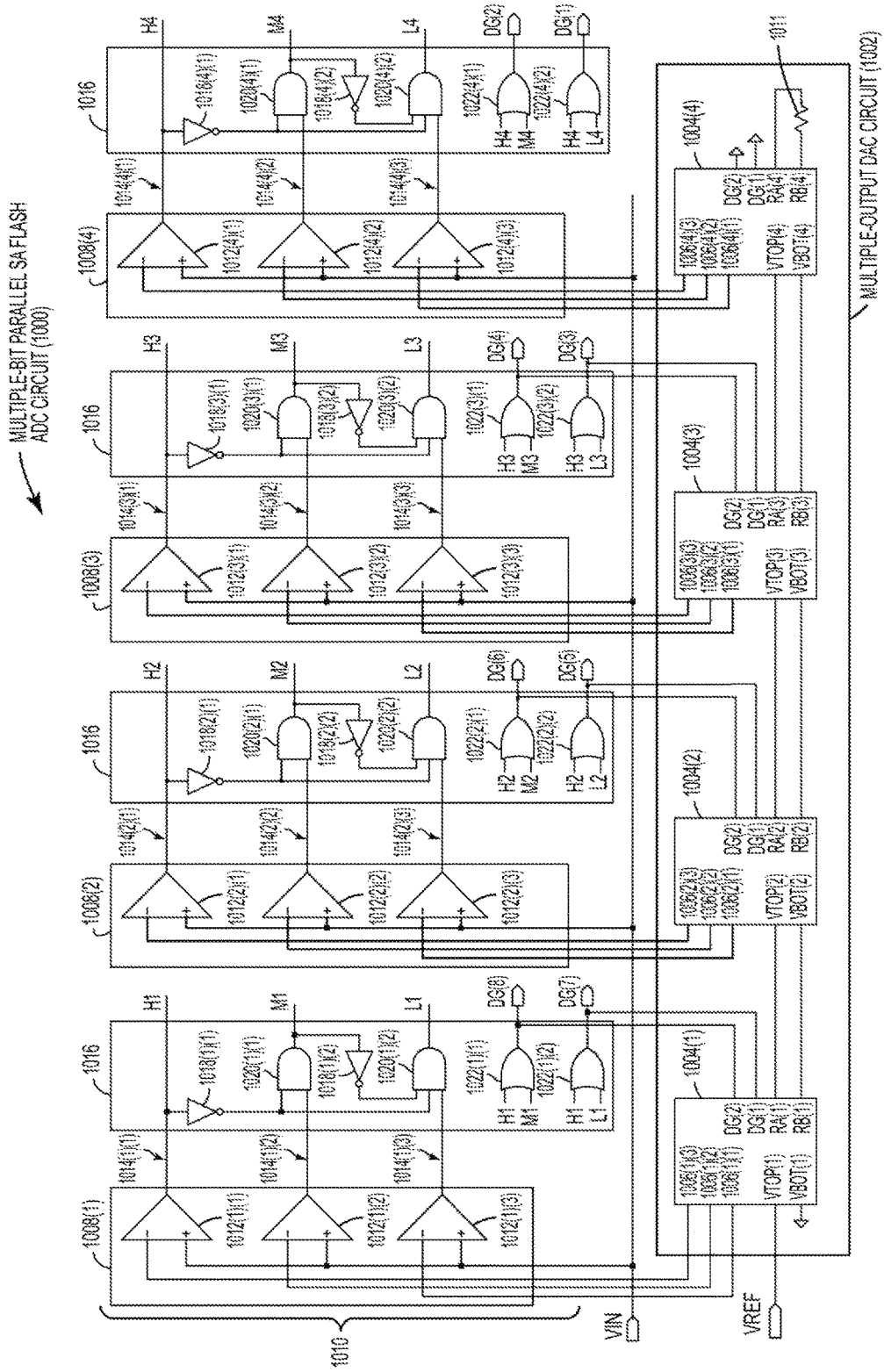
FIG. 10A is a circuit diagram of an exemplary multiple-bit parallel SA Flash ADC circuit that employs a multiple-output DAC circuit.

FIG. 10A illustrates an exemplary multiple-bit parallel SA Flash ADC circuit 1000 that employs a multiple-output DAC circuit 1002. In particular, the multiple-bit parallel SA Flash ADC circuit 1000 is configured to convert an analog input signal VIN into a digital output signal DOUT having digital bits DG(8)-DG(1), wherein two (2) of the digital bits DG(8)-DG(1) are generated in parallel. The multiple-output DAC circuit 1002 includes DAC stages 1004(1)-1004(4) configured to provide corresponding DAC analog signals 1006(1)(1)-(4)(3) based on a reference voltage VREF and a subset of the digital bits DG(8)-DG(1) generated by parallel comparator stages 1008(1)-1008(4) of a system compare circuit 1010. The DAC analog signals 1006(1)(1)-1006(4)(3) are provided to each corresponding parallel comparator stage 1008(1)-1008(4). The multiple-output DAC circuit 1002 also includes a resistor 1011. Optionally, the DAC stage 1004(4) could be replaced by a four (4) resistor voltage divider between the terminals for voltages VTOP(4) and VBOT(4) with DAC analog signals 1006(4)(1)-1006(4)(3) connected to the three (3) tap points of the voltage divider. This voltage divider would have the same resistance between the terminals for voltages VTOP(4) and VBOT(4) as the DAC stage 1004(4).

With continuing reference to FIG. 10A, each of the parallel comparator stages 1008(1)-1008(4) includes three (3) corresponding comparator circuits 1012(1)(1)-1012(4)(3). In particular, the number of comparator circuits 1012(1)(1)-1012(4)(3) in each parallel comparator stage 1008(1)-1008(4) equals the number of digital bits DG(8)-DG(1) of the corresponding parallel comparator stage 1008(1)-1008(4) (i.e., $2^b-1$, wherein b is number of parallel digital bits (two (2) in this example—e.g., DG(8) and DG(7), or DG (6) and DG(5), or DG(4) and DG(3), or DG(2) and DG(1)). Each comparator circuit 1012(1)(1)-1012(4)(3) receives the analog input signal VIN and a corresponding DAC analog signal 1006(1)(1)-1006(4)(3), and generates a digital signal 1014(1)(1)-1014(4)(3) based on comparing the analog input signal VIN and the DAC analog signal 1006(1)(1)-1006(4)(3). The system compare circuit 1010 is configured to generate the digital bits DG(8)-DG(1) corresponding to each parallel comparator stage 1008(1)-1008(4), wherein the digital bits DG(8)-DG(1) collectively form the digital output signal DOUT (not shown). In this aspect, the system compare circuit 1010 includes a TTB circuit 1016 that is configured to receive the digital signals 1014(1)(1)-1014(4)(3), and generate the digital bits DG(8)-DG(1) corresponding to each parallel comparator stage 1008(1)-1008(4) to form the digital output signal DOUT. In particular, the TTB circuit 1016 employs AND gates 1018(1)(1)-1018(4)(2), inverters 1020(1)(1)-1020(4)(2), and OR gates 1022(1)(1)-1022(4)(2) to generate the digital bits DG(8)-DG(1).

With continuing reference to FIG. 10A, each DAC stage 1004(1)-1004(4) is configured to generate a corresponding DAC analog signal 1006(1)(1)-1006(4)(3), wherein each DAC analog signal 1006(1)(1)-1006(4)(3) of each DAC stage 1004(1)-1004(4) is provided to a corresponding comparator circuit 1012(1)(1)-1012(4)(3) in each corresponding parallel comparator stage 1008(1)-1008(4). In particular, each DAC stage 1004(1)-1004(4) is configured to receive a corresponding top voltage VTOP(1)-VTOP(4) and a corresponding bottom voltage VBOT(1)-VBOT(4). Each DAC stage 1004(1)-1004(4) is further configured to generate each DAC analog signal 1006(1)(1)-1006(4)(3) (as DAC voltages VDAC(1)-VDAC(3) provided to the resistor rotator circuit 1024 in FIG. 10B), by dividing a voltage range of each corresponding top voltage VTOP(1)-VTOP(4) and each bottom voltage VBOT(1)-VBOT(4). For example, the reference voltage VREF is provided to the DAC stage 1004(1) as the top voltage VTOP(1), while a ground signal is provided to the DAC stage 1004(1) as the bottom voltage VBOT(1). Thus, the DAC analog signals 1006(1)(1)-1006(1)(3) of the DAC stage 1004(1) are divisions of the range between the reference voltage VREF and the ground signal. In this manner, the parallel comparator stage 1008(1) generates the digital signals 1014(1)(1)-1014(1)(3) based on each division of the voltage reference VREF such that the digital bits DG(8), DG(7) are generated based on whether the analog input signal VIN is greater than or less than each corresponding DAC analog signal 1006(1)(1)-1006(4)(3).

With continuing reference to FIG. 10A, the digital bits DG(8)-DG(3) are used to determine the top voltage VTOP(2)-VTOP(4) and the bottom voltage VBOT(2)-VBOT(4) for the subsequent DAC stages 1004(2)-1004(4). For example, in response to the digital bits DG(8), DG(7) reaching a stable state, the DAC stage 1004(1) provides the top voltage VTOP(2) and the bottom voltage VBOT(2) for the DAC stage 1004(2) from output nodes RA(1), RB(1). Additionally, the digital bits DG(6)-DG(5) are used by the DAC stage 1004(2) to determine the top and bottom voltages VTOP(3), VBOT(3) to provide to the DAC stage 1004(3) from output nodes RA(2), RB(2). Further, the digital bits DG(4), DG(3) are used by the DAC stage 1004(3) to determine the top and bottom voltages VTOP(4), VBOT(4) to provide to the DAC stage 1004(4) from output nodes RA(3), RB(3). Using the digital bits DG(8), DG(7) in this manner results in the top and bottom voltages VTOP(2), VBOT(2) having a voltage range in which the analog input signal VIN falls within. Thus, the top voltages VTOP(1)-VTOP(4) and the bottom voltages VBOT(1)-VBOT(4) are generated such that the multiple-bit parallel SA Flash ADC circuit 1000 is able to use successive approximation when generating the digital bits DG(8)-DG(1). Additionally, the digital bits DG(6)-DG(5) are used by the DAC stage 1004(2) to determine the top and bottom voltages VTOP(3), VBOT(3) to provide to the DAC stage 1004(3) from output nodes RA(2), RB(2). Further, the digital bits DG(4), DG(3) are used by the DAC stage 1004(3) to determine the top and bottom voltages VTOP(4), VBOT(4) to provide to the DAC stage 1004(4) from output nodes RA(3), RB(3). The digital bits DG(2), DG(1) are not provided to the DAC stage 1004(4) because the DAC stage 1004(4) (i.e., the final DAC stage 1004(4) of the multiple-output DAC circuit 1002) does not provide voltages to a subsequent DAC stage. Rather, in this aspect, the resistor 1011 is electrically coupled to output nodes RA(4), RB(4) of the DAC stage 1004(4) to provide the same resistance that a following DAC stage 1004 would have provided.

Figure 10B:
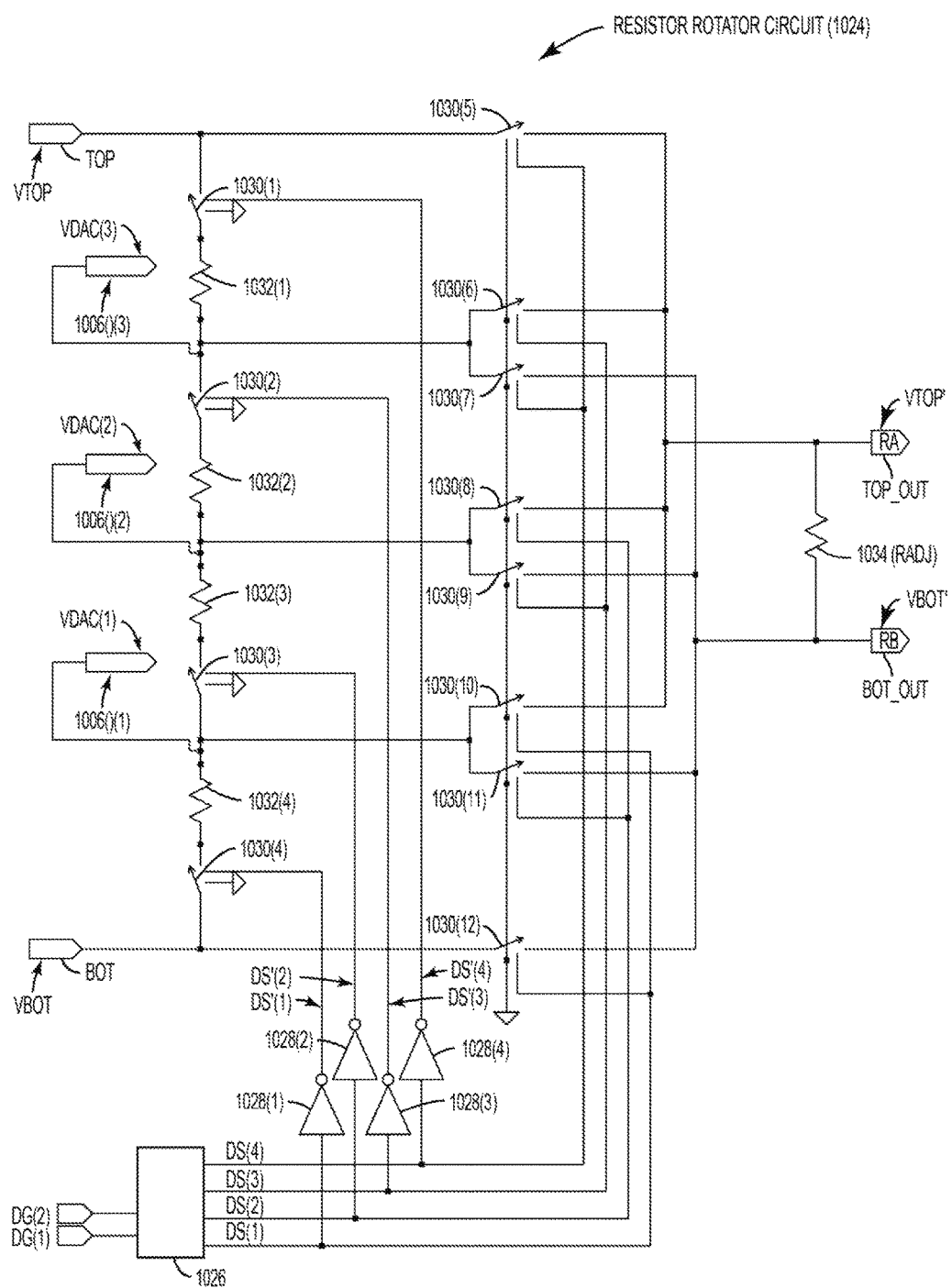
FIG. 10B is a circuit diagram of an exemplary resistor rotator circuit that can be employed for each DAC stage of the multiple-output DAC circuit of FIG. 10A.

FIG. 10B illustrates an exemplary resistor rotator circuit 1024 that can be employed for each DAC stage 1004(1)-1004(4) of the multiple-output DAC circuit 1002 of FIG. 10A. The resistor rotator circuit 1024 is configured to receive a top voltage VTOP on a top voltage input node TOP, and a bottom voltage VBOT on a bottom voltage input node BOT. The resistor rotator circuit 1024 also includes a decoder circuit 1026 configured to receive digital bits DG(2), DG(1) of the corresponding parallel comparator stage 1008, and generate decode signals DS(1)-DS(4) based on the digital bits DG(2), DG(1). In this aspect, the decoder circuit 1026 is a one-hot decoder, wherein only one of the decode signals DS(1)-DS(4) has a logic high "1" value. For example, the decode signals DS(1)-DS(4) are generated according to the following logic functions: DS(1)=(inverse DG(2) AND inverse DG(1)); DS(2)=(inverse DG(2) AND DG(1)); DS(3)=(DG(2) AND inverse DG(1)); and DS(4)=DG(2) AND DG(1)). The resistor rotator circuit 1024 also includes inverters 1028(1)-1028(4) configured to receive a corresponding decode signal DS(1)-DS(4), and generate corresponding inverse decode signals DS'(1)-DS'(4).

With continuing reference to FIG. 10B, the resistor rotator circuit 1024 also includes switches 1030(1)-1030(12). The switches 1030(1)-1030(4) are configured to receive a corresponding inverse decode signal DS'(1)-DS'(4). Additionally, the switches 1030(5), 1030(7) are configured to receive the decode signal DS(1), the switches 1030(6), 1030(9) are configured to receive the decode signal DS(2), the switches 1030(8), 1030(11) are configured to receive the decode signal DS(3), and the switches 1030(10), 1030(12) are configured to receive the decode signal D(4). Additionally, the resistor rotator circuit 1024 includes resistors 1032(1)-1032(4) serially coupled alternatingly with the corresponding switches 1030(1)-1030(4), and coupled in parallel with switches 1030(5)-1030(12). The resistor rotator circuit 1024 also includes an adjusting circuit 1034 having a resistance RADJ.

With continuing reference to FIG. 10B, the configuration above results in the resistor rotator circuit 1024 generating the DAC voltages VDAC(1)-VDAC(3), each of which is within the voltage range between the top voltage VTOP and the bottom voltage VBOT. In this aspect, the resistors 1032(1)-1032(4) each have an equal resistance (e.g., 2 kilo-Ohms (kΩ)) such that the DAC voltages VDAC(1)-VDAC(3) are equal divisions of the voltage range between the top voltage VTOP and the bottom voltage VBOT. For example, if the reference voltage VREF is equal to one (1.0) Volt (V), then the DAC voltages VDAC(3)-VDAC(1) may equal 0.75 V, 0.5 V, and 0.25 V, respectively, regardless of the values of the digital bits DG(2), DG(1). Additionally, the configuration above results in the resistor rotator circuit 1024 generating a next stage top voltage VTOP' on the top voltage output node TOP_OUT, and a next stage bottom voltage VBOT' on the bottom voltage output node BOT_OUT, wherein the next stage top and bottom voltages VTOP', VBOT' (i.e., RA and RB for the next DAC stage 1004) are determined according to which of the switches 1030(1)-1030(12) are open or closed based on the digital bits DG(2), DG(1).

Figure 11:
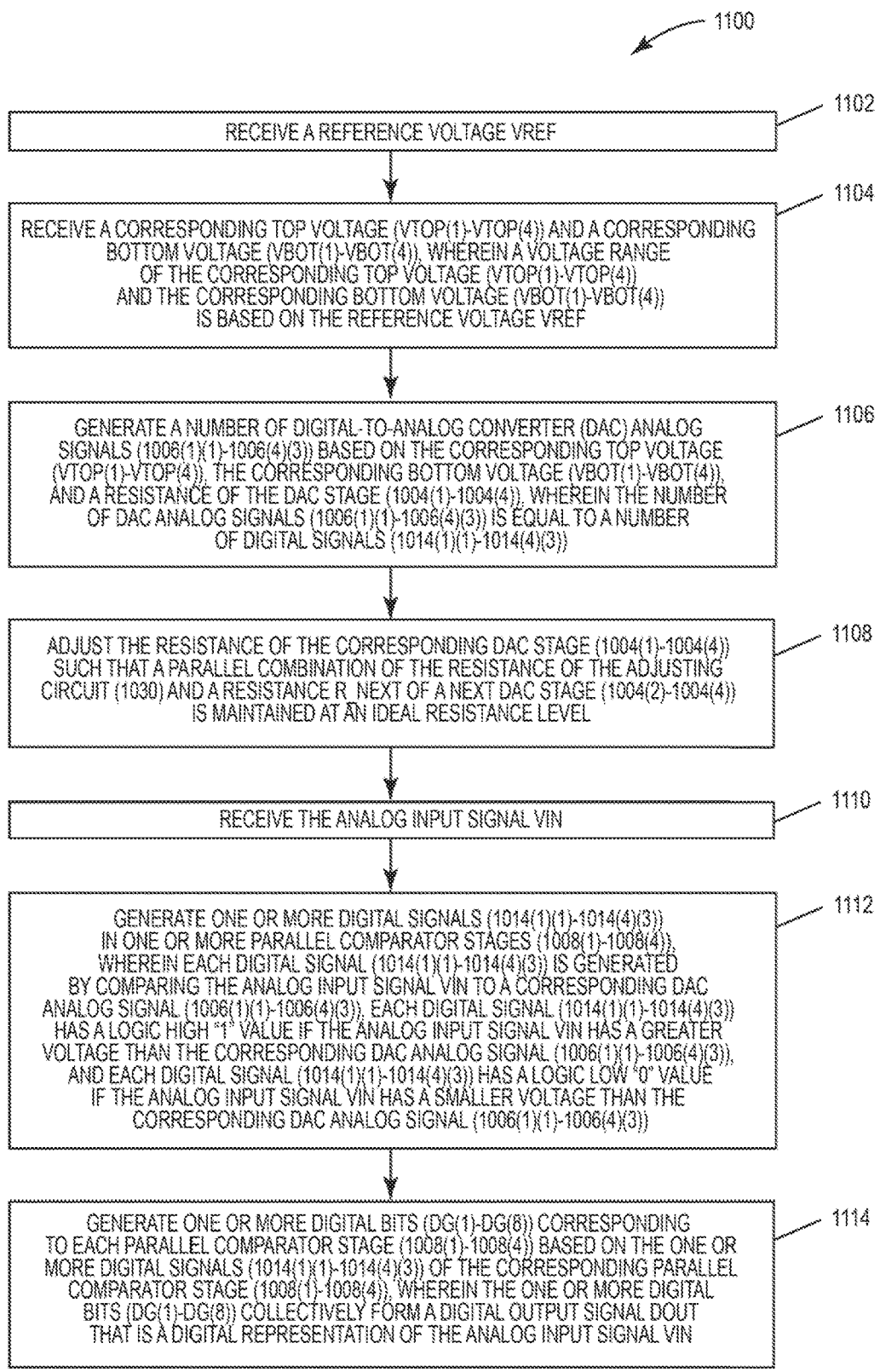
FIG. 11 is a flowchart illustrating an exemplary process that can be performed by the multiple-bit parallel SA Flash ADC circuit of FIG. 10A to convert an analog input signal into a digital output signal.

FIG. 11 illustrates an exemplary process 1100 that can be performed by the multiple-bit parallel SA Flash ADC circuit 1000 of FIG. 10A to convert the analog input signal VIN into the digital output signal DOUT. The process 1100 includes receiving the reference voltage VREF (block 1102). The process 1100 also includes receiving a corresponding top voltage VTOP(1)-VTOP(4) and a corresponding bottom voltage VBOT(1)-VBOT(4) (block 1104). A voltage range of the corresponding top voltage VTOP(1)-VTOP(4) and the corresponding bottom voltage VBOT(1)-VBOT(4) is based on the reference voltage VREF. The process 1100 also includes generating a number of DAC analog signals 1006(1)(1)-1006(4)(3) based on the corresponding top voltage VTOP(1)-VTOP(4), the corresponding bottom voltage VBOT(1)-VBOT(4), and a resistance of the DAC stage 1004(1)-1004(4) (block 1106). The number of DAC analog signals 1006(1)(1)-1006(4)(3) is equal to a number of digital signals 1014(1)(1)-1014(4)(3). The process 1100 further includes adjusting the resistance of the corresponding DAC stage 1004(1)-1004(4) such that a parallel combination of the resistance of the adjusting circuit 1030 and a resistance R_NEXT of a next DAC stage 1004(2)-1004(4) is maintained at an ideal resistance level (block 1108). The process 1100 further includes receiving the analog input signal VIN (block 1110).

With continuing reference to FIG. 11, the process 1100 further includes generating one or more digital signals 1014(1)(1)-1014(4)(3) in a plurality of parallel comparator stages 1008(1)-1008(4) (block 1112). Each digital signal 1014(1)(1)-1014(4)(3) is generated by comparing the analog input signal VIN to a corresponding DAC analog signal 1006(1)(1)-1006(4)(3). Further, each digital signal 1014(1)(1)-1014(4)(3) has a logic high "1" value if the analog input signal VIN has a greater voltage than the corresponding DAC analog signal 1006(1)(1)-1006(4)(3), while each digital signal 1014(1)(1)-1014(4)(3) has a logic low "0" value if the analog input signal VIN has a smaller voltage than the corresponding DAC analog signal 1006(1)(1)-1006(4)(3). The process 1100 also includes generating one or more digital bits DG(1)-DG(8) corresponding to each parallel comparator stage 1008(1)-1008(4) based on the one or more digital signals 1014(1)(1)-1014(4)(3) of the corresponding parallel comparator stage 1008(1)-1008(4) (block 1114). The one or more digital bits DG(1)-DG(8) collectively form a digital output signal DOUT that is a digital representation of the analog input signal VIN.

Figure 12:
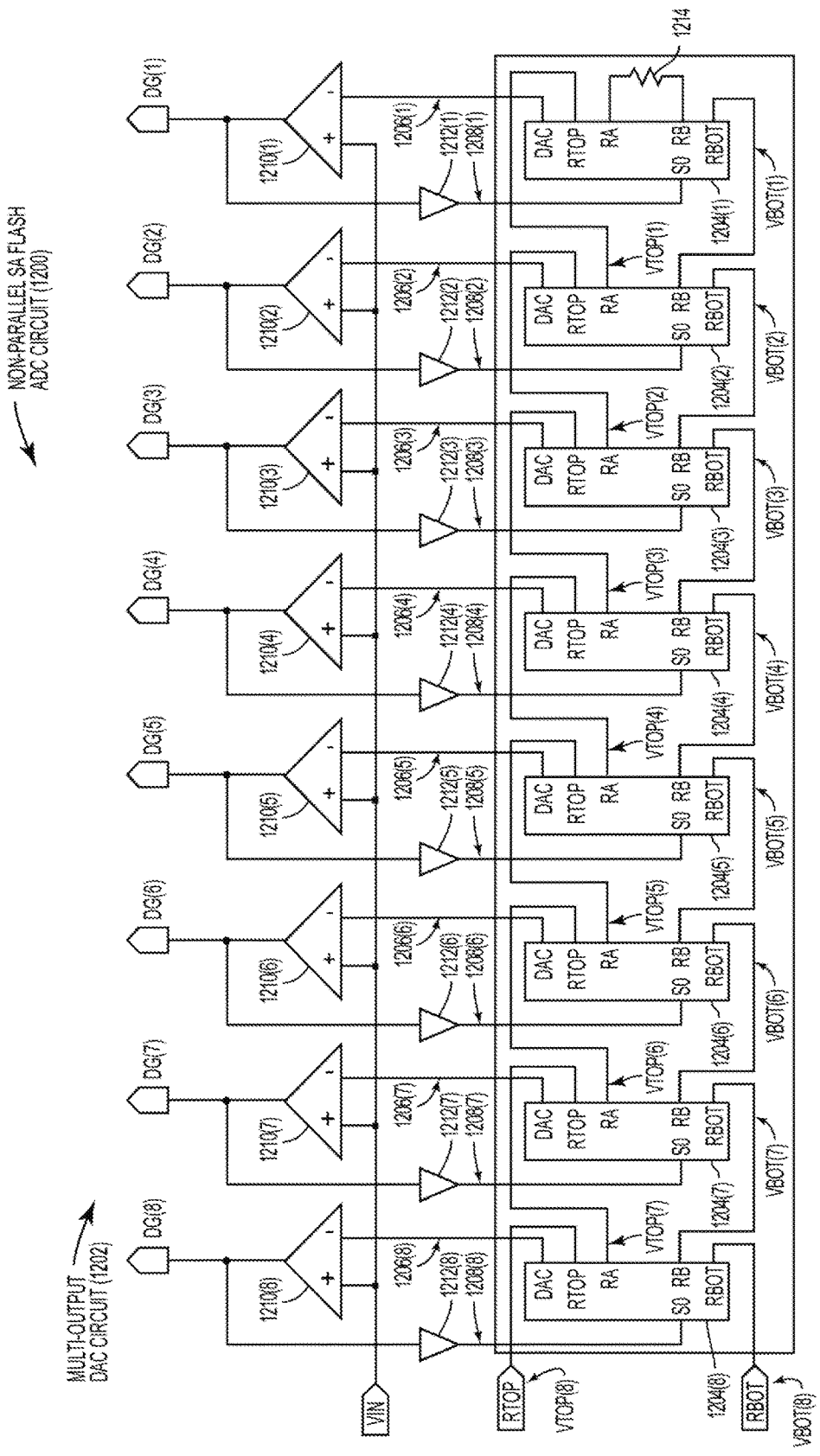
FIG. 12 is a circuit diagram of an exemplary Successive Approximation (SA) Flash ADC circuit that employs a multiple-output DAC circuit.

In addition to the multiple-bit parallel SA Flash ADC circuit 1000 of FIG. 10A, other types of Flash ADC circuits may employ multiple-output DAC circuits. In this regard, FIG. 12 illustrates an exemplary non-parallel SA Flash ADC circuit 1200 (i.e., generates one digital bit DG at a time) that employs a multiple-output DAC circuit 1202. In this aspect, the multiple-output DAC circuit 1202 includes DAC stages 1204(1)-1204(8), each of which is configured to generate a corresponding DAC analog signal 1206(1)-1206(8). Each DAC stage 1204(1)-1204(8) generates the corresponding DAC analog signal 1206(1)-1206(8) by receiving a corresponding top voltage VTOP(1)-VTOP(8), a corresponding bottom voltage VBOT(1)-VBOT(8), and a corresponding digital signal 1208(1)-1208(8) of a corresponding compare circuit 1210(1)-1210(8). In this example, each digital signal 1208(1)-1208(8) is output from a corresponding buffer 1212(1)-1212(8) that receives a corresponding digital bit DG(1)-DG(8), wherein the digital bit DG(1)-DG(8) is generated by each compare circuit 1210(1)-1210(8) comparing the corresponding DAC analog signal 1206(1)-1206(8) and an analog input signal VIN. The buffers 1212(1)-1212(8) provide gain between the digital bits DG(1)-DG(8) generated by the compare circuits 1210(1)-1210(8) and an input node S0 of the corresponding DAC stage 1204(1)-1204(8). Additionally, in this aspect, the multiple-output DAC circuit 1202 includes a resistor 1214 corresponding to the DAC stage 1204(1).

Figure 13A:
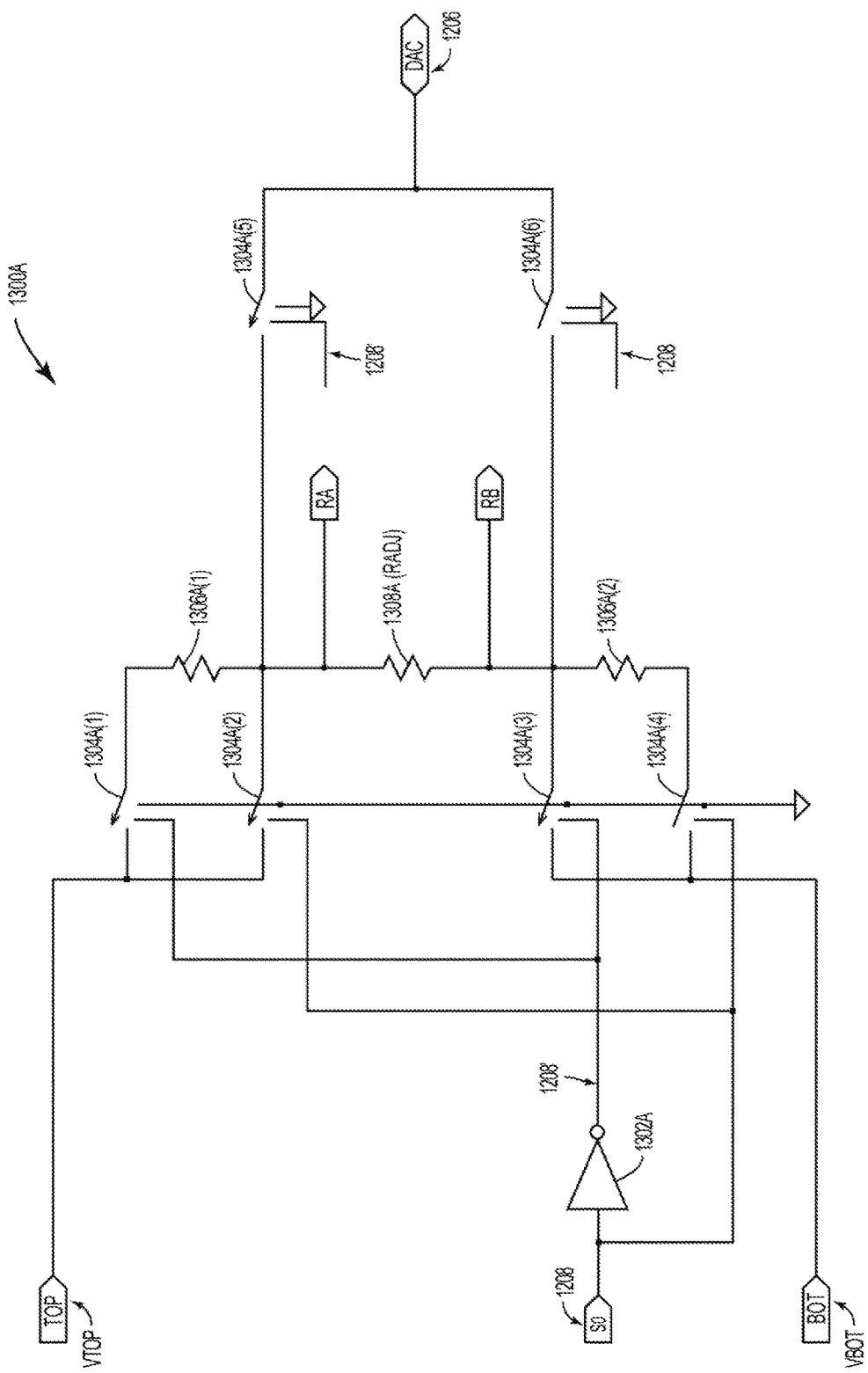
FIG. 13A is a circuit diagram of an exemplary resistor rotator circuit that may be employed in each DAC stage of the multiple-output DAC circuit of FIG. 12.

FIG. 13A illustrates an exemplary resistor rotator circuit 1300A that may be employed in each DAC stage 1204(1)-1204(8) of the multiple-output DAC circuit 1202 of FIG. 12. The resistor rotator circuit 1300A is configured to receive a top voltage VTOP on a top voltage input node TOP, a bottom voltage VBOT on a bottom voltage input node BOT, and a corresponding digital signal 1208 on the input node S0. The resistor rotator circuit 1300A includes an inverter 1302A configured to receive the digital signal 1208, and generate a corresponding inverted digital signal 1208'. The resistor rotator circuit 1300A also includes switches 1304A(1)-1304A(6), and resistors 1306A(1), 1306A(2). Based on the design illustrated in FIG. 13A, the resistor rotator circuit 1300A is configured to generate the corresponding DAC analog signal 1206 of FIG. 12. In particular, based on how the elements are connected as illustrated in FIG. 13A, the resistor rotator circuit 1300A is referred to as a "shorting" type of resistor rotator circuit, wherein the DAC analog signal 1206 is equal to an average of the top voltage VTOP and the bottom voltage VBOT. An adjusting circuit 1308A having a resistance RADJ is also employed. Additionally, the digital signal 1208 determines whether an effective resistance between RA and RB is placed on the bottom or the top of the voltage divider provided by the two (2) resistors 1306A(1), 1306A(2) coupled to respective terminals TOP and BOT.

Figure 13B:
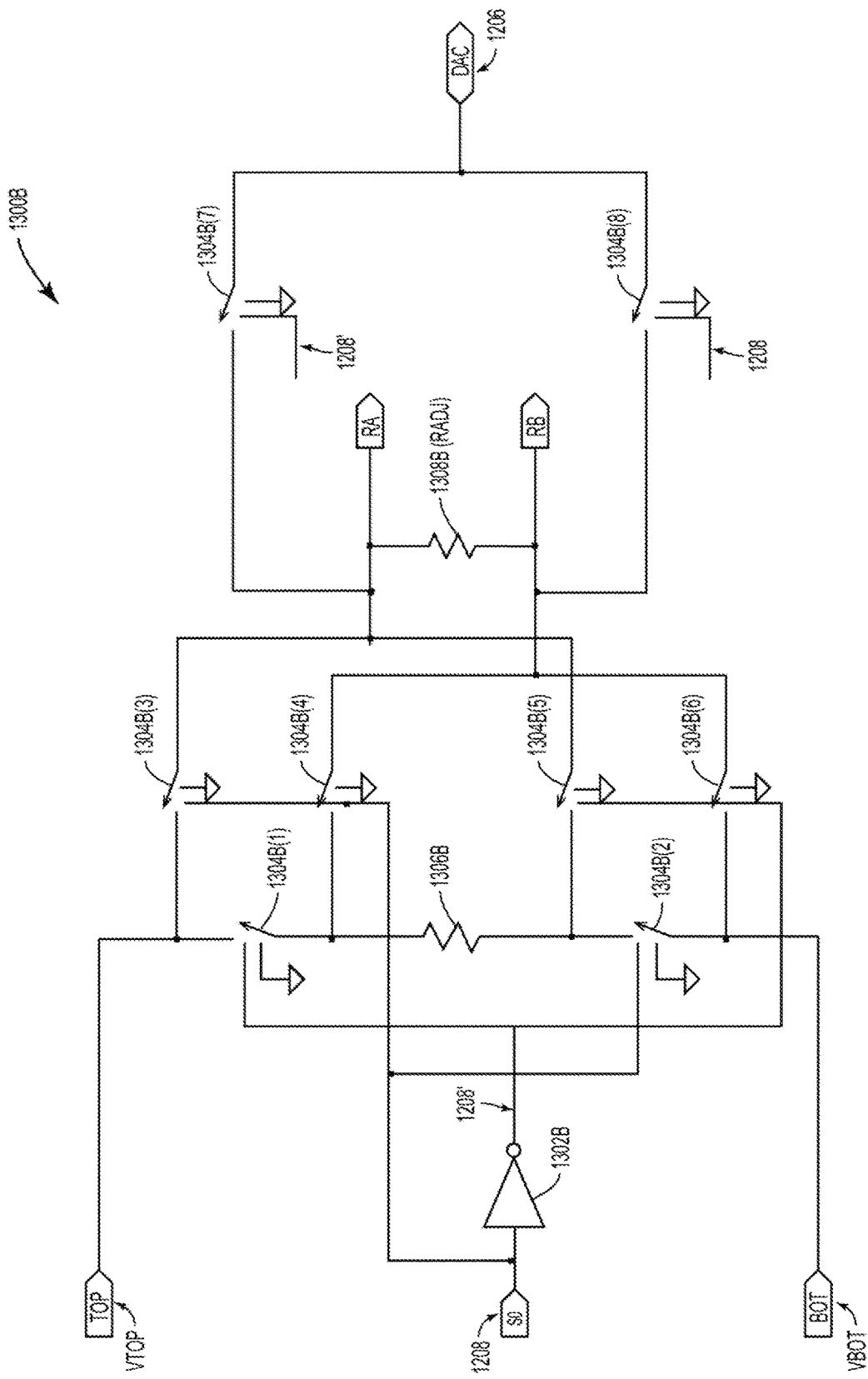
FIG. 13B is a circuit diagram of another exemplary resistor rotator circuit that may be employed in each DAC stage of the multiple-output DAC circuit of FIG. 12.

FIG. 13B illustrates another exemplary resistor rotator circuit 1300B that may be employed in each DAC stage 1204(1)-1204(8) of the multiple-output DAC circuit 1202 of FIG. 12. The resistor rotator circuit 1300B is configured to receive a top voltage VTOP on a top voltage input node TOP, a bottom voltage VBOT on a bottom voltage input node BOT, and a corresponding digital signal 1208 on an input node S0. The resistor rotator circuit 1300B includes an inverter 1302B configured to receive the digital signal 1208, and generate a corresponding inverted digital signal 1208'. The resistor rotator circuit 1300B also includes switches 1304B(1)-1304B(8), and a resistor 1306B. Based on the design illustrated in FIG. 13B, the resistor rotator circuit 1300B is configured to generate the corresponding DAC analog signal 1206 of FIG. 12. In particular, based on how the elements are connected as illustrated in FIG. 13B, the resistor rotator circuit 1300B is referred to as a "replacement" type of resistor rotator circuit, wherein the DAC analog signal 1206 is equal to an average of the top voltage VTOP and the bottom voltage VBOT. An adjusting circuit 1308B having a resistance RADJ is also employed. Additionally, the digital signal 1208 determines whether an effective resistance between RA and RB is placed on the bottom or the top of the voltage divider provided by the two (2) resistors 1306A(1), 1306A(2) coupled to respective terminals TOP and BOT.

Figure 14A:
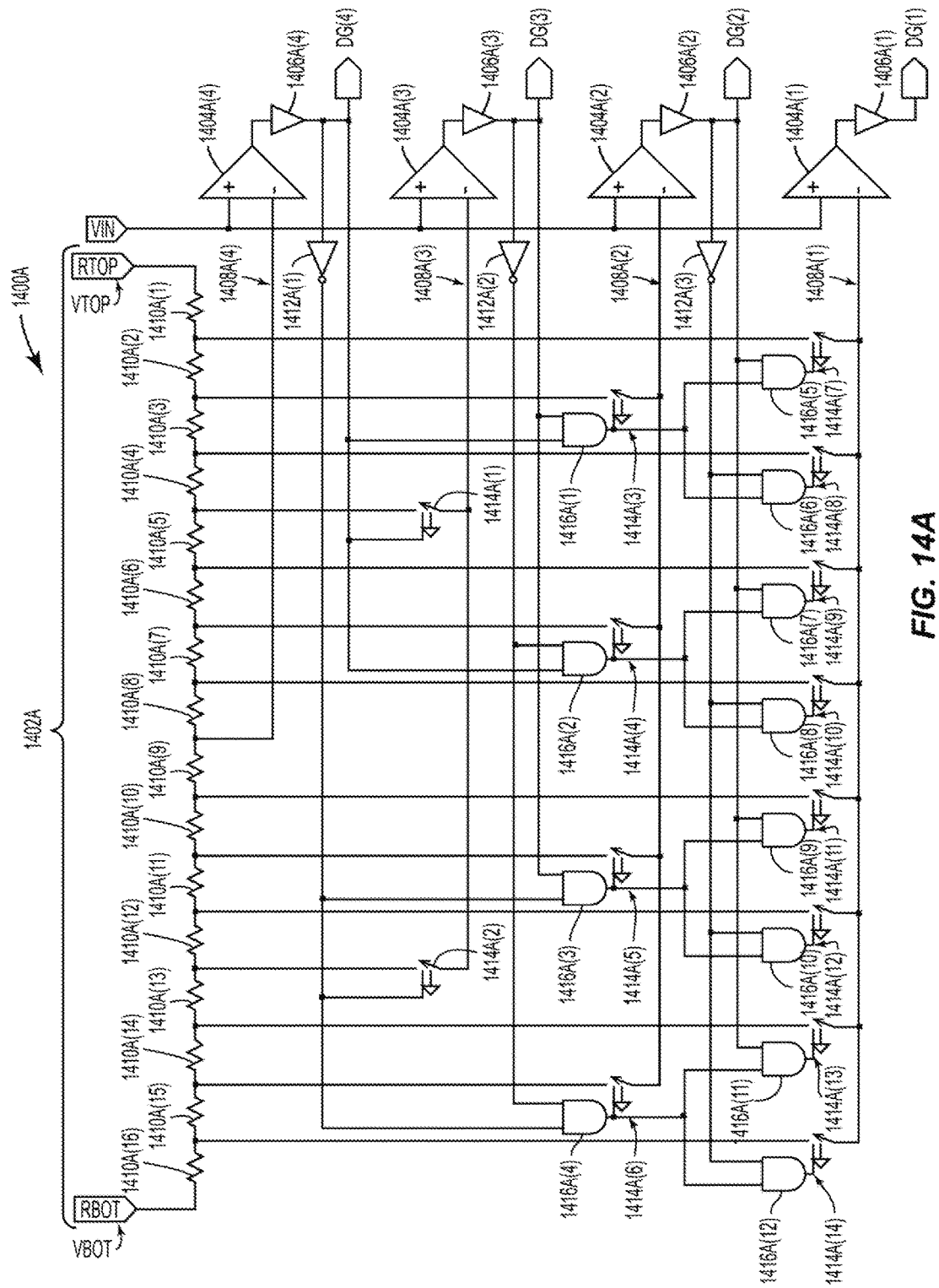
FIG. 14A is a circuit diagram of another exemplary SA Flash ADC circuit employing another type of multiple-output DAC circuit.

FIG. 14A illustrates another exemplary non-parallel SA Flash ADC circuit 1400A employing another type of multiple-output DAC circuit 1402A. The non-parallel SA Flash ADC circuit 1400A is configured to generate the digital bits DG(1)-DG(4), and includes comparator circuits 1404A(1)-1404A(4) and buffers 1406A(1)-1406A(4) similar to the non-parallel SA Flash ADC circuit 1200 in FIG. 12. The buffers 1406A(1)-1406A(4) provide gain to the digital bits DG(1)-DG(4) generated by the respective comparator circuits 1404A(1)-1404A(4). However, the multiple-output DAC circuit 1402A is designed as a voltage divider configured to generate DAC analog signals 1408A(1)-1408A(4) by selecting particular voltages. More specifically, the multiple-output DAC circuit 1402A employs resistors 1410A(1)-1410A(16), inverters 1412A(1)-1412A(3), switches 1414A(1)-1414A(14), and AND-gates 1416A(1)-1416A(12). Employing the above noted elements as illustrated in FIG. 14A results in the DAC analog signals 1408A(1)-1408(4) being generated according to which switches 1414A(1)-1414A(14) are activated/deactivated by the value of select signals provided to the non-parallel SA Flash ADC circuit 1400A. In other words, the DAC analog signals 1408A(1)-1408A(4) are generated by dividing a top voltage VTOP and a bottom voltage VBOT, and selecting a corresponding divided voltage according to which switches 1414A(1)-1414A(14) are activated. It is worth noting that the multiple-output DAC circuit 1402A may also be employed in multiple-bit parallel SA Flash ADC circuits.

Figure 14B:
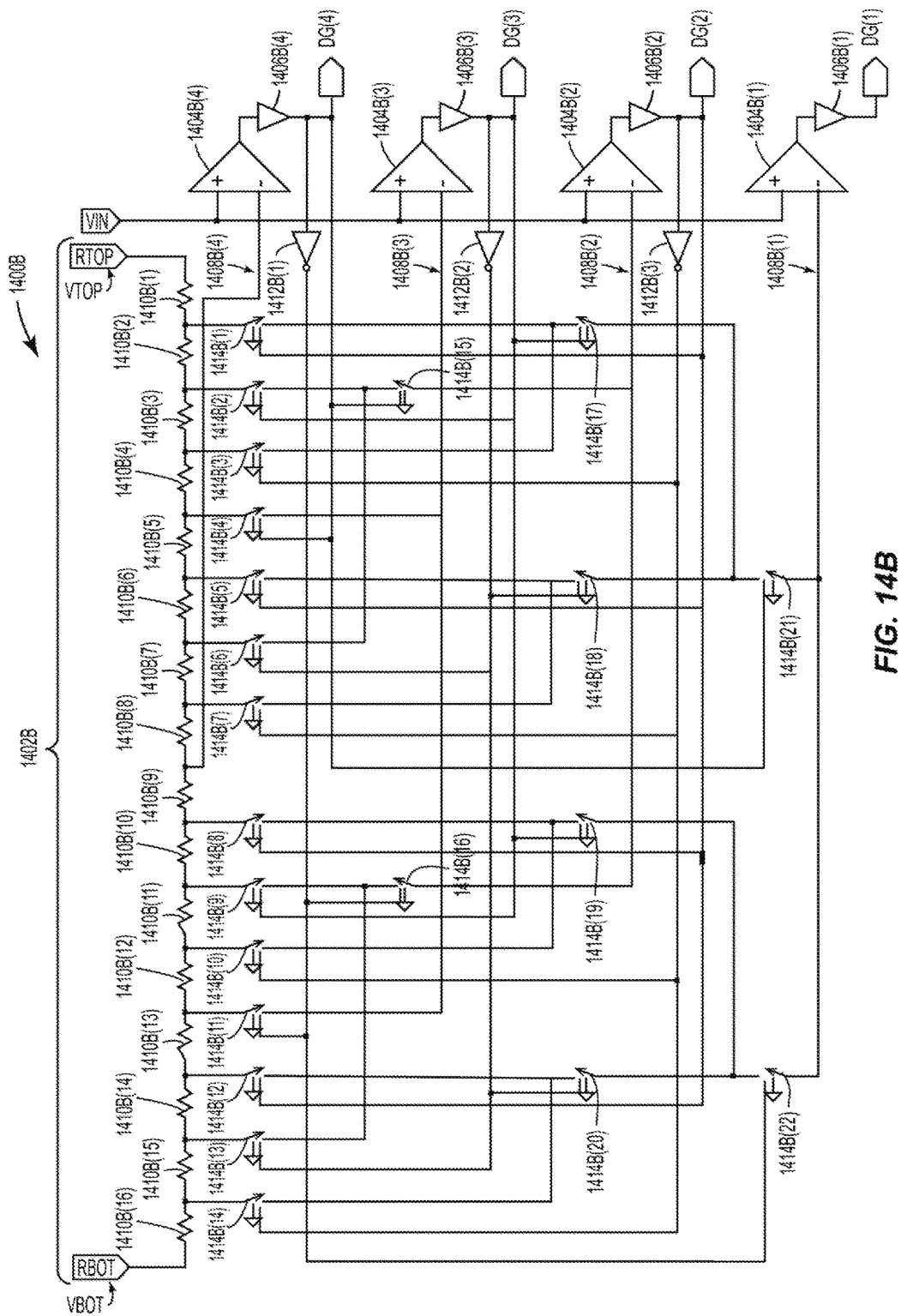
FIG. 14B is a circuit diagram of another exemplary SA Flash ADC circuit employing another type of multiple-output DAC circuit.

FIG. 14B illustrates another exemplary non-parallel SA Flash ADC circuit 1400B employing another type of multiple-output DAC circuit 1402B. The non-parallel SA Flash ADC circuit 1400B is configured to generate the digital bits DG(1)-DG(4), and includes comparator circuits 1404B(1)-1404B(4) and buffers 1406B(1)-1406B(4) similar to the non-parallel SA Flash ADC circuit 1200 in FIG. 12. However, the multiple-output DAC circuit 1402B is designed as a voltage divider configured to generate DAC analog signals 1408B(1)-1408B(4) by selecting particular voltages. More specifically, the multiple-output DAC circuit 1402B employs resistors 1410B(1)-1410B(16), inverters 1412B(1)-1412B(3), and switches 1414B(1)-1414B(22). Employing the above noted elements as illustrated in FIG. 14B results in the DAC analog signals 1408B(1)-1408B(4) being generated according to which switches 1414B(1)-1414B(22) are activated/deactivated by the value of select signals provided to the multiple-output DAC circuit 1402B. In other words, the DAC analog signals 1408B(1)-1408B(4) are generated by dividing a top voltage VTOP and a bottom voltage VBOT, and selecting a corresponding divided voltage according to the select signals SEL(1)-SEL(22). It is worth noting that the multiple-output DAC circuit 1402B may also be employed in multiple-bit parallel SA Flash ADC circuits.

Figure 15:
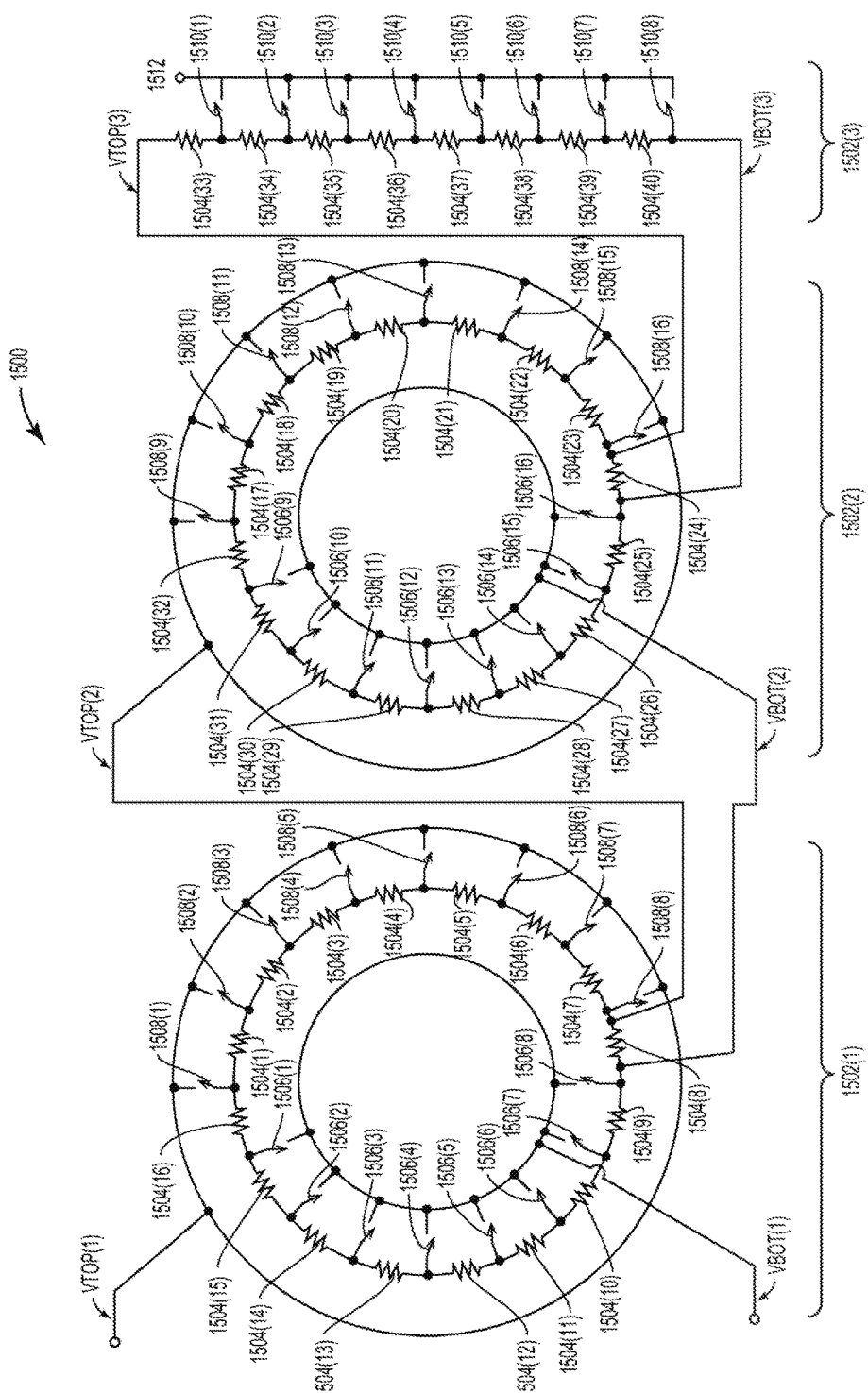
FIG. 15 is a circuit diagram of an exemplary three (3) rank single-output DAC circuit using "resistor rotators" as the first two resistor ranks.

FIG. 15 illustrates an exemplary three (3) rank single-output DAC circuit 1500 (also referred to as a "single-output DAC circuit 1500"). In particular, the single-output DAC circuit 1500 is a nine (9)-bit triple rank directly connected resistor string DAC circuit that includes ranks 1502(1)-1502(3). The rank 1502(1) includes resistors 1504(1)-1504(16), inner switches 1506(1)-1506(8), and outer switches 1508(1)-1508(8), wherein the inner and outer switches 1506(1)-1506(8), 1508(1)-1508(8) are activated or deactivated in corresponding pairs by a logic circuit. For example, the inner and outer switches 1506(8), 1508(1) are activated or deactivated in a pair, as are the other inner and outer switches through input switches 1506(1), 1508(8). The rank 1502(1) is configured to receive a top voltage VTOP(1) and a bottom voltage VBOT(1). Based on which inner and outer switches 1506(1)-1506(8), 1508(1)-1508(8) are activated or deactivated according to select signals (not shown), the rank 1502(1) generates top and bottom voltages VTOP(2), VBOT(2) that are provided to the rank 1502(2). The rank 1502(2) includes resistors 1504(17)-1504(32), inner switches 1506(9)-1506(16), and outer switches 1508(9)-1508(16). Further, based on which of the inner and outer switches 1506(9)-1506(16), 1508(9)-1508(16) are activated or deactivated by select signals (not shown), the rank 1502(2) is configured to generate top and bottom voltages VTOP(3), VBOT(3) that are provided to the rank 1502(3). The rank 1502(3) includes resistors 1504(33)-1504(40) and switches 1510(1)-1510(8).

Based on which switches 1510(1)-1510(8) are activated or deactivated by select signals (not shown), the rank 1502(3) is configured to generate a DAC analog signal 1512 as an output of the single-output DAC circuit 1500.

Figure 16:
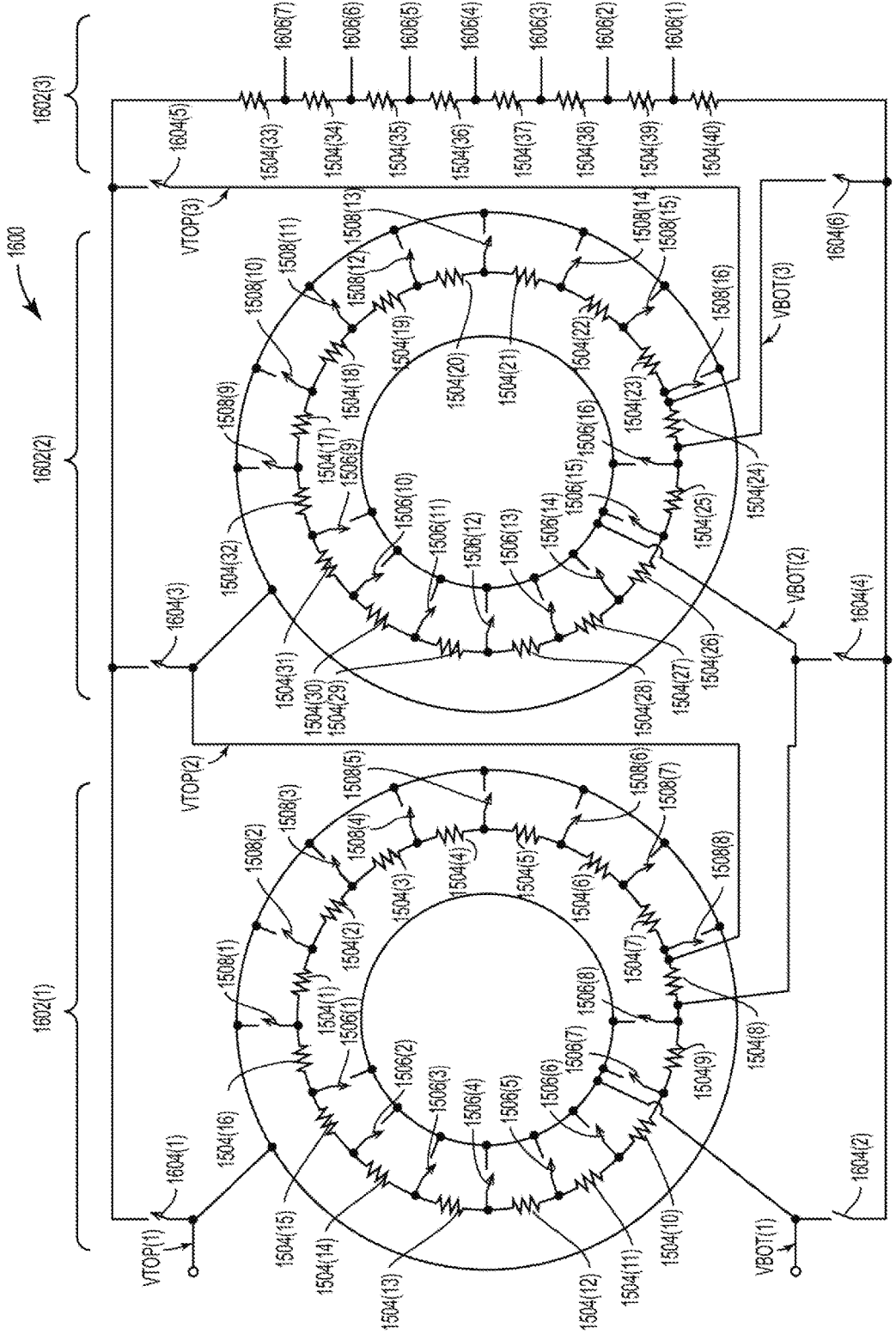
FIG. 16 is a circuit diagram of an exemplary three (3) rank multiple-output DAC circuit evolved from the three (3) rank single-output DAC circuit in FIG. 15.

FIG. 16 illustrates an exemplary three (3) rank multiple-output DAC circuit 1600 (also referred to as a "multiple-output DAC circuit 1600"). In particular, the multiple-output DAC circuit 1600 is a nine (9)-bit triple rank directly connected resistor string DAC circuit. The multiple-output DAC circuit 1600 includes ranks 1602(1)-1602(3). The ranks 1602(1)-1602(3) include certain common elements with the ranks 1502(1)-150(3) of FIG. 15, which are referred to with common element numbers in FIGS. 15 and 16, and thus will not re-described herein. In addition to including the elements described with reference to FIG. 15, rank 1602(1) includes switches 1604(1), 1604(2), the rank 1602(2) includes switches 1604(3), 1604(4), and the rank 1602(3) includes switches 1604(5), 1604(6). The switches 1604(1)-1604(6) are used to position the ranks 1602(1)-1602(3) to an appropriate position for operation of a corresponding multiple-bit parallel SAR ADC circuit. Additionally, the rank 1602(3) is configured to generate multiple DAC analog signals 1606(1)-1606(7) as the output of the multiple-output DAC circuit 1600. Note the multi-output DAC circuit 1600 only needs six (6) bits for the control of the switches 1604(1)-1604(6), because the seven (7) DAC analog signals 1606(1)-1606(7) are all available simultaneously.

Figure 17:
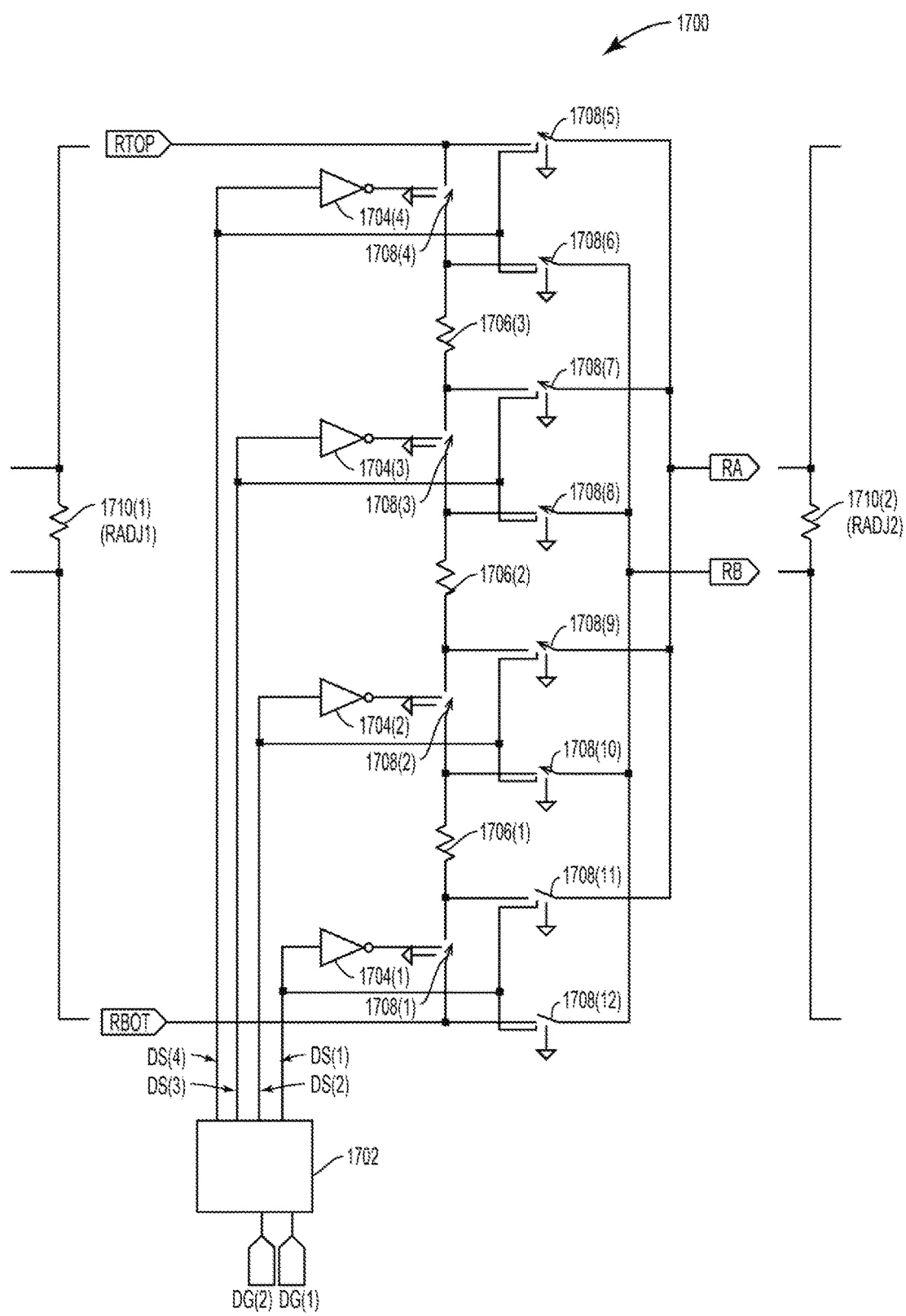
FIG. 17 is a circuit diagram of an exemplary resistor rotator circuit employing an "insertion" approach that may be employed in each DAC stage of a multiple-output DAC circuit.

FIG. 17 illustrates an exemplary resistor rotator circuit 1700 employing an "insertion" approach that may be employed in each DAC stage of a multiple-output DAC circuit. As used in this aspect, insertion means that an equivalent resistance is inserted to the appropriate position in the resistor rotator circuit 1700. The resistor rotator circuit 1700 includes input ports RTOP, RBOT, output ports RA, RB, a decode circuit 1702 configured to receive digital bits DG(1), DG(2), and provide digital decode bits DS(1)-DS(4). The resistor rotator circuit 1700 also includes inverters 1704(1)-1704(4), resistors 1706(1)-1706(3), and switches 1708(1)-1708(12). If the resistor rotator circuit 1700 is used in a multiple-output DAC circuit, additional logic circuits and switches would be included to generate the DAC analog output(s). Additionally, in this aspect, adjustable resistors 1710(1), 1710(2) have respective resistances RADJ1, RADJ2 are illustrated.

Figure 18:
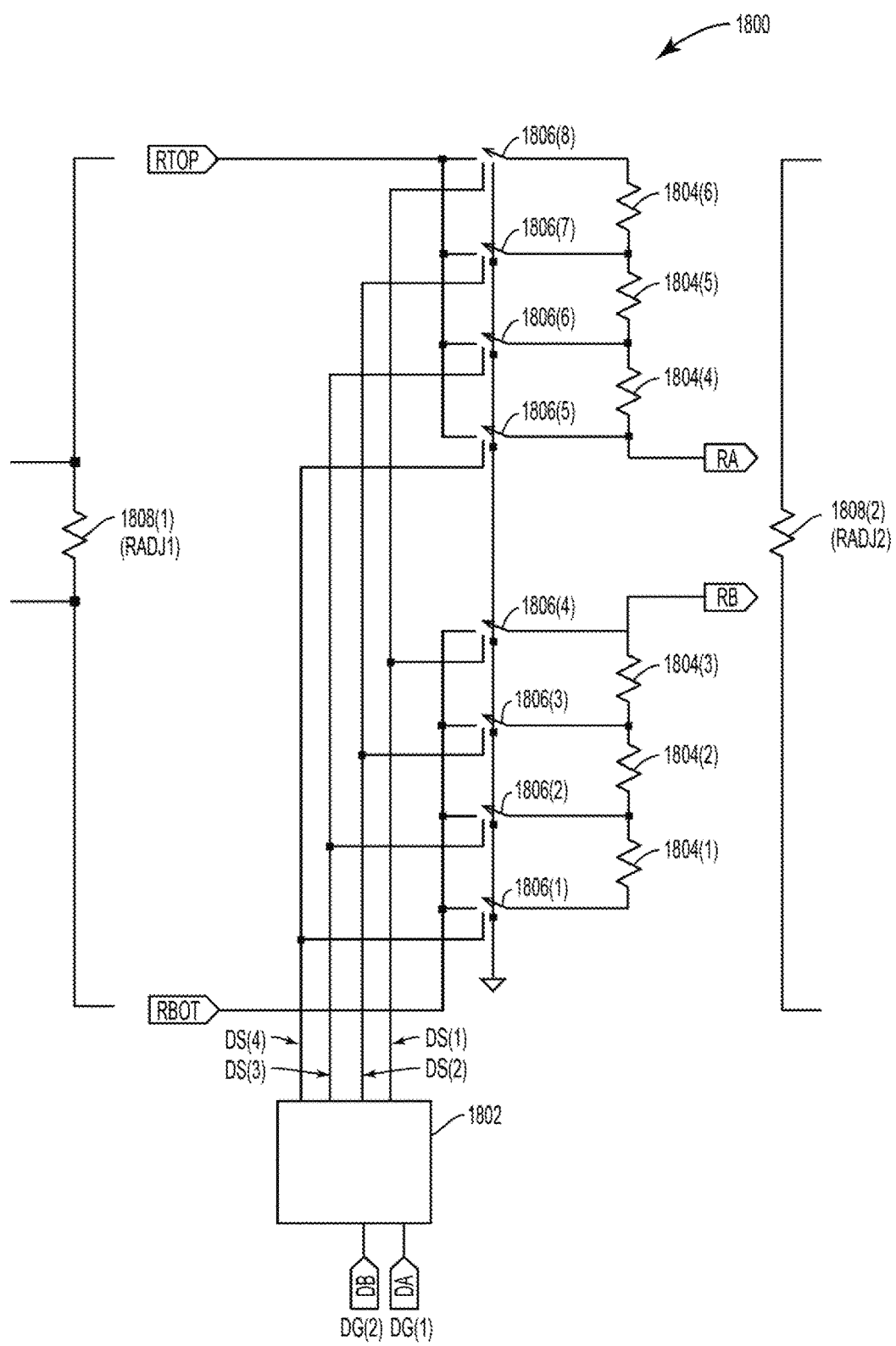
FIG. 18 is a circuit diagram of an exemplary resistor rotator circuit employing a "shorting" approach that may be employed in each DAC stage of a multiple-output DAC circuit.

FIG. 18 is a circuit diagram of an exemplary resistor rotator circuit 1800 employing a "shorting" approach that may be employed in each DAC stage of a multiple-output DAC circuit. In particular, the resistor rotator circuit 1800 includes a decode circuit 1802 configured to receive digital bits DG(1), DG(2), and provide digital decode bits DS(1)-DS(4). The resistor rotator circuit 1800 also includes resistors 1804(1)-1804(6), and switches 1806(1)-1806(8). The resistor rotator circuit 1800 also includes input ports RTOP, RBOT, and output ports RA, RB. If the resistor rotator circuit 1800 is used in a multiple-output DAC circuit, additional logic circuits and switches would be included to generate the output(s). Additionally, in this aspect, adjustable resistors 1808(1), 1808(2) having respective resistances RADJ1, RADJ2 are illustrated.

Figure 19:
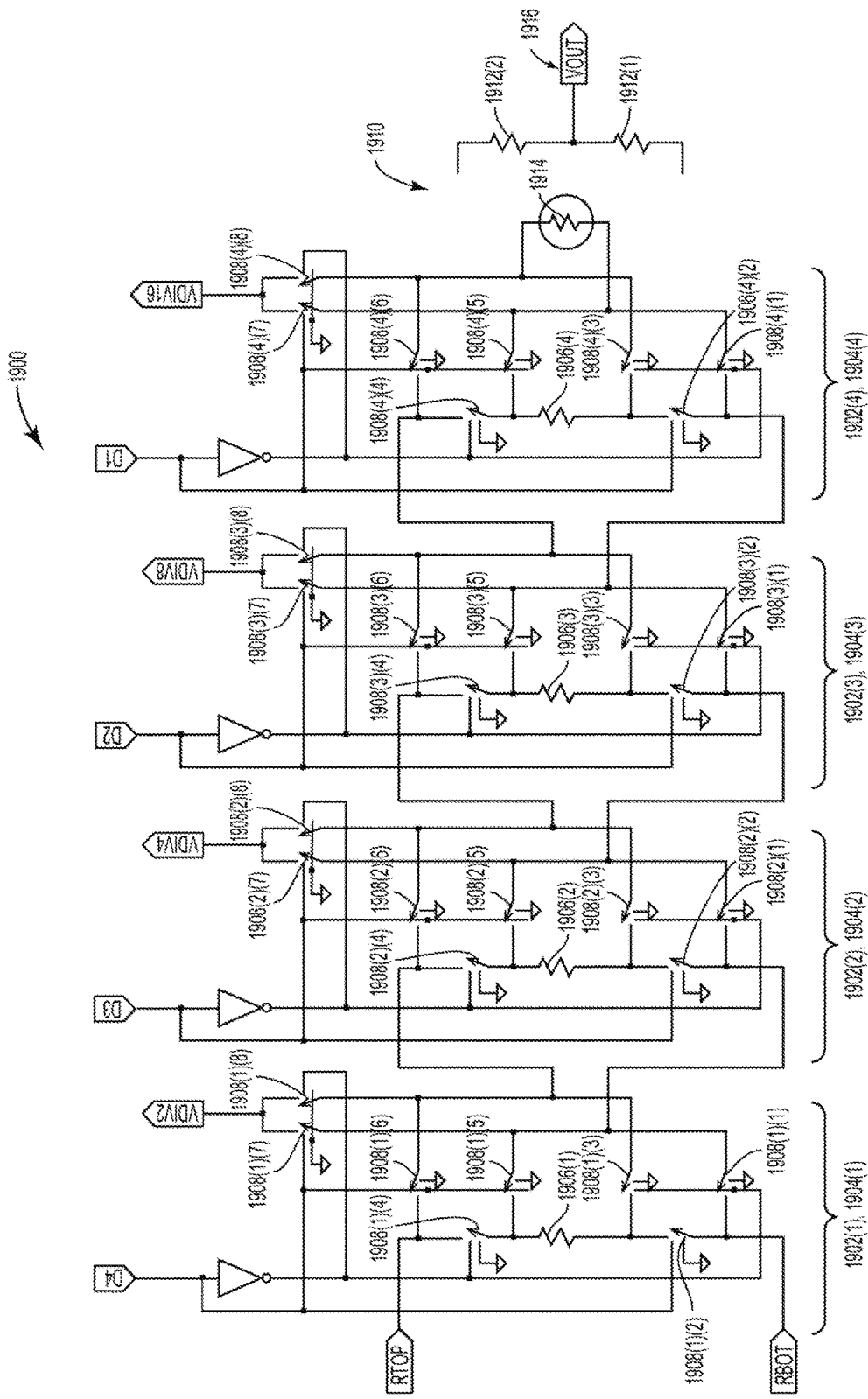
FIG. 19 is a circuit diagram of an exemplary resistor rotator circuit employing a "rearrangement" approach that may be employed in each DAC stage of a multiple-output DAC circuit.

FIG. 19 is a circuit diagram of an exemplary multiple-output DAC circuit 1900 employing resistor rotator circuits 1902(1)-1902(4) in each DAC stage 1904(1)-1904(4), wherein each resistor rotator circuit 1902(1)-1902(4) uses a "rearrangement" approach. The multiple-output DAC circuit 1900 includes input ports RTOP, RBOT, input ports D4-D1, and output ports VDIV2, VDIV4, VDIV8, and VDIV16. Each resistor rotator circuit 1902(1)-1902(4) employs a corresponding resistor 1906(1)-1906(4) and corresponding switches 1908(1)(1)-1908(4)(8). The resistor 1906(1) of the DAC stage 1904(1) in this aspect has an eight (8) kΩ resistance in this example. The total equivalent resistance following the DAC stage 1904(1) is also eight (8) kΩ, and it can be inserted either above or below the resistor 1906(1). The resistor 1906(2) of the DAC stage 1904(2) has a four (4) kΩ resistance in this example, and the total equivalent resistance following the DAC stage 1904(2) is also four (4) kΩ, which can either be inserted above or below the resistor 1906(2). The DAC stages 1904(3), 1904(4) follow a similar pattern of resistances wherein resistor 1906(3) has a resistance of two (2) k, and resistor 1906(4) has a resistance of one (1) kΩ in this example. In this manner, the resistors 1904(1)-1906(4) are binarily weighted with respect to each other. The DAC stage 1904(4) is terminated by a simple voltage divider 1910 employing resistors 1912(1), 1912(2). The resistor rotator circuit 1902(4) also includes a resistor 1914. Resistor 1914 may be either a single resistor or it may be the equivalent resistance of the voltage divider 1910 depending on the application. The single output is taken from the center of the voltage divider 1910. Further, digital select bits D4-D1 cause the resistors 1906(1)-1906(4), which are binarily weighted, to be rearranged to generate the required voltage for a single-output DAC analog signal 1916. An alternative to resistor 1904(4) is to substitute the voltage divider 1910 across the terminals that connect resistor 1904(4) to the previous resistor rotator stage 1904(3).

Figure 20A:
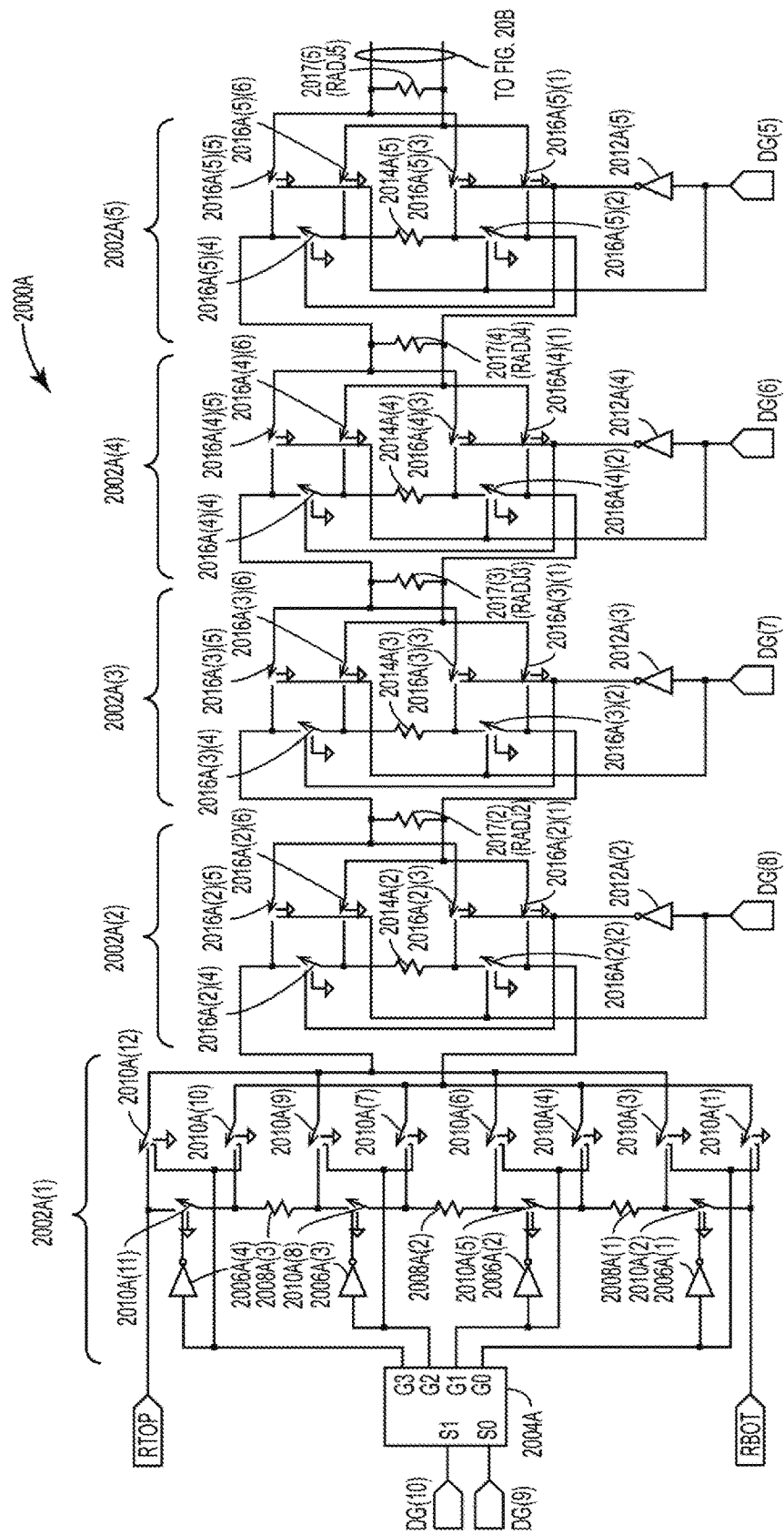
FIGS. 20A and 20B illustrate a circuit diagram of an exemplary single-output DAC circuit.
Figure 20B:
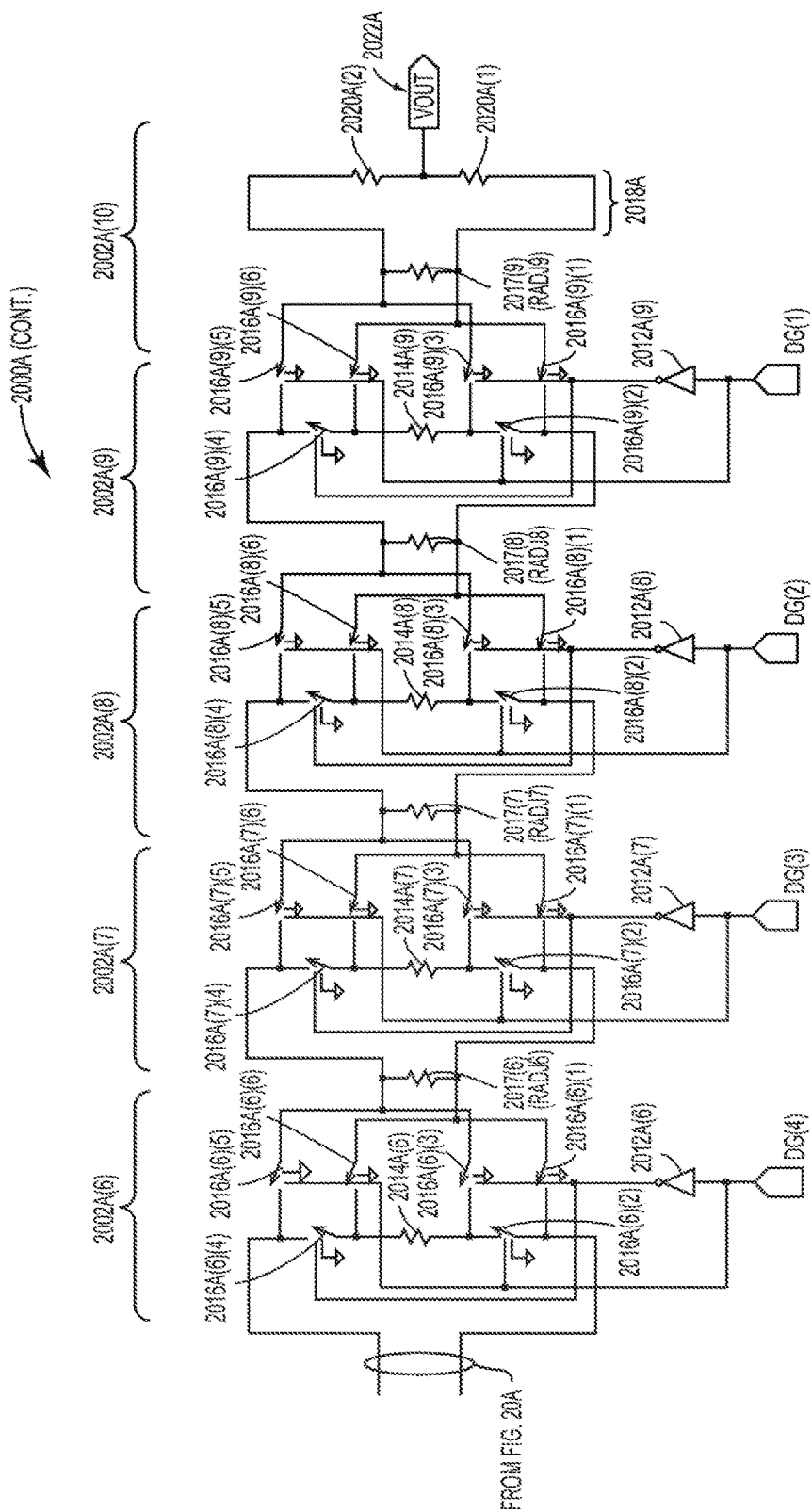

FIGS. 20A and 20B illustrate another exemplary single-output DAC circuit 2000A, also referred to as a ten (10)-bit single output DAC circuit 2000A. In this aspect, the single-output DAC circuit 2000A includes DAC stages 2002A(1)-2002(10), wherein the DAC stage 2002A(1) is a two (2)-bit resistor rotator circuit, while DAC stages 2002A(2)-2002A(9) are insertion type one (1)-bit resistor rotator circuits. The DAC stage 2002A(1) employs a decode circuit 2004A, inverters 2006A(1)-2006A(4), resistors 2008A(1)-2008A(3), and switches 2010A(1)-2010A(12). Additionally, each of the DAC stages 2002A(2)-2002A(9) employ an inverter 2012A(2)-2012A(9), a resistor 2014A(2)-2014A(9), switches 2016A(2)(1)-2016A(9)(6), and an adjustable resistor 2017(2)-2017(9) having respective resistances RADJ2-RADJ9. The DAC stage 2002A(10) includes a voltage divider 2018A employing resistors 2020A(1), 2020A(2), and configured to provide a DAC analog signal 2022A.

Figure 20C:
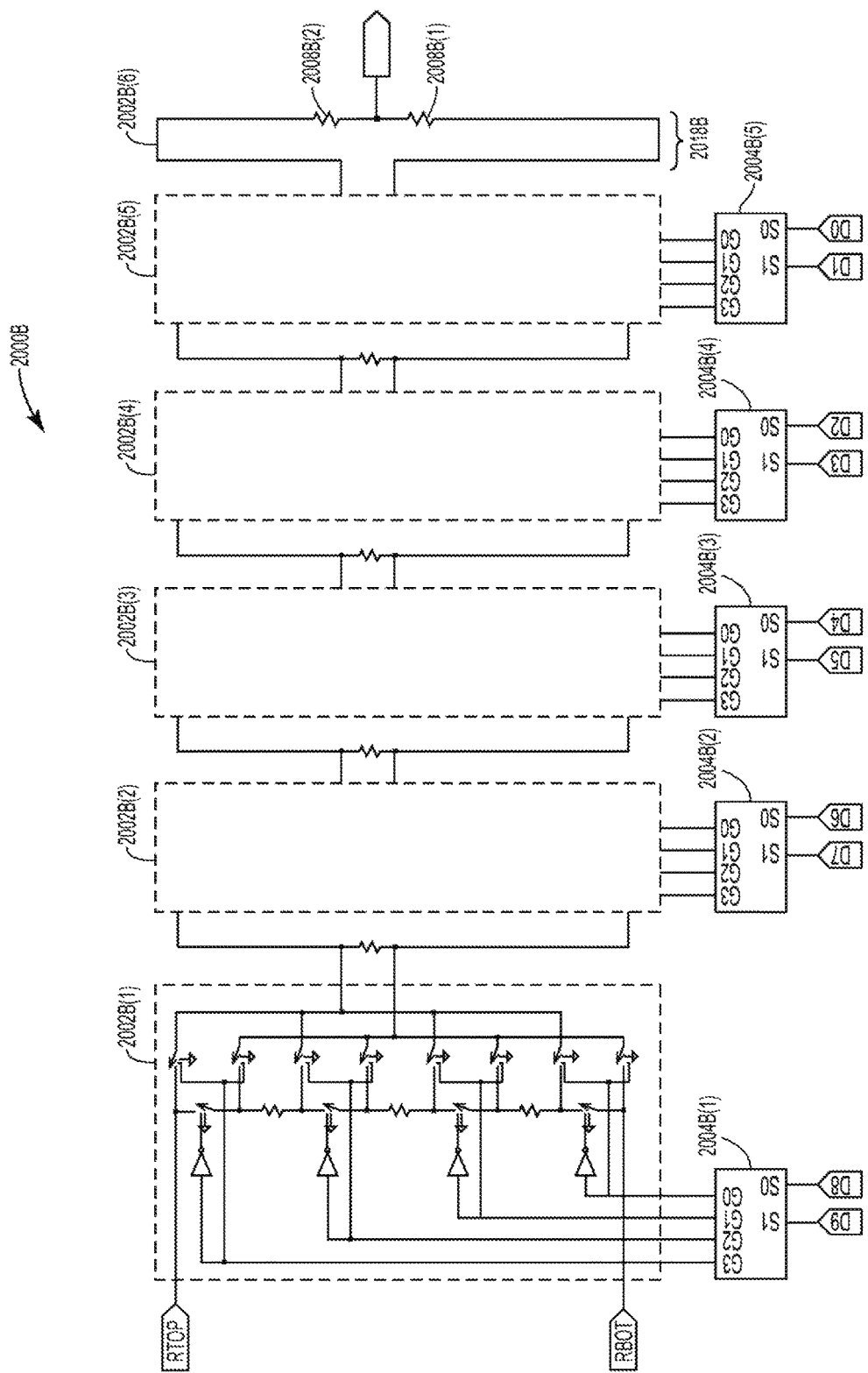
FIG. 20C is a circuit diagram of another exemplary single-output DAC circuit.
Figure 20D:
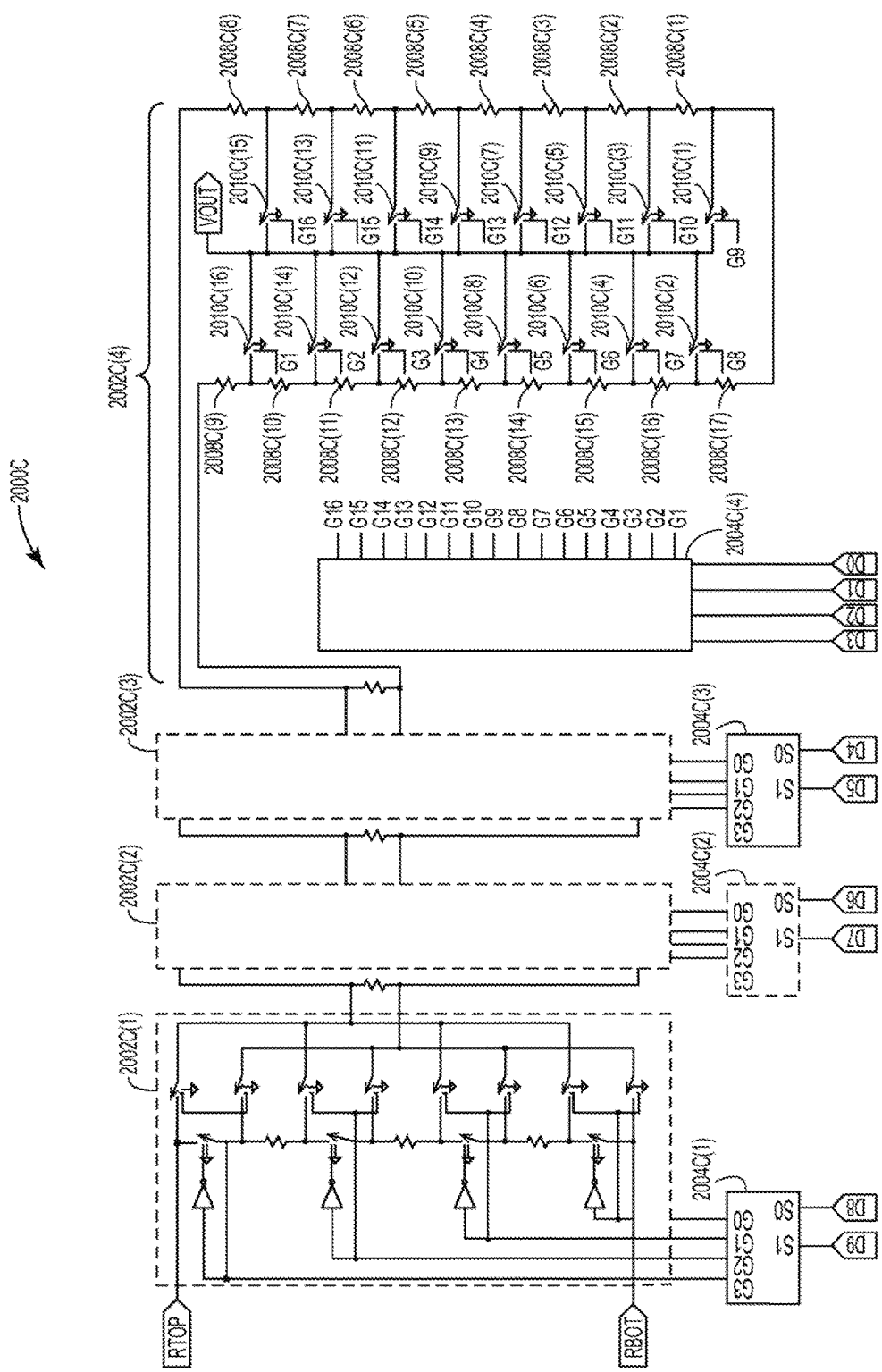
FIG. 20D is a circuit diagram of another exemplary single-output DAC circuit.

FIG. 20C illustrates another exemplary single-output DAC circuit 2000B, also referred to as a ten (10)-bit single output DAC circuit 2000B. In this aspect, the single-output DAC circuit 2000B includes DAC stages 2002B(1)-2002B(6), wherein each DAC stage 2002B(1)-2002B(6) is a two (2)-bit resistor rotator circuit similar to the aspect described with reference to FIGS. 20A and 20B, each of which includes a respective decode circuit 2004B(1)-2004B(5). The elements of the DAC stage 2002B(1) are similar to the elements of the DAC stage 2002A(1) of FIG. 20A, but are not renumbered herein for simplicity. The elements of DAC stages 2002B(2)-2002B(5) are not illustrated for additional simplicity. Additionally, the DAC stage 2002B(6) includes a voltage divider 2018B that employs resistors 2008B(1), 2008B(2). An alternative to the aspect of FIG. 20C is another exemplary single-output DAC circuit 2000C illustrated in FIG. 20D, also referred to as a ten (10)-bit single output DAC circuit 2000C. The single-output DAC circuit 2000C includes DAC stages 2002C(1)-2002C(3) and decode circuits 2004C(1)-2004C(3) that are the same as the DAC stages 2002B(1)-2002B(3) and decode circuits 2004B(1)-

2004B(3), respectively, of FIG. 20A. However, a DAC stage 2002C(4) replaces the DAC stages 2002B(4)-2002B(6), wherein the DAC stage 2002C(4) is a single four (4)-bit voltage divider that employs a decode circuit 2004C(4) configured to generate signals G1-G16, resistors 2008C(1)-2008C(17), and switches 2010C(1)-2010C(16). Some of the modularity, particularly of the DAC stages 2002B(1)-2002B (5) and the DAC stages 2002C(1)-2002C(3), provides designers with common, simplified layout options for employing the single-output DAC circuits 2000B, 2000C of FIGS. 20B, 20C.

Figure 21:
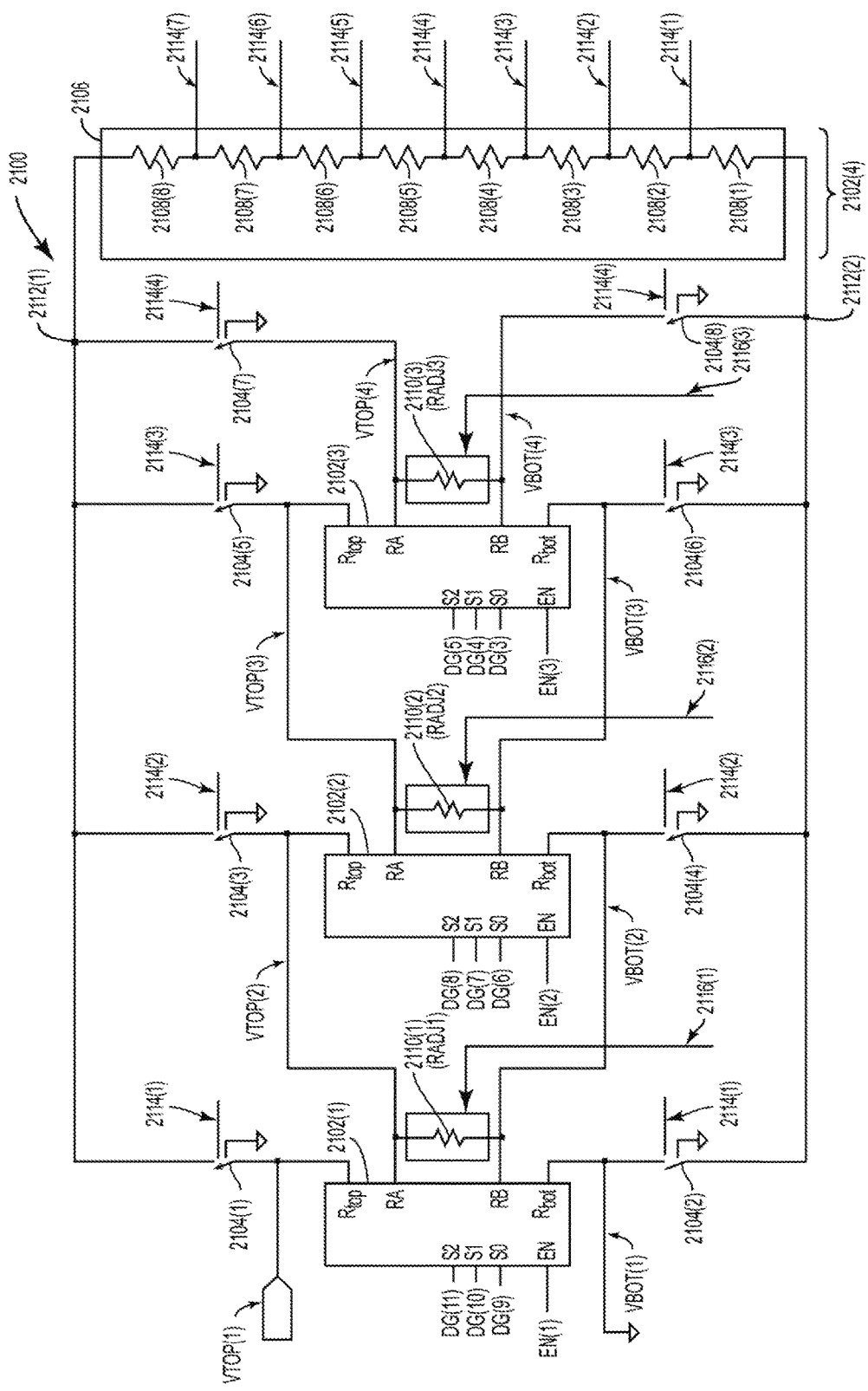
FIG. 21 is a circuit diagram of an exemplary multiple-output DAC circuit that can be employed in a SAR ADC circuit.

FIG. 21 illustrates an exemplary multiple-output DAC circuit 2100 that can be employed in a multiple-bit parallel SAR ADC circuit. The multiple-output DAC circuit 2100 employs DAC stages 2102(1)-2102(4), switches 2104(1)-2104(8), a divider circuit 2106 for the DAC stage 2102(4) that employs resistors 2108(1)-2108(8), and adjusting circuits 2110(1)-2110(3) corresponding to the DAC stages 2102(1)-2102(3). In particular, each adjusting circuit 2110 (1)-2110(3) has a resistance RADJ(1)-RADJ(3) configured to adjust the resistance of the corresponding DAC stage 2102(1)-2102(3) such that a parallel combination of the resistance of the adjusting circuit 2110(1)-2110(3) and a resistance of a next DAC stage 2102(2)-2102(4) is maintained at an ideal resistance level. Further, each DAC stage 2102(1)-2102(4) is configured to receive a corresponding top voltage VTOP(1)-VTOP(4), a corresponding bottom voltage VBOT(1)-VBOT(4), a corresponding enable signal EN(1)-EN(3), and three (3) corresponding digital bits DG(3)-DG(11). Each DAC stage 2102(1)-2102(4) is further configured to divide a voltage range of each corresponding top voltage VTOP(1)-VTOP(4) and each bottom voltage VBOT(1)-VBOT(4).

With continuing reference to FIG. 21, based on the values of the DAC select signals DG(11)-DG(3), some combination of the top and bottom voltages VTOP(1)-VTOP(4) and VBOT(1)-VBOT(4) are provided to an input node 2112(1), 2112(2) of the divider circuit 2106. In this aspect, the resistors 2108(1)-2108(8) each have an equal resistance (e.g., two (2) kilo-Ohms (kΩ)) such that the divider circuit 2106 generates DAC analog signals 2114(1)-2114(7) as equal divisions of the voltages provided to the divider circuit 2106 (e.g., divisions of the corresponding voltage range).

Figure 22A:
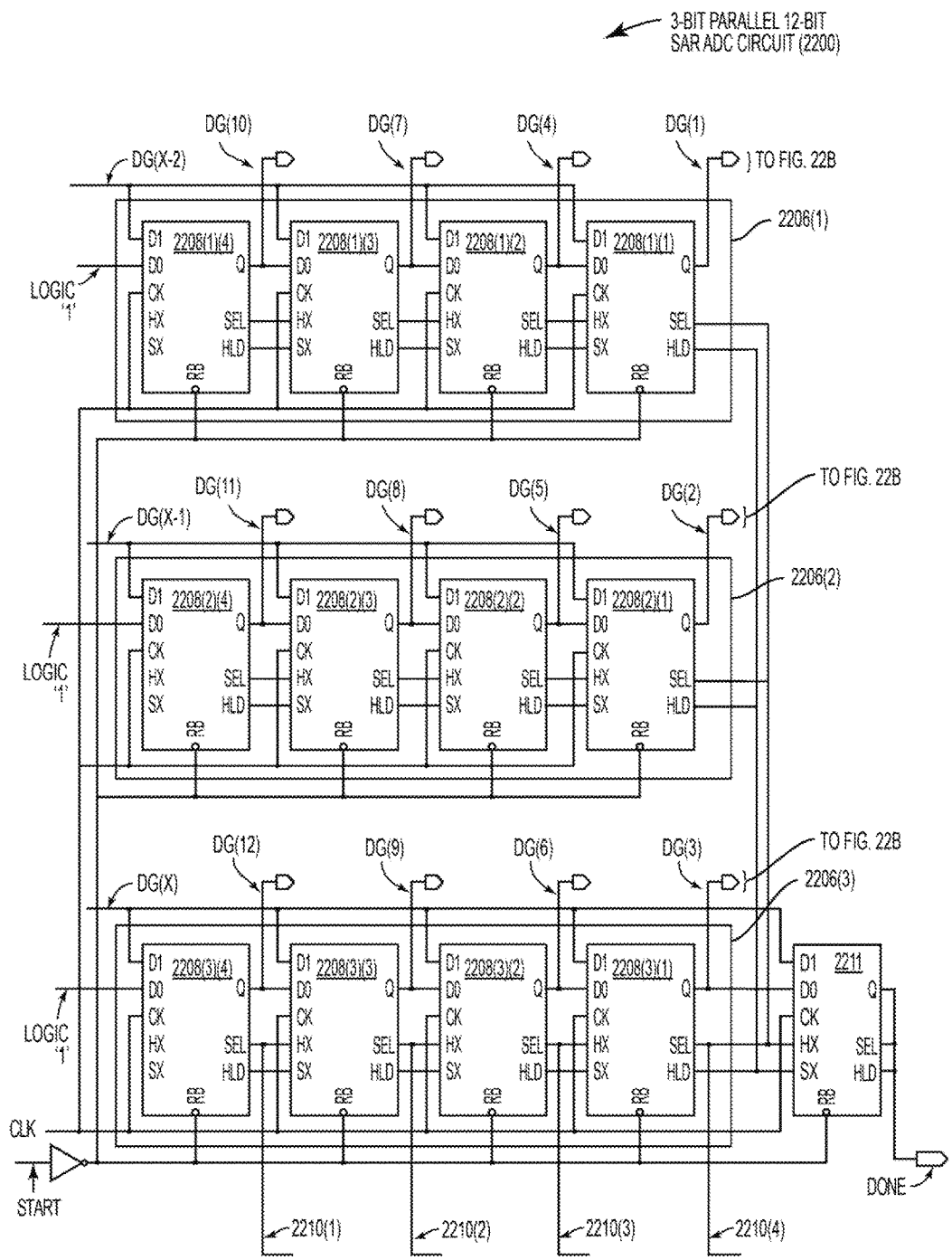
FIGS. 22A and 22B illustrate a circuit diagram of an exemplary multiple-bit parallel SAR ADC circuit that employs a multiple-output DAC circuit and a SA Flash-based compare circuit.
Figure 22B:
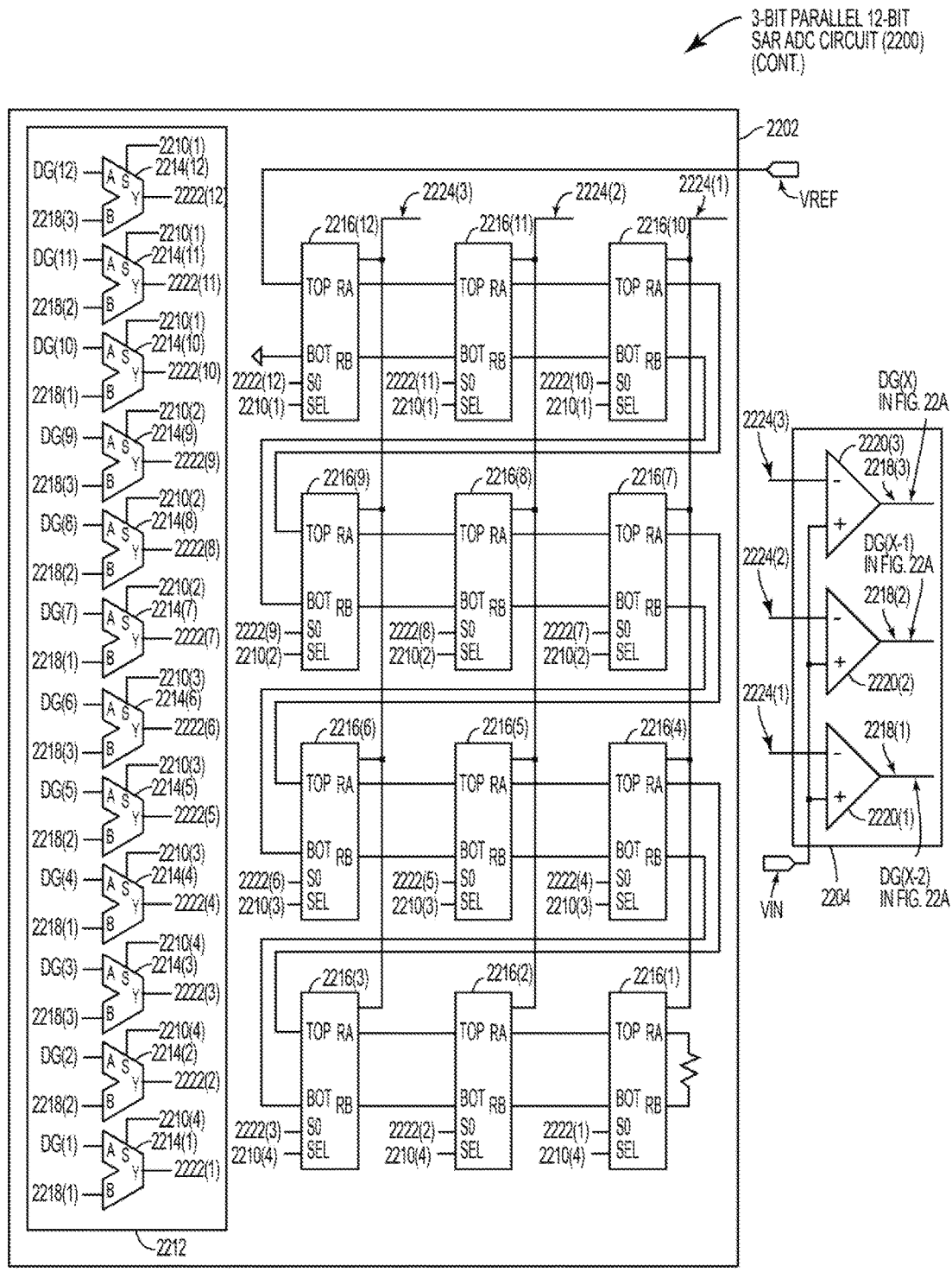

FIGS. 22A and 22B illustrate an exemplary three (3)-bit parallel twelve (12)-bit SAR ADC circuit 2200 that employs a multiple-output DAC circuit 2202 and a SA Flash-based compare circuit 2204. The three (3)-bit parallel twelve (12)-bit SAR ADC circuit 2200 is configured to receive a clock signal CLK, signals of a logic '1' (i.e., high) value, a start signal START, and a reference voltage VREF. The three (3)-bit parallel twelve (12)-bit SAR ADC circuit 2200 includes SAR controller circuits 2206(1)-2206(3), each of which includes four (4) SAR register circuits 2208(1)(1)-2208(3)(4). In this manner, the SAR register circuits 2208 (1)(1)-2208(1)(4) correspond to digital bits DG(1), DG(4), DG(7), and DG(10), the SAR register circuits 2208(2)(1)-2208(2)(4) correspond to digital bits DG(2), DG(5), DG(8), and DG(11), and the SAR register circuits 2208(3)(1)-2208 (3)(4) correspond to digital bits DG(3), DG(6), DG(9), and DG(12). An SAR register circuit 2211 is also included, and is configured to generate a done signal DONE.

With continuing reference to FIGS. 22A and 22B, the multiple-output DAC circuit 2202 includes a selection circuit 2212 employing multiplexer circuits 2214(1)-2214(12) which process digital signals. The multiple-output DAC circuit 2202 also includes DAC stages 2216(1)-2216(12). In this manner, a number of the multiplexer circuits 2214(1)-2214(12) and a number of the DAC stages 2216(1)-2216(12) is equal to the number of digital bits DG(1)-DG(12) in the digital output signal DOUT (not shown). Further, each multiplexer circuit 2214(1)-2214(12) is configured to receive the corresponding digital bit DG(1)-DG(12). The multiplexer circuits 2214(1), 2214(4), 2214(7), and 2214 (10) are configured to also receive a comparator signal 2218(1) from a compare circuit 2220(1), and the multiplexer circuits 2214(2), 2214(5), 2214(8), and 2214(11) are configured to also receive a comparator signal 2218(2) from a compare circuit 2220(2). The multiplexer circuits 2214(3), 2214(6), 2214(9), and 2214(12) are configured to also receive a comparator signal 2218(3) from a compare circuit 2220(3). The multiplexer circuits 2214(1)-2214(3) are configured to receive the DAC select signal 2210(4), and the multiplexer circuits 2214(4)-2214(6) are configured to receive the DAC select signal 2210(3). The multiplexer circuits 2214(7)-2214(9) are configured to receive the DAC select signal 2210(2), and the multiplexer circuits 2214(10)-2214(12) are configured to receive the DAC select signal 2210(1). The DAC select signals 2210(1)-2210(4) select between the input values of the respective multiplexer circuit 2214(1)-2214(12) such that the multiplexer circuits 2214(1)-2214(12) provide a corresponding resistor select signal 2222(1)-2222(12).

With continuing reference to FIGS. 22A and 22B, and with specific reference to FIG. 22B, the DAC stages 2216 (1)-2216(12) are configured to receive the corresponding resistor select signals 2222(1)-2222(12) on a respective input node S0. Further, the DAC stages 2216(1)-2216(3) are configured to the receive the DAC select signal 2210(4), and the DAC stages 2216(4)-2216(6) are configured to receive the DAC select signal 2210(3) on a respective select input node SEL. The DAC stages 2216(7)-2216(9) are configured to receive the DAC select signal 2210(2), and the DAC stages 2216(10)-2216(12) are configured to receive the DAC select signal 2210(1) on a respective select input node SEL. As discussed in more detail with reference to FIG. 23, each DAC stage 2216(1)-2216(12) is configured to receive top and bottom voltages VTOP, VBOT on respective top and bottom input nodes TOP, BOT, and provided respective output voltage VTO, VBO on respective voltage output nodes RA, RB. As a result, the DAC stages 2216(1), 2216(4), 2216(7), and 2216(10) provide a DAC analog signal 2224(1), the DAC stages 2216(2), 2216(5), 2216(8), and 2216(11) provide a DAC analog signal 2224(2), and the DAC stages 2216(3), 2216(6), 2216(9), and 2216(12) provide a DAC analog signal 2224(3). Further, the DAC analog signals 2224(1)-2224(3) are provided to corresponding compare circuits 2220(1)-2220(3), wherein the compare circuits 2220(1)-2220(3) also receive the analog input signal VIN. It is important to note that the SA Flash-based compare circuit 2204 includes a number of the compare circuits 2220(1)-2220(3) equal to the number of SAR controller circuits 2206(1)-2206(3).

With continuing reference to FIGS. 22A and 22B, each compare circuit 2220(1)-2220(3) is configured to generate the corresponding comparator signal 2218(1)-2218(3), wherein each comparator signal 2218(1)-2218(3) is a corresponding digital bit DG(1)-DG(12) for the corresponding cycle of the clock signal CLK. In particular, each comparator signal 2218(1)-2218(3) has a logic high "1" value if the analog input signal VIN has a greater voltage than the corresponding DAC analog signal 2224(1)-2224(3). Alternatively, each comparator signal 2218(1)-2218(3) has a logic low "0" value if the analog input signal VIN has a smaller voltage than the corresponding DAC analog signal 2224(1)-2224(3).

Figure 23:
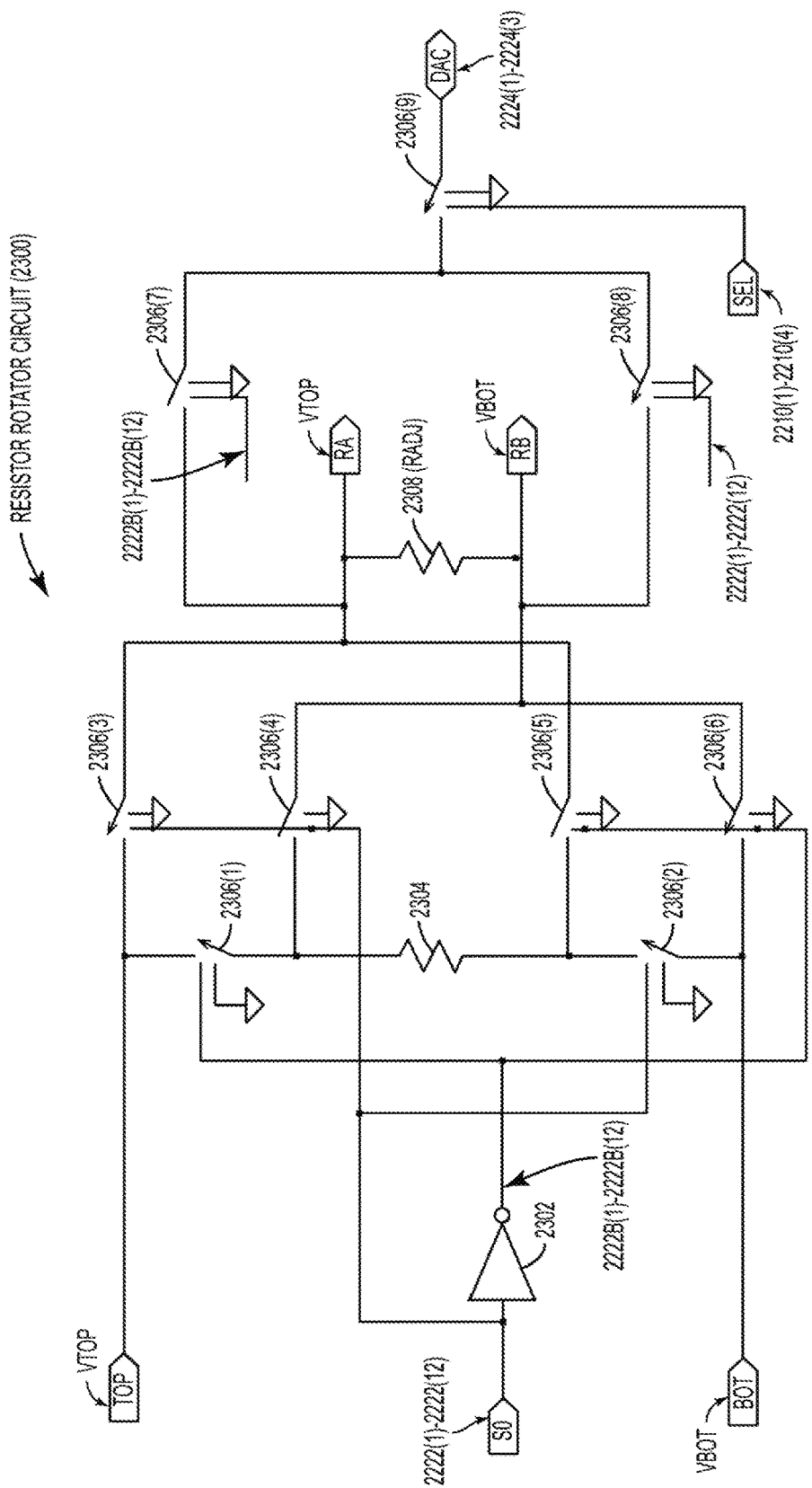
FIG. 23 is a circuit diagram of an exemplary resistor rotator circuit that can be employed for each DAC stage of the multiple-output DAC circuit of FIGS. 22A and 22B.

FIG. 23 is a circuit diagram of an exemplary resistor rotator circuit 2300 that can be employed for each DAC stage 2216(1)-2216(12) of the multiple-output DAC circuit 2202 of FIGS. 22A and 22B. In this aspect, the resistor rotator circuit 2300 is configured to receive a top voltage VTOP on a top voltage input node TOP, and a bottom voltage VBOT on a bottom voltage input node BOT. Additionally, the resistor rotator circuit 2300 is configured to receive the corresponding resistor select signal 2222(1)-2222(12) on an input node S0, and the corresponding DAC select signal 2210(1)-2210(4) on a select input node SEL. In this manner, using an inverter 2302, a resistor 2304, switches 2306(1)-2306(9), and a resistor 2308 having a resistance RADJ, the corresponding DAC select signal 2210(1)-2210(4) and resistor select signal 2222(1)-2222(12) cause the resistor rotator circuit 2300 to provide the corresponding top and bottom voltages VTOP, VBOT on the output nodes RA, RB, respectively. Additionally, the corresponding DAC analog signals 2224(1)-2224(3) as illustrated in FIGS. 22A and 22B are provided via an output node DAC.

Figure 24:
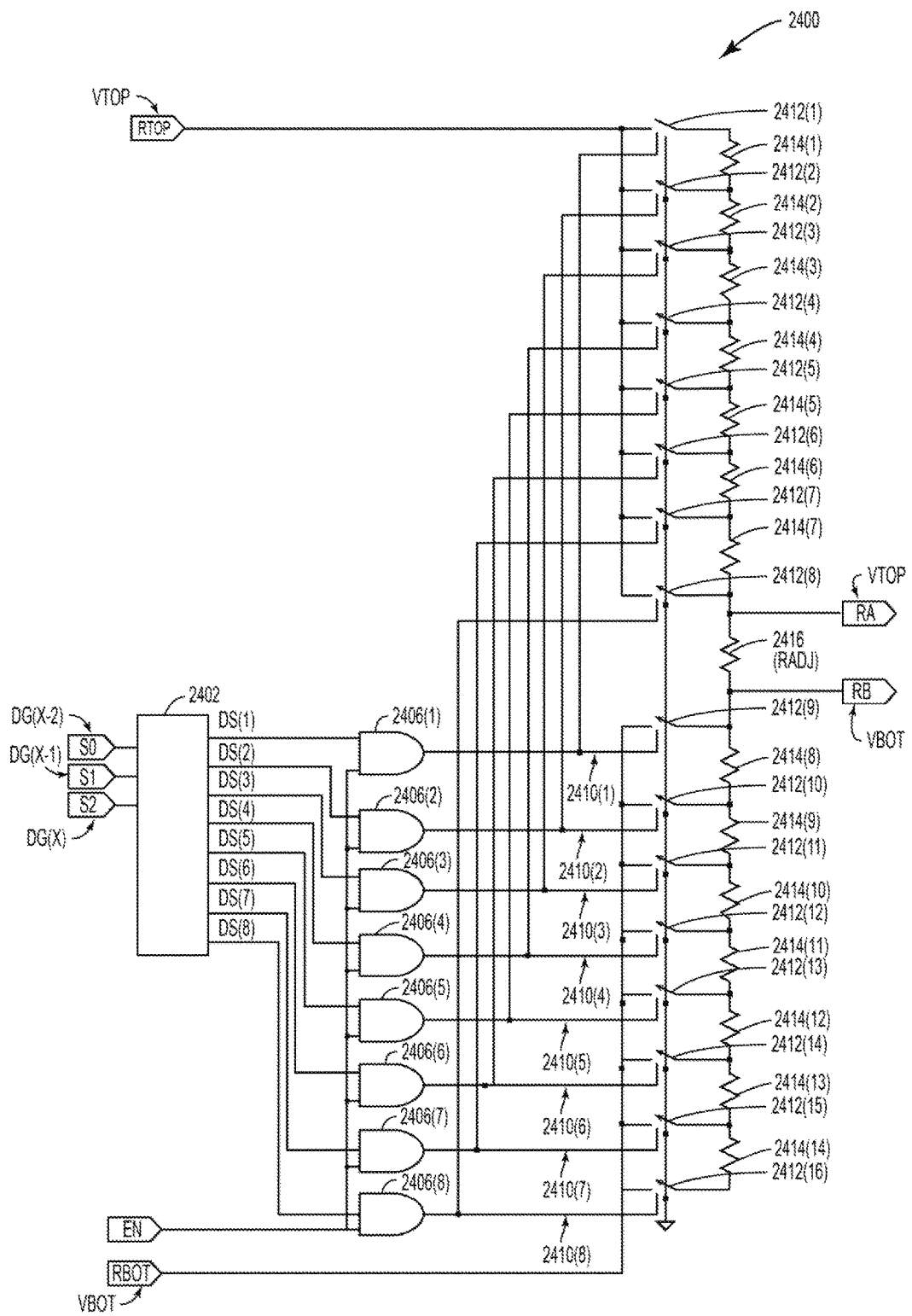
FIG. 24 is a circuit diagram of another exemplary resistor rotator circuit employing a "shorting" approach that may be employed in each DAC stage of a multiple-output DAC circuit.

FIG. 24 is a circuit diagram of another exemplary resistor rotator circuit 2400 employing a "shorting" approach that may be employed in each DAC stage of a multiple-output DAC circuit. The resistor rotator circuit 2400 is configured to receive a top voltage VTOP on a top voltage input node TOP, and a bottom voltage VBOT on a bottom voltage input node BOT. The resistor rotator circuit 2400 also includes a decoder circuit 2402 configured to receive digital bits DG(1)-DG(3) on input nodes S0, S1, S2, and generate decode signals DS(1)-DS(8) based on the digital bits DG(1)-DG(3). Each decode signal DS(1)-DS(8) is provided to a corresponding AND gate 2406(1)-2406(8). Each AND gate 2406(1)-2406(8) also receives one of an enable signal 2408 via an enable input node EN, and generates a corresponding resistor select signal 2410(1)-2410(8).

With continuing reference to FIG. 24, the resistor rotator circuit 2400 also includes switches 2412(1)-2412(16), wherein a logic high "1" value closes a switch 2412(1)-2412(16), and a logic low "0" value opens a switch 2412(1)-2412(16). The switches 2412(1)-2412(16) are used in conjunction with resistors 2414(1)-2414(14) to generate the top and bottom output voltages VTO, VBO on respective voltage output nodes RA, RB. An adjusting circuit 2416 having a resistance RADJ is also included. In this manner, the configuration above results in the resistor rotator circuit 2400 generating the corresponding top and bottom output voltages VTO, VBO according to which of the switches 2412(1)-2412(16) are open or closed based on the digital bits DG(1)-DG(3).

The DAC circuits employing resistor rotator circuits configured to be included in ADC circuits according to aspects disclosed herein may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 25:
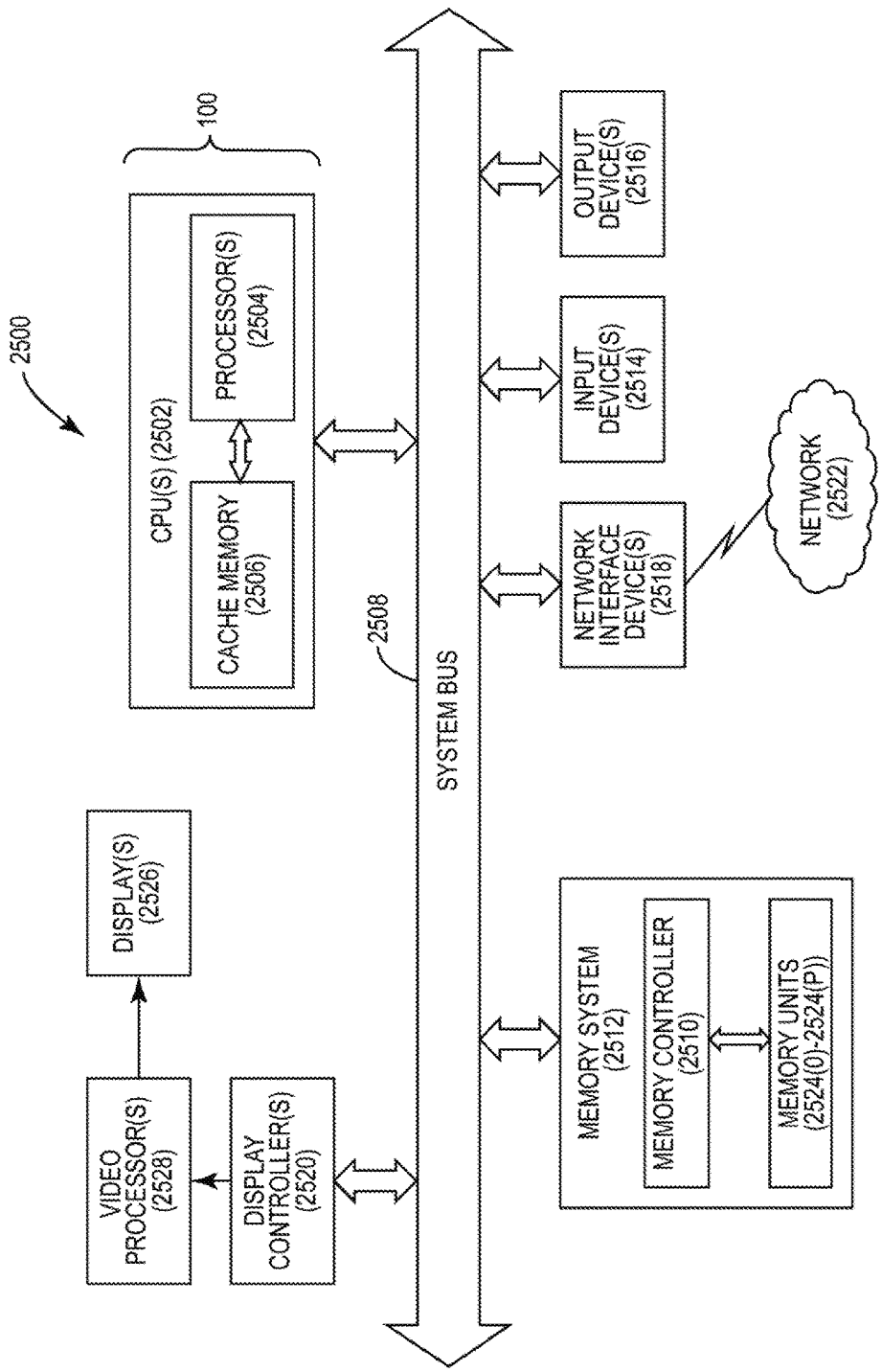
FIG. 25 is a block diagram of an exemplary processor-based system that can include elements that employ the DAC circuit of FIG. 1.

In this regard, FIG. 25 illustrates an example of a processor-based system 2500 that can employ elements that include the DAC circuit 100 illustrated in FIG. 1, as well as aspects illustrated in FIGS. 2, 4-10, and 12-24. In this example, the processor-based system 2500 includes one or more central processing units (CPUs) 2502, each including one or more processors 2504. The CPU(s) 2502 may have cache memory 2506 coupled to the processor(s) 2504 for rapid access to temporarily stored data. The CPU(s) 2502 is coupled to a system bus 2508 and can intercouple master and slave devices included in the processor-based system 2500. As is well known, the CPU(s) 2502 communicates with these other devices by exchanging address, control, and data information over the system bus 2508. For example, the CPU(s) 2502 can communicate bus transaction requests to a memory controller 2510 as an example of a slave device. Although not illustrated in FIG. 25, multiple system buses 2508 could be provided, wherein each system bus 2508 constitutes a different fabric.

Other master and slave devices can be connected to the system bus 2508. As illustrated in FIG. 25, these devices can include a memory system 2512, one or more input devices 2514, one or more output devices 2516, one or more network interface devices 2518, and one or more display controllers 2520, as examples. The input device(s) 2514 can include any type of input device, including, but not limited to, input keys, switches, voice processors, etc. The output device(s) 2516 can include any type of output device, including, but not limited to, audio, video, other visual indicators, etc. The network interface device(s) 2518 can be any device configured to allow exchange of data to and from a network 2522. The network 2522 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 2518 can be configured to support any type of communications protocol desired. The memory system 2512 can include one or more memory units 2524(0)-2524(P).

The CPU(s) 2502 may also be configured to access the display controller(s) 2520 over the system bus 2508 to control information sent to one or more displays 2526. The display controller(s) 2520 sends information to the display(s) 2526 to be displayed via one or more video processors 2528, which process the information to be displayed into a format suitable for the display(s) 2526. The display(s) 2526 can include any type of display, including, but not limited to, a cathode ray tube (CRT), a liquid crystal display (LCD), a plasma display, a light emitting diode (LED) display, etc.

Figure 26:
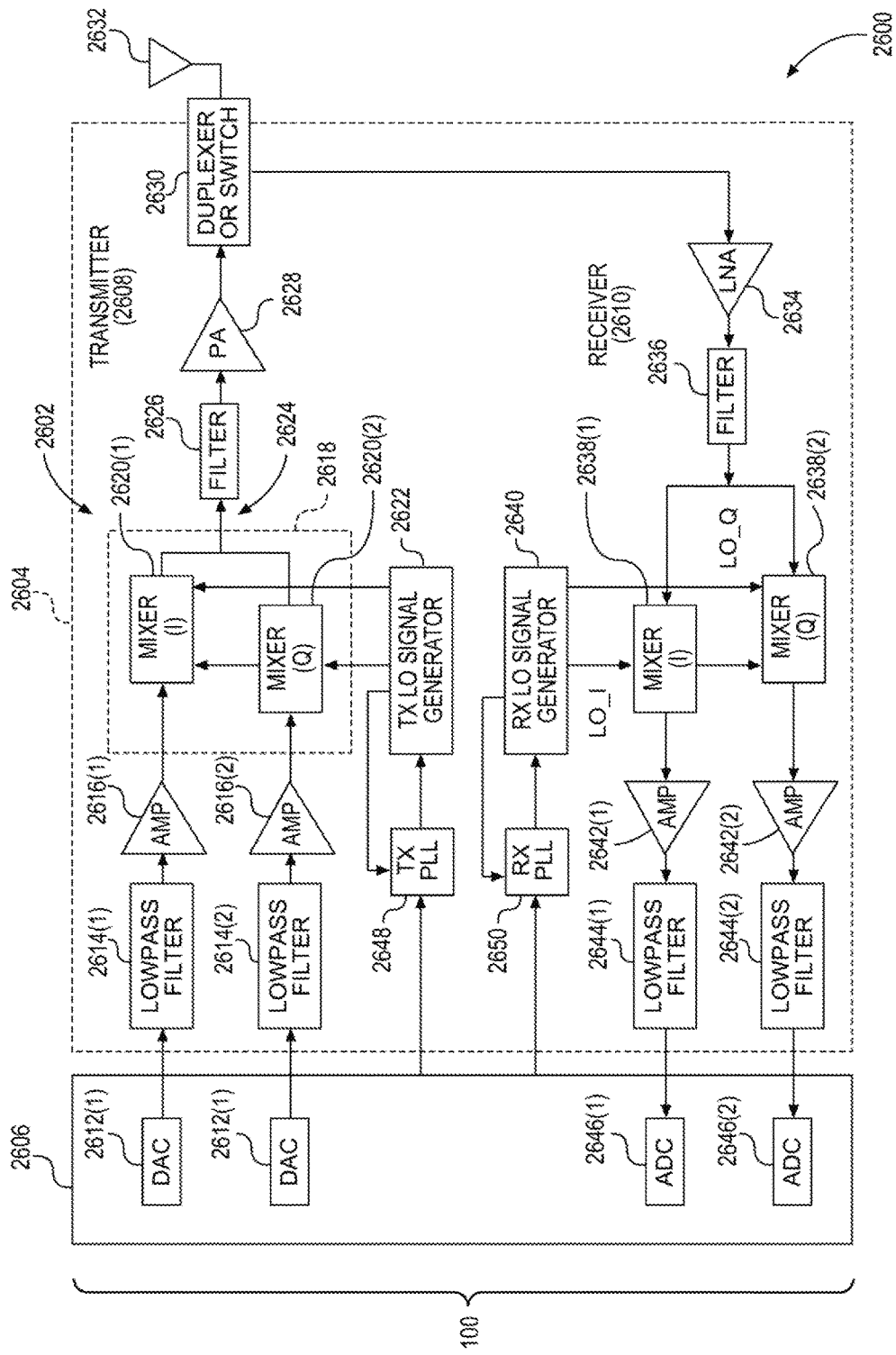
FIG. 26 is a block diagram of an exemplary wireless communications device that includes radio frequency (RF) components formed in an integrated circuit (IC), wherein the RF components can include elements employing the DAC circuit of FIG. 1.

FIG. 26 illustrates an exemplary wireless communications device 2600 that includes radio frequency (RF) components formed in an integrated circuit (IC) 2602, wherein the RF components can include elements employing the DAC circuit 100 of FIG. 1, as well as the aspects in FIGS. 2, 4-10, and 12-24. In this regard, the wireless communications device 2600 may be provided in the IC 2602. The wireless communications device 2600 may include or be provided in any of the above referenced devices, as examples. As shown in FIG. 26, the wireless communications device 2600 includes a transceiver 2604 and a data processor 2606. The data processor 2606 may include a memory to store data and program codes. The transceiver 2604 includes a transmitter

2608 and a receiver 2610 that support bi-directional communications. In general, the wireless communications device 2600 may include any number of transmitters 2608 and/or receivers 2610 for any number of communication systems and frequency bands. All or a portion of the transceiver 2604 may be implemented on one or more analog ICs, RF ICs (RFICs), mixed-signal ICs, etc.

The transmitter 2608 or the receiver 2610 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for the receiver 2610. In the direct-conversion architecture, a signal is frequency-converted between RF and baseband in one stage. The super-heterodyne and direct-conversion architectures may use different circuit blocks and/or have different requirements. In the wireless communications device 2600 in FIG. 26, the transmitter 2608 and the receiver 2610 are implemented with the direct-conversion architecture.

In the transmit path, the data processor 2606 processes data to be transmitted and provides I and Q analog output signals to the transmitter 2608. In the exemplary wireless communications device 2600, the data processor 2606 includes digital-to-analog converters (DACs) 2612(1), 2612(2) for converting digital signals generated by the data processor 2606 into the I and Q analog output signals, e.g., I and Q output currents, for further processing.

Within the transmitter 2608, lowpass filters 2614(1), 2614(2) filter the I and Q analog output signals, respectively, to remove undesired signals caused by the prior digital-to-analog conversion. Amplifiers (AMP) 2616(1), 2616(2) amplify the signals from the lowpass filters 2614(1), 2614(2), respectively, and provide I and Q baseband signals. An upconverter 2618 upconverts the I and Q baseband signals with I and Q transmit (TX) local oscillator (LO) signals through mixers 2620(1), 2620(2) from a TX LO signal generator 2622 to provide an upconverted signal 2624. A filter 2626 filters the upconverted signal 2624 to remove undesired signals caused by the frequency upconversion as well as noise in a receive frequency band. A power amplifier (PA) 2628 amplifies the upconverted signal 2624 from the filter 2626 to obtain the desired output power level and provides a transmit RF signal. The transmit RF signal is routed through a duplexer or switch 2630 and transmitted via an antenna 2632.

In the receive path, the antenna 2632 receives signals transmitted by base stations and provides a received RF signal, which is routed through the duplexer or switch 2630 and provided to a low noise amplifier (LNA) 2634. The duplexer or switch 2630 is designed to operate with a specific receive (LX)-to-TX duplexer frequency separation, such that RX signals are isolated from TX signals. The received RF signal is amplified by the LNA 2634 and filtered by a filter 2636 to obtain a desired RF input signal. Downconversion mixers 2638(1), 2638(2) mix the output of the filter 2636 with I and Q RX LO signals (i.e., LO_I and LO_Q) from an RX LO signal generator 2640 to generate I and Q baseband signals. The I and Q baseband signals are amplified by amplifiers (AMP) 2642(1), 2642(2) and further filtered by lowpass filters 2644(1), 2644(2) to obtain I and Q analog input signals, which are provided to the data processor 2606. In this example, the data processor 2606 includes ADCs 2646(1), 2646(2) for converting the analog input signals into digital signals to be further processed by the data processor 2606.

In the wireless communications device 2600 of FIG. 26, the TX LO signal generator 2622 generates the I and Q TX LO signals used for frequency upconversion, while the RX LO signal generator 2640 generates the I and Q RX LO signals used for frequency downconversion. Each LO signal is a periodic signal with a particular fundamental frequency. A TX phase-locked loop (PLL) circuit 2648 receives timing information from the data processor 2606 and generates a control signal used to adjust the frequency and/or phase of the TX LO signals from the TX LO signal generator 2622. Similarly, an RX PLL circuit 2650 receives timing information from the data processor 2606 and generates a control signal used to adjust the frequency and/or phase of the RX LO signals from the RX LO signal generator 2640.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A multiple-bit parallel successive approximation register (SAR) analog-to-digital converter (ADC) circuit, comprising:
    a plurality of SAR controller circuits, wherein each SAR controller circuit of the plurality of SAR controller circuits comprises a number of SAR register circuits, wherein each SAR register circuit is configured to:
        receive a clock signal;
        in response to a corresponding cycle of the clock signal, provide a digital signal; and
        in response to a corresponding next cycle of the clock signal:
            receive a corresponding digital bit, wherein the digital bit is based on a comparison of an analog input signal and a corresponding digital-to-analog converter (DAC) analog signal;
            store the digital bit; and
            provide the digital signal correlating to the digital bit;
    a multiple-output DAC circuit comprising a plurality of DAC stages, wherein:
        each DAC stage of the plurality of DAC stages is configured to:
            receive a corresponding top voltage and a corresponding bottom voltage, wherein a voltage range of the corresponding top voltage and the corresponding bottom voltage is based on a reference voltage; and
            generate a number of DAC analog signals based on the corresponding top voltage, the corresponding bottom voltage, and a resistance of the DAC stage; and
        each DAC stage of the plurality of DAC stages comprises an adjusting circuit comprising a resistance configured to adjust the resistance of the corresponding DAC stage such that a parallel combination of the resistance of the adjusting circuit and a resistance of a next DAC stage is maintained at an ideal resistance level; and
    a compare circuit configured to:
        receive the number of DAC analog signals;
        receive the analog input signal; and
        generate the digital bit corresponding to each SAR controller circuit of the plurality of SAR controller circuits based on a comparison of each DAC analog signal to the analog input signal, wherein each digital bit generated collectively forms a digital output signal that is a digital representation of the analog input signal.

2. The multiple-bit parallel SAR ADC circuit of claim 1, wherein the multiple-output DAC circuit comprises a multiple-output DAC circuit configured to:
    receive the top voltage and the bottom voltage, wherein the voltage range of the top voltage and the bottom voltage is based on the reference voltage; and
    generate the number of DAC analog signals based on the top voltage and the bottom voltage.

3. The multiple-bit parallel SAR ADC circuit of claim 2, wherein each DAC analog signal of the number of DAC analog signals has a value that is a division of the voltage range.

4. The multiple-bit parallel SAR ADC circuit of claim 2, wherein the multiple-output DAC circuit comprises a plurality of resistor rotator circuits configured to generate the number of DAC analog signals by generating multiple divisions of the voltage range.

5. The multiple-bit parallel SAR ADC circuit of claim 2, wherein the compare circuit comprises:
    a number of compare circuits, the number of compare circuits equal to two (2) raised to a number of the plurality of SAR controller circuits, quantity minus one (1), wherein each compare circuit is configured to:
        receive the analog input signal and the corresponding DAC analog signal; and
        generate a comparator signal, wherein:
            the comparator signal has a logic high value if the analog input signal has a greater voltage than the corresponding DAC analog signal; and
            the comparator signal has a logic low value if the analog input signal has a smaller voltage than the corresponding DAC analog signal; and
    a thermometer-to-binary (TTB) circuit, configured to:
        receive the comparator signal from each compare circuit; and
        generate the digital bit corresponding to each SAR controller circuit based on the comparator signal from each compare circuit.

6. The multiple-bit parallel SAR ADC circuit of claim 2, wherein the compare circuit comprises a number of compare circuits, the number of compare circuits equal to a number of the plurality of SAR controller circuits, wherein each compare circuit is configured to:
    receive the analog input signal and the corresponding DAC analog signal; and
    generate a comparator signal, wherein:
        the comparator signal is the corresponding digital bit;
        the comparator signal has a logic high value if the analog input signal has a greater voltage than the corresponding DAC analog signal; and
        the comparator signal has a logic low value if the analog input signal has a smaller voltage than the corresponding DAC analog signal.

7. The multiple-bit parallel SAR ADC circuit of claim 1 integrated into an integrated circuit (IC).

8. The multiple-bit parallel SAR ADC circuit of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

9. A method for converting an analog input signal into a digital output signal, wherein multiple digital bits of the digital output signal are generated in parallel, comprising:
  receiving a reference voltage;
  receiving a clock signal;
  in response to a corresponding cycle of the clock signal, providing a digital signal;
  in response to a corresponding next cycle of the clock signal, receiving a corresponding digital bit, wherein the digital bit is based on a comparison of the analog input signal and a corresponding digital-to-analog converter (DAC) analog signal;
  in response to the corresponding next cycle of the clock signal, storing the digital bit;
  in response to the corresponding next cycle of the clock signal, providing the digital signal correlating to the digital bit;
  receiving a corresponding top voltage and a corresponding bottom voltage, wherein a voltage range of the corresponding top voltage and the corresponding bottom voltage is based on the reference voltage;
  generating a number of DAC analog signals based on the corresponding top voltage, the corresponding bottom voltage, and a resistance of a DAC stage, wherein the number of DAC analog signals is equal to a number of digital signals;
  adjusting the resistance of the corresponding DAC stage such that a parallel combination of the resistance of the adjusting circuit and a resistance of a next DAC stage is maintained at an ideal resistance level; and
  generating the corresponding digital bit based on a comparison of each corresponding DAC analog signal to the analog input signal, wherein each digital bit generated collectively forms the digital output signal that is a digital representation of the analog input signal.

10. The method of claim 9, further comprising:
  receiving the top voltage and the bottom voltage, wherein the voltage range of the top voltage and the bottom voltage is based on the reference voltage; and
  generating the number of DAC analog signals based on the top voltage and the bottom voltage.

11. The method of claim 10, further comprising generating the corresponding number of DAC analog signals by generating divisions of the voltage range.

12. A multiple-bit parallel successive approximation (SA) Flash analog-to-digital converter (ADC) circuit, comprising:
  a multiple-output digital-to-analog converter (DAC) circuit comprising a plurality of DAC stages, wherein:
    each DAC stage of the plurality of DAC stages corresponds to a parallel comparator stage of a plurality of parallel comparator stages;
    each DAC stage of the plurality of DAC stages is configured to:
      receive a corresponding top voltage and a corresponding bottom voltage, wherein a voltage range of the corresponding top voltage and the corresponding bottom voltage is based on a reference voltage; and
      generate a number of DAC analog signals based on the corresponding top voltage, the corresponding bottom voltage, and a resistance of the DAC stage, wherein the number of DAC analog signals is equal to a number of comparator circuits in each corresponding parallel comparator stage; and
    each DAC stage of the plurality of DAC stages comprises an adjusting circuit comprising a resistance configured to adjust the resistance of the corresponding DAC stage such that a parallel combination of the resistance of the adjusting circuit and a resistance of a next DAC stage is maintained at an ideal resistance level;
  a system compare circuit comprising the plurality of parallel comparator stages, wherein each parallel comparator stage of the plurality of parallel comparator stages comprises:
    a number of comparator circuits, wherein:
      the number of comparator circuits of each parallel comparator stage is equal to two (2) raised to a number of digital bits of the corresponding parallel comparator stage, quantity minus one (1); and
      each comparator circuit is configured to:
        receive an analog input signal;
        receive a corresponding DAC analog signal; and
        generate a digital signal, wherein:
          the digital signal has a logic high value if the analog input signal has a greater voltage than the corresponding DAC analog signal; and
          the digital signal has a logic low value if the analog input signal has a smaller voltage than the corresponding DAC analog signal; and
  the system compare circuit configured to generate one or more digital bits corresponding to each parallel comparator stage based on each corresponding digital signal, wherein the one or more digital bits collectively form a digital output signal that is a digital representation of the analog input signal.

13. The multiple-bit parallel SA Flash ADC circuit of claim 12, wherein the multiple-output DAC circuit comprises a multiple-output DAC circuit comprising the plurality of DAC stages, wherein:
  each DAC stage of the plurality of DAC stages corresponds to the parallel comparator stage of the plurality of parallel comparator stages; and
  each DAC stage of the plurality of DAC stages is configured to:
    receive the corresponding top voltage and the corresponding bottom voltage, wherein the voltage range of the corresponding top voltage and the corresponding bottom voltage is based on the reference voltage; and
    generate the number of DAC analog signals based on the corresponding top voltage and the corresponding bottom voltage, wherein the number of DAC analog signals is equal to the number of comparator circuits in each corresponding parallel comparator stage.

14. The multiple-bit parallel SA Flash ADC circuit of claim 13, wherein the system compare circuit further comprises a thermometer-to-binary (TTB) circuit, configured to:
- receive the digital signals from the number of comparator circuits of each parallel comparator stage of the plurality of parallel comparator stages; and
- generate the one or more digital bits corresponding to each parallel comparator stage, wherein the one or more digital bits collectively form the digital output signal that is the digital representation of the analog input signal.

15. The multiple-bit parallel SA Flash ADC circuit of claim 13, wherein the number of DAC analog signals generated by each DAC stage of the plurality of DAC stages has a value that is a division of the voltage range.

16. The multiple-bit parallel SA Flash ADC circuit of claim 13, wherein each DAC stage of the plurality of DAC stages comprises a resistor rotator circuit configured to generate the corresponding number of DAC analog signals by generating divisions of the voltage range.

17. The multiple-bit parallel SA Flash ADC circuit of claim 16, wherein the resistor rotator circuit of each DAC stage comprises:
- a top voltage input node configured to receive the corresponding top voltage;
- a bottom voltage input node configured to receive the corresponding bottom voltage;
- a decoder circuit configured to:
  - receive the one or more digital bits of the corresponding parallel comparator stage; and
  - generate a number of decode signals based on the one or more digital bits, wherein the number of decode signals is equal to two (2) raised to a number of the one or more digital bits;
- a plurality of inverters, wherein each inverter is configured to:
  - receive a corresponding decode signal; and
  - generate a corresponding inverse decode signal;
- a plurality of switches, wherein:
  - a number of switches are configured to receive the corresponding inverse decode signal; and
  - the number of switches are configured to receive the corresponding decode signal; and
- a plurality of resistors serially connected alternatingly with the number of switches configured to receive the corresponding inverse decode signal, wherein the plurality of resistors are arranged such that the plurality of resistors divide the voltage range into the number of DAC analog signals and into the top voltage and the bottom voltage to be provided to a next DAC stage.

18. The multiple-bit parallel SA Flash ADC circuit of claim 12 integrated into an integrated circuit (IC).

19. The multiple-bit parallel SA Flash ADC circuit of claim 12 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

20. A method for converting an analog input signal into a digital output signal, wherein multiple digital bits of the digital output signal are determined in parallel, comprising:
- receiving a reference voltage;
- receiving a corresponding top voltage and a corresponding bottom voltage, wherein a voltage range of the corresponding top voltage and the corresponding bottom voltage is based on the reference voltage;
- generating a number of digital-to-analog converter (DAC) analog signals based on the corresponding top voltage, the corresponding bottom voltage, wherein the number of DAC analog signals is equal to a number of digital signals;
- adjusting the resistance of the corresponding DAC stage such that a parallel combination of a resistance of an adjusting circuit and a resistance of a next DAC stage is maintained at an ideal resistance level;
- receiving the analog input signal;
- generating one or more digital signals in a plurality of parallel comparator stages, wherein:
  - each digital signal is generated by comparing the analog input signal to a corresponding DAC analog signal;
  - each digital signal has a logic high value if the analog input signal has a greater voltage than the corresponding DAC analog signal; and
  - each digital signal has a logic low value if the analog input signal has a smaller voltage than the corresponding DAC analog signal; and
- generating one or more digital bits corresponding to each parallel comparator stage based on the one or more digital signals of a corresponding parallel comparator stage among the plurality of parallel comparator stages, wherein the one or more digital bits collectively form the digital output signal that is a digital representation of the analog input signal.

21. The method of claim 20, further comprising:
- receiving the corresponding top voltage and the corresponding bottom voltage, wherein the voltage range of the corresponding top voltage and the corresponding bottom voltage is based on the reference voltage; and
- generating the number of DAC analog signals based on the corresponding top voltage and the corresponding bottom voltage, wherein the number of DAC analog signals is equal to the number of digital signals.

22. The method of claim 20, wherein the number of DAC analog signals has a value that is a division of the voltage range.

* * * * *